(12) United States Patent
Dummer et al.

(10) Patent No.: US 12,007,504 B2
(45) Date of Patent: Jun. 11, 2024

(54) 3D AND LIDAR SENSING MODULES

(71) Applicant: Vixar, Inc., Plymouth, MN (US)

(72) Inventors: Matthew Dummer, Plymouth, MN (US); Klein L. Johnson, Orono, MN (US); Mary Hibbs-Brenner, Wayzata, MN (US); Dadi Setiadi, Edina, MN (US); Benjamin Olson, St. Paul, MN (US)

(73) Assignee: Vixar, Inc., Plymouth, MN (US)

( * ) Notice: Subject to any disclaimer, the term of this patent is extended or adjusted under 35 U.S.C. 154(b) by 564 days.

(21) Appl. No.: 16/801,231

(22) Filed: Feb. 26, 2020

(65) Prior Publication Data

US 2020/0278426 A1    Sep. 3, 2020

Related U.S. Application Data

(60) Provisional application No. 62/910,706, filed on Oct. 4, 2019, provisional application No. 62/891,472, filed
(Continued)

(51) Int. Cl.
| | |
|---|---|
| *G01S 7/481* | (2006.01) |
| *H01S 5/0234* | (2021.01) |
| *H01S 5/026* | (2006.01) |
| *H01S 5/042* | (2006.01) |
| *H01S 5/062* | (2006.01) |

(Continued)

(52) U.S. Cl.
CPC .......... *G01S 7/4815* (2013.01); *G01S 7/4813* (2013.01); *H01S 5/0234* (2021.01); *H01S 5/0264* (2013.01); *H01S 5/04256* (2019.08); *H01S 5/06203* (2013.01); *H01S 5/18305* (2013.01); *H01S 5/32* (2013.01); *H01S 5/423* (2013.01)

(58) Field of Classification Search
CPC ............................ G01S 7/4815; H01S 5/0234
USPC ......................................................... 356/4.01
See application file for complete search history.

(56) References Cited

U.S. PATENT DOCUMENTS

| | | | |
|---|---|---|---|
| 5,757,836 A | 5/1998 | Jiang et al. | |
| 6,618,410 B1 * | 9/2003 | Fischer | H01S 5/183 |
| | | | 372/45.01 |

(Continued)

FOREIGN PATENT DOCUMENTS

| | | |
|---|---|---|
| JP | H1065279 A | 3/1998 |
| JP | 2007005609 A | 1/2007 |

(Continued)

OTHER PUBLICATIONS

International Search Report issued for the corresponding Internationl patent application No. PCT/US2021/017810, dated Apr. 26, 2021, 2 pages (for informational purposes only).

(Continued)

*Primary Examiner* — Tuan N Nguyen
(74) *Attorney, Agent, or Firm* — Viering, Jentschura & Partner mbB

(57) ABSTRACT

Systems and methods disclosed herein include an illumination module for 3D sensing applications. The illumination module may include an array of vertical cavity surface emitting lasers (VCSELs) emitting light, a driver configured to provide current to the array of VCSELs, and an optical element configured to receive the light emitted by the array of VCSELs and output a light pattern from the illumination module.

20 Claims, 65 Drawing Sheets

Related U.S. Application Data on Aug. 26, 2019, provisional application No. 62/889,236, filed on Aug. 20, 2019, provisional application No. 62/812,326, filed on Mar. 1, 2019.

(51) Int. Cl.
*H01S 5/183* (2006.01)
*H01S 5/32* (2006.01)
*H01S 5/42* (2006.01)

(56) References Cited

U.S. PATENT DOCUMENTS

| | | |
|---|---|---|
| 7,991,034 B2 | 8/2011 | Jansen |
| 8,970,374 B2 | 3/2015 | Guetta et al. |
| 9,740,019 B2 | 8/2017 | Mor |
| 10,205,303 B1 | 2/2019 | Hegblom et al. |
| 10,244,181 B2 | 3/2019 | Warren |
| 10,290,993 B2 | 5/2019 | Chen et al. |
| 10,530,125 B1 | 1/2020 | Venkatesan |
| 2001/0043629 A1* | 11/2001 | Sun .................. H01S 5/426 257/E33.069 |
| 2002/0131464 A1* | 9/2002 | Sirbu ................ H01S 5/18308 372/45.01 |
| 2004/0096996 A1* | 5/2004 | Cheng ................ H01S 5/18305 438/22 |
| 2006/0289942 A1 | 12/2006 | Horii et al. |
| 2008/0240185 A1 | 10/2008 | Sai |
| 2011/0188054 A1 | 8/2011 | Petronius et al. |
| 2014/0139467 A1 | 5/2014 | Ghosh et al. |
| 2015/0260830 A1 | 9/2015 | Ghosh et al. |
| 2015/0311673 A1* | 10/2015 | Wang ................ H01S 5/18305 372/27 |
| 2016/0072258 A1 | 3/2016 | Seurin et al. |
| 2016/0164261 A1* | 6/2016 | Warren ............... H04N 5/2256 372/50.122 |
| 2017/0005453 A1 | 1/2017 | Yim et al. |
| 2017/0170339 A1 | 6/2017 | Ootorii et al. |
| 2017/0256915 A1* | 9/2017 | Ghosh ................ H01S 5/1833 |
| 2017/0277065 A1* | 9/2017 | Kondo ................ H01L 27/153 |
| 2019/0123231 A1 | 4/2019 | Furuyama |
| 2019/0207369 A1 | 7/2019 | Graham et al. |
| 2019/0221993 A1 | 7/2019 | Hammond et al. |
| 2019/0221997 A1 | 7/2019 | Johnson et al. |
| 2020/0052466 A1 | 2/2020 | Chen et al. |
| 2020/0194975 A1 | 6/2020 | Gronenborn et al. |
| 2020/0278426 A1 | 9/2020 | Dummer et al. |
| 2020/0328577 A1 | 10/2020 | Enzmann et al. |

FOREIGN PATENT DOCUMENTS

| | | |
|---|---|---|
| JP | 2016146417 A | 8/2016 |
| JP | 2017502502 A | 1/2017 |
| JP | 2019067831 A | 4/2019 |
| JP | 2019075529 A | 5/2019 |
| JP | 2019078795 A | 5/2019 |
| WO | 2015174239 A1 | 11/2015 |
| WO | 2019043102 A1 | 3/2019 |
| WO | 2019115245 A1 | 6/2019 |
| WO | 2019143945 A1 | 7/2019 |

OTHER PUBLICATIONS

Japanese Reasons for Rejection issued for the corresponding JP patent application No. JP2022551766, dated Oct. 17, 2023, 12 pages (For informational purposes only).

Supplementary European Search Report for corresponding patent application No. EP 21 76 1669, dated Sep. 29, 2023, 3 pages (for informational purposes only).

* cited by examiner

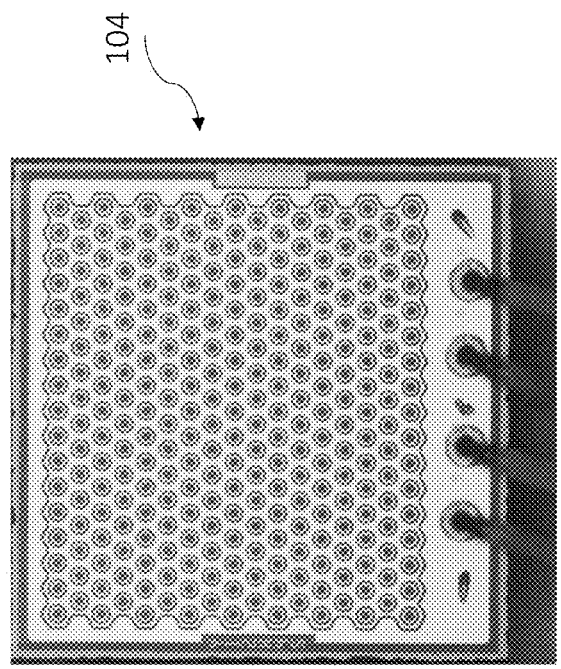
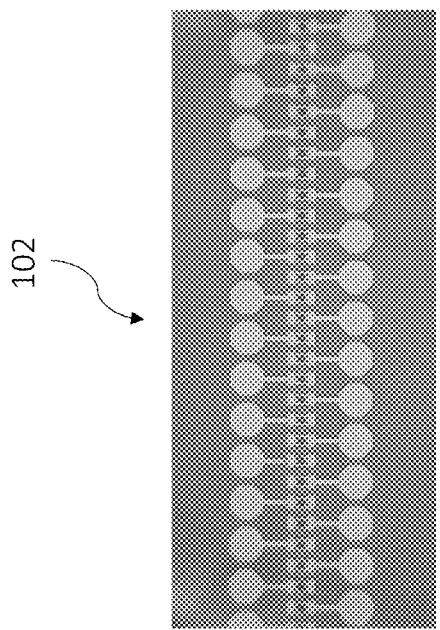
FIG. 1

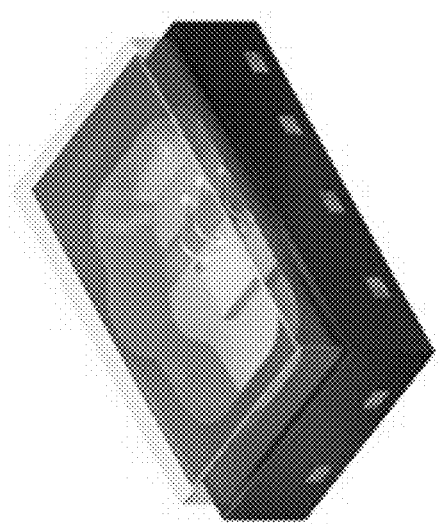
206
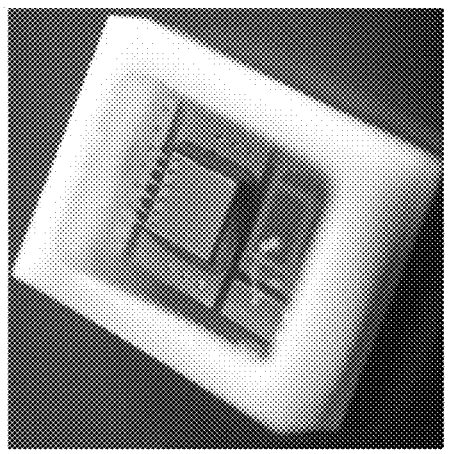
204
FIG. 2
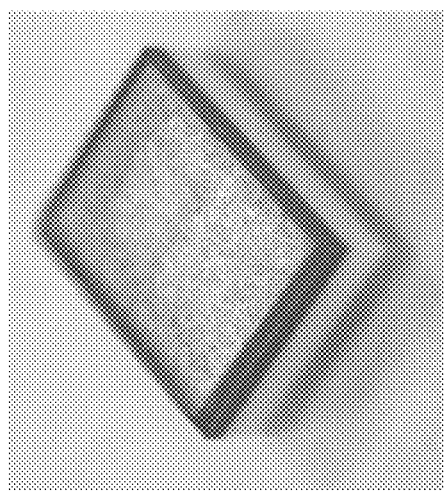
202

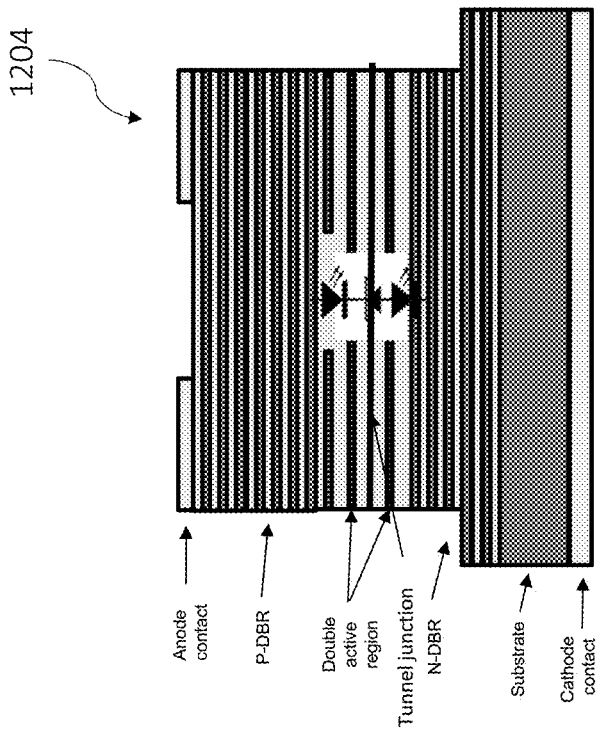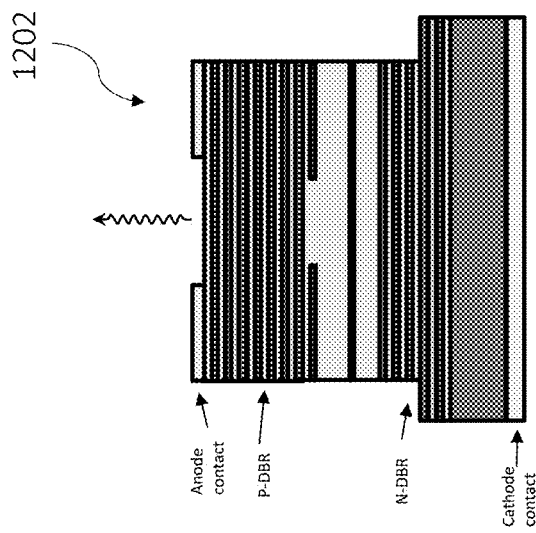
FIG. 12

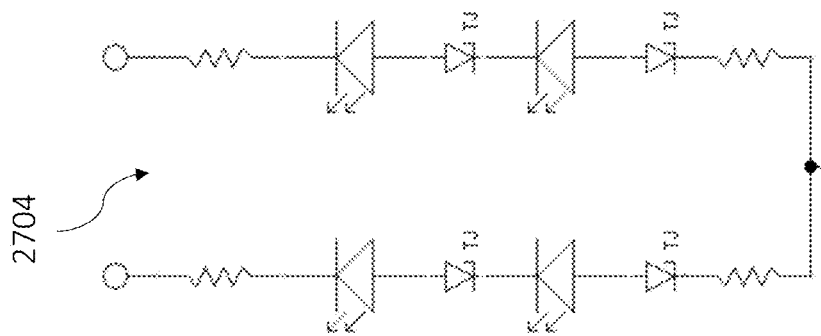
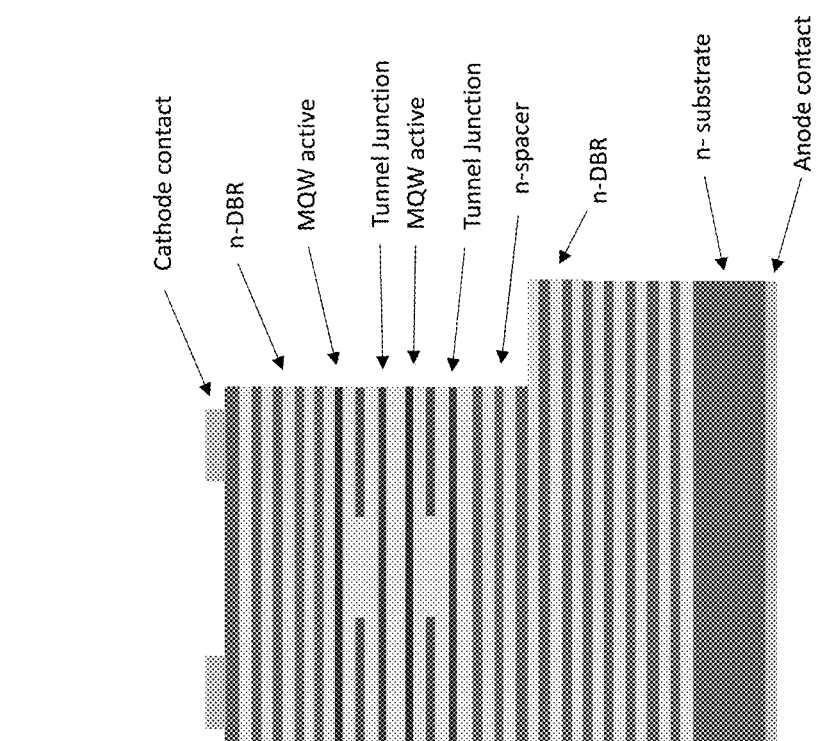
FIG. 27

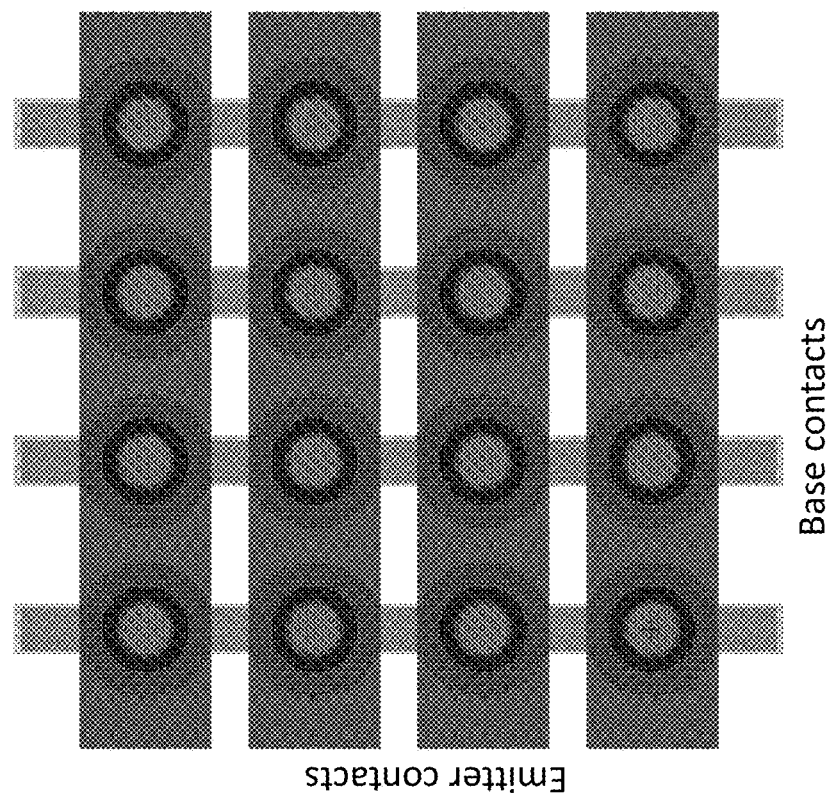
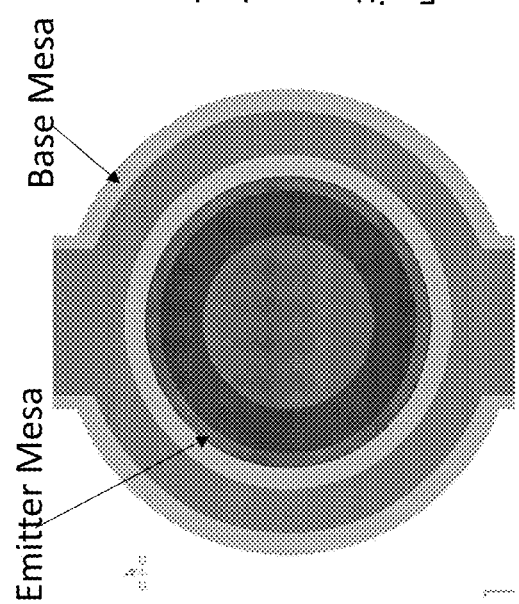
FIG. 36

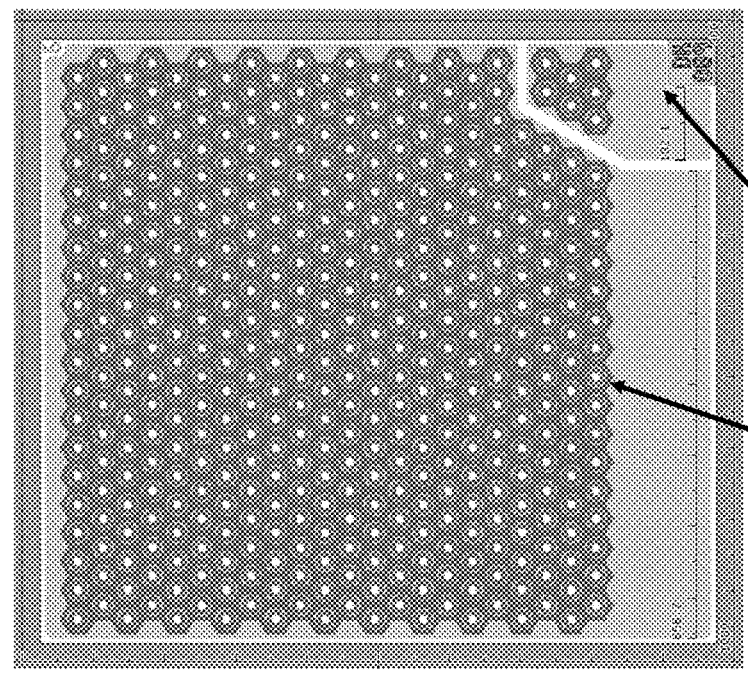
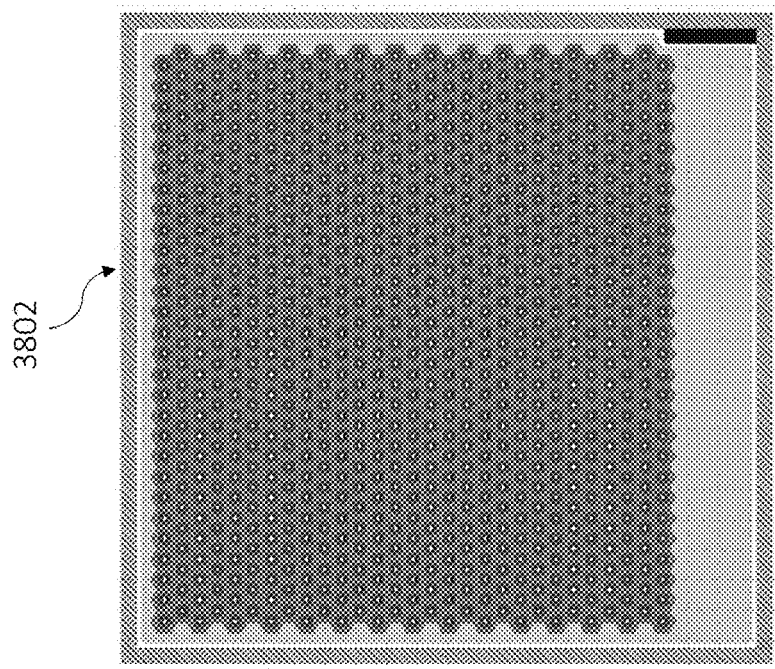
FIG. 38

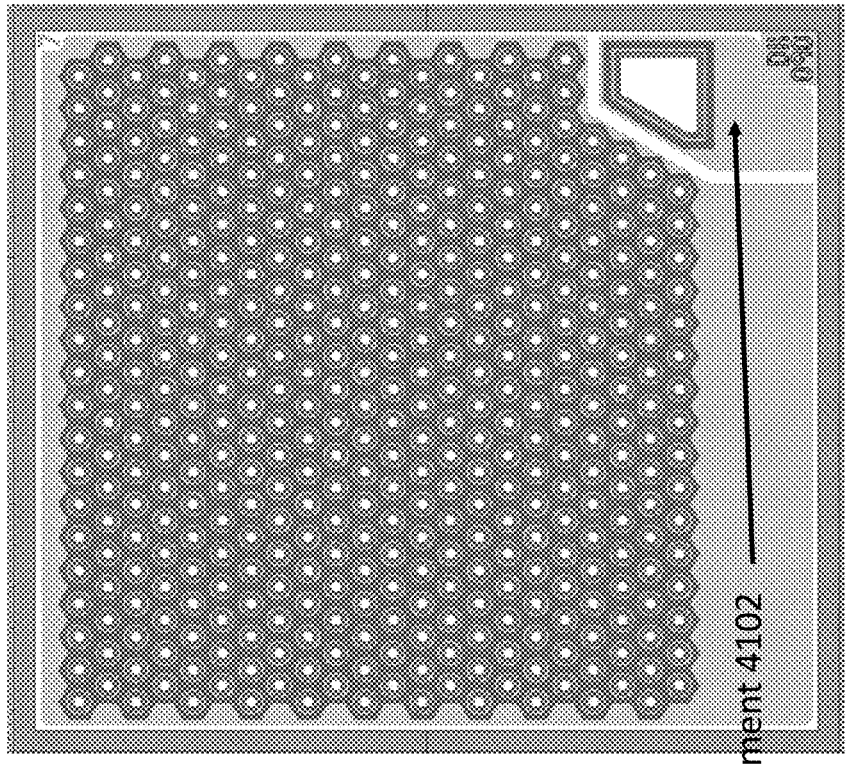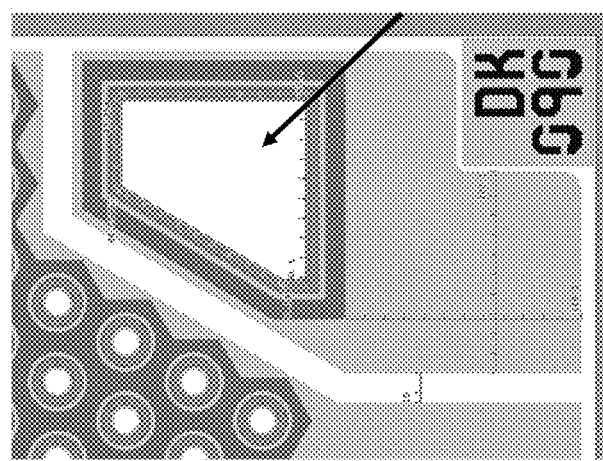
FIG. 41

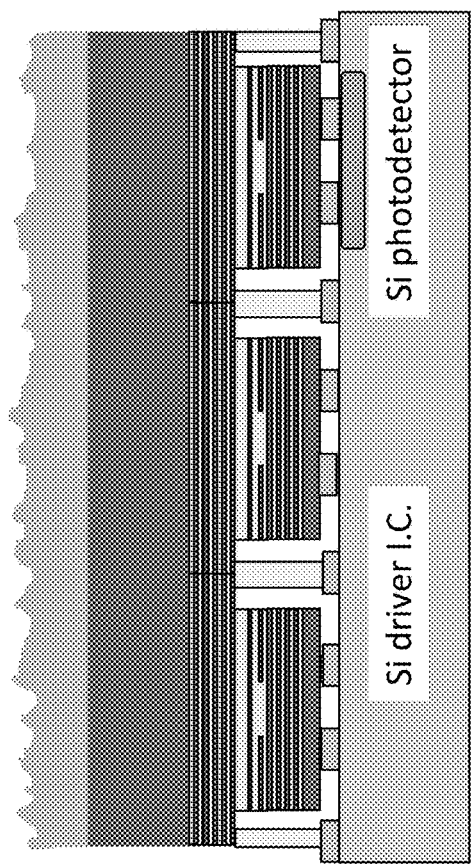
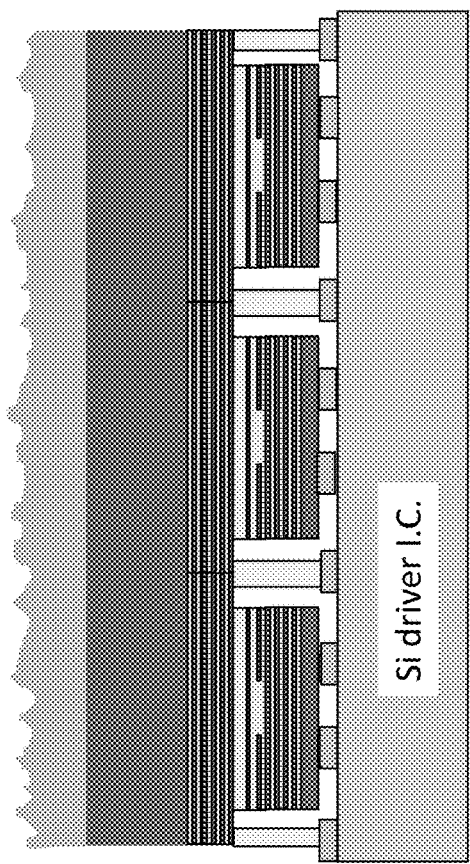
FIG. 62

3D AND LIDAR SENSING MODULES

CROSS-REFERENCE TO RELATED APPLICATIONS

This application claims a benefit of priority under 35 U.S.C. § 119 to U.S. Provisional Application No. 62/812,326 filed on Mar. 1, 2019, U.S. Provisional Application No. 62/889,236 filed on Aug. 20, 2019, U.S. Provisional Application No. 62/891,472 filed on Aug. 26, 2019, and U.S. Provisional Application No. 62/910,706 filed on Oct. 4, 2019, each of which is fully incorporated herein by reference in their entirety.

FIELD OF THE DISCLOSURE

This disclosure relates to illumination modules, including modules generating light for applications such as 3D sensing, which includes structured light or Time of Flight sensing, and Light Detection and Ranging (LiDAR). More specifically, the disclosure relates to various features of optoelectronic emitters and the integration of those emitters with drivers, photodetectors and optics on compact modules.

BACKGROUND

Vertical cavity surface emitting lasers (VCSELs) and VCSEL arrays, as well as other surface emitting devices like light emitting diodes (LEDs) and Resonance Cavity LEDs (RCLEDs) are important technologies for applications within a variety of markets, including but not limited to, the consumer, industrial, automotive, and medical industries. VCSEL arrays have been applied to optical communication as well as optical sensing. Many optical communication applications make use of an array of VCSELs on an integrated chip. FIG. 1 shows an example of a one-dimensional VCSEL array 102 in which each VCSEL has its own bond pad such that it may be individually modulated. Example sensor applications include, but are not limited to, illumination for security cameras, illumination for sensors such as three-dimensional (3D) cameras or gesture recognition systems, medical imaging systems, light therapy systems, medical sensing systems such as those requiring deep penetration into tissue, or industrial sensors. Often in cases where high optical power is required, it is provided by a VCSEL array in which all of the VCSELs are tied together with both a common anode and common cathode. VCSEL array 104 in FIG. 1 is an example of such an array. In this case the cathode contact is made through the substrate, and a single anode bond pad is connected to metal contacting all VCSELs in the array, such that the whole array is turned on and off together. In such optical sensing and illumination applications as well as other applications, these optical emitters and emitter arrays offer several benefits, as will be described in further detail herein, including but not limited to, power efficiency, narrow spectral width, narrow beam divergence, high speed, and packaging flexibility.

For VCSELs and VCSEL arrays, power conversion efficiency (PCE) of 30-60% may be achieved at wavelengths in the 660-1000 nanometer (nm) range. PCE may be defined as the ratio of optical power emitted from one or more lasers, such as a VCSEL or VCSEL array, divided by the electrical power used to drive the laser(s). While VCSEL PCE, alone, is comparable to that for some of the most efficient light-emitting diodes (LEDs) currently available, when spectral width and beam divergence are considered, there are significant efficiency benefits to VCSELs over LEDs.

For example, VCSEL arrays generally have a spectral width of approximately 1 nm. This allows the use of filters for a photodetector or camera to reduce the noise associated with background radiation. For comparison, an LED typically has a spectral linewidth of 20-50 nm, resulting in the rejection of much of the light by such a filter, and hence reducing the effective PCE of the LED. In addition, the wavelength of a VCSEL is less sensitive to temperature, increasing only around 0.06 nm per 1° Celsius increase in temperature. The VCSEL rate of wavelength shift with temperature is four times less than in a LED.

The angular beam divergence of a VCSEL is typically 10-30 degrees full width 1/e2, whereas the output beam of a LED is Lambertian, filling the full hemisphere. This means that generally all, if not all, of the light of a VCSEL may be collected using various optical elements, such as lenses for a collimated or focused beam profile, diffusers for a wide beam (40-90 degrees or more) profile, or a diffractive optical element to generate a pattern of spots or lines. Due to the wide beam angle of a LED, it may be difficult to collect all or nearly all of the light (leading to further degradation of the effective PCE), and also difficult to direct the light as precisely as is possible with a VCSEL.

The vertically emitting nature of a VCSEL also gives it much more packaging flexibility than a conventional laser and opens the door to the use of the wide range of packages available for LEDs or semiconductor integrated circuits (ICs). In addition to integrating multiple VCSELs on the same chip, one may package VCSELs or VCSEL arrays with photodetectors or optical elements. Plastic or ceramic surface mount packaging or chip-on-board options are also available to the VCSEL.

The amount of power emitted from a single VCSEL aperture may range from microwatts to tens of milliwatts, while VCSEL arrays are used to produce powers in the range of hundreds of milliwatts to watts, or even kilowatts. Higher power VCSEL arrays may be preferred for sensors operating over a longer distance, such as 3D sensors based upon Time of Flight or structured lighting approaches. Higher power might also be required for deeper penetration into tissue for medical sensors, diagnostic devices, or therapeutic lasers. Higher power could also be required for chemical or environmental sensors.

An additional requirement for the optical source in time of flight applications is the ability to generate short pulses with fast rise times. The rise time determines the distance resolution which may be achieved. Typically there is a maximum voltage that may be supplied for driving the VCSEL, which is in the range of 3-5 volts, and determines the maximum current that may be driven into the VCSEL. The rise time of the light source determines the resolution of the distance measured in the third dimension.

LiDAR is the term typically used for time of flight approaches in automotive, industrial or military applications. This is also based upon the time of flight physical effect, but often is the term used for applications sensing over longer distances and requiring higher amounts of power. For these applications, size and allowable voltage are somewhat less restrictive than for consumer applications. However, much higher power is often required and it is desirable to generate this optical power while minimizing the current and or electrical power. As mentioned above, rise time is key to distance resolution, and this becomes more challenging at higher current drive. Many LIDAR systems involve a scanning beam to cover the field of view, but flash LIDAR systems, where the illumination covers a field of view simultaneously are also in use.

FIG. 2 illustrates a few prior art solutions for a time of flight illumination module. Package 202 includes a sub-mount, a spacer, and a diffuser element on the surface of the package. Package 204 shows the inside of package 202. It may be seen that the bottom spacer is patterned with metal pads, and both a VCSEL array chip and a photodiode are located inside of the package 204. Package 206 is an alternative approach using a plastic package. The size of the packages 202 and 204 is approximately 2.8 mm×3.5 mm.

FIG. 3 illustrates another prior art solution for a time of flight illumination module. Package 300 includes a substrate, a spacer, a VCSEL array, and a photodiode. In this case, the IC has been added to the package 300. There is still a diffuser on the top surface of the package 300, and a metal link has been added to the surface of the diffuser. The addition of the driver into the package 300 reduces the inductance between the VCSEL and the driver and hence improves the rise time of the VCSEL pulse when used for a time of flight measurement. The metal link has been added to the diffuser to be able to detect cracks in the diffuser.

However, for future generations of VCSEL packages for time of flight applications, it is desirable to continue to improve the rise time of the VCSEL array, which means further reducing the inductance or effect of inductance between the VCSEL and the driver chip. In addition, since many of the applications place a premium on space, it is desirable to reduce the overall size of the package.

In addition, illumination modules usually include optics order to control the beam profile. For a structured light approach, diffractive optical elements and lenses have been used to create a point array. For 3D sensing using the time of flight approach, diffusers have been used to transform the narrow circular beam to a wider circular or rectangular field of view. The distribution of light over many spots or a wider field of view have also helped maintain eye safety by reducing the amount of light that may be focused into the eye. A photodiode may also be included in the package to help in controlling the driver circuit, as well as to monitor output power and provide a measure for ensuring eye safety, as will be described next.

The greater the output power of the VCSEL, the more important it is to monitor the output power. The output power of an optical device may be affected by temperature, aging, and other factors. In many applications it is desired to maintain enough output power from the VCSEL die to achieve a good signal, or high signal to noise ratio. On the other hand, the VCSEL is often operated in environments to which human beings have access and one must ensure that people are not exposed to emission levels which may cause damage to the eye or skin. These requirements place both a lower and an upper limit on the optical output power and it is desirable to have a mechanism for ensuring the power remains within this range over a temperature range and period of time.

In addition to controlling the variations of power as a function of temperature, or changing performance versus time, certifying an optical device as eye safe requires that the device be able to survive a single failure mode. For example, many high power VCSEL arrays are being applied to consumer devices. The VCSEL array is not intrinsically eye safe but is made so by pulsing the device with a low duty cycle, and/or adding a diffuser above the VCSEL which expands the beam to a large angle, therefore limiting the amount of light that could enter the eye. However, failure mechanisms could include dislodging of the diffuser from the package, the condensation of liquid on the diffuser surface, which would eliminate the diffuser effect and make the diffuser transparent and ineffective, melting of the diffuser surface, or a failure of the electronics that would result in the VCSEL being on continuously rather than pulsed.

Currently there are at least a couple of approaches for monitoring and controlling the output power of a VCSEL. Some of these approaches are also available to other opto-electronic devices such as an edge-emitting laser. One is to characterize the performance of a VCSEL over temperature. One may then include a thermistor or temperature sensor in the system and use the measured temperature to adjust the current to achieve the desired output power based upon the previous characterization over temperature. This is illustrated in the graph in FIG. 4, where the output power versus current is plotted for a VCSEL array at a variety of temperatures ranging from 25° C. to 85° C. At 25-40° C., the current required to reach 2 W of output power is approximately 3 A in this illustration. As the ambient temperature increases to 70° C., the current required to reach 2 W increases to approximately 3.2 A, and at 85° C., the current required to reach 2 W is around 4 A. This information may be programmed into a lookup table, and the current adjusted based upon the temperature measured by the thermistor. A limitation of this approach is that there is variability from device to device, and may be some variability over time due to burn-in effects of the lifetime of the device. One may compensate for the device to device variability by calibrating each device individually, but this is expensive and time consuming. Variability over time is more difficult to compensate for.

A second approach is to monitor the output power directly and adjust the drive current to the laser or LED to keep the output power within the desired range. This has been frequently done for devices packaged in transistor outline (TO) headers and cans, particularly within the fiber optic data communication market. An example of a prior art TO is illustrated in FIG. 5. A stack may be created using a photodiode mounted on the metal TO header, and a VCSEL, which is smaller than the photodiode active area, mounted on a metal pad on the photodetector. To isolate the photodiode from the header, it could optionally be mounted on a ceramic sub-mount patterned with metal located between the header and the photodiode. The various VCSEL and photodiode (PD) contacts are wire bonded to the pins of the header or package for electrical contact. A lid is provided on top of the package. In the case of the TO header, this is usually a tall metal can, with a window in the top surface. The window preferably does not have an AR coating, or has a controlled coating to determine the amount of light that will be reflected at the two surfaces of the window. Since the light beam emitted from the VCSEL has a non-zero angular range of divergence, some of the light is reflected down at an angle. Light reflected at a sufficiently high angle will reach the area of the photodetector not covered by the VCSEL chip and may be used to monitor the output power.

FIG. 6 illustrates this approach with a top view 602 of the prior art TO header. In top view 602, the VCSEL diode sits on top of a metal pad on the photodiode which in turn sits on the header, and shows the wire bonds to the various anode and cathode contacts of the two diodes. FIG. 6 also includes a zoomed-in view of photodiode 604, including the pad that accommodates the VCSEL. Alternatively, the VCSEL and the photodiode may be placed side by side on the sub-mount or header, and the photodiode will capture the light emitted from the VCSEL that is reflected to one side by the window. This usually increases the distance from the active emission area of the VCSEL to the active part of the photodiode, and hence requires the height of the window above the VCSEL to be increased.

These approaches have been applied effectively but have some limitations. In order to capture sufficient light on the photodiode, the lid of the TO header is relatively high, which limits the compactness of the package. For instance, if the distance from the VCSEL emission area to the targeted part of the photodiode is 0.5 millimeters (mm), which is a fairly small distance, and the VCSEL half angle is 11 degrees, the bottom side of the window must be about 1.28 mm above the top of the VCSEL. If the VCSEL to photodiode distance is increased to 1 mm, the height is doubled to 2.56 mm. The total package height also includes the header or sub-mount thickness, the window thickness, and the VCSEL thickness, and hence may easily become 3-4 mm high. As VCSELs are applied in consumer electronics where miniaturization is key, this may be problematic. In addition, the beam divergence of the VCSEL may be affected by both temperature and current, and so one again needs to understand this relationship and potentially compensate for it. The precise geometry of the VCSEL placement relative to the photodiode may also be important. For higher output power arrays, good thermal heat sinking is required, and a TO may is typically not a sufficiently good heat sink to serve as a package.

Another version of using a separate photodiode to monitor output power in a plastic or ceramic surface mount package is illustrated in FIG. 7. There is a plastic or ceramic sub-mount that the VCSEL and photodiode die sit on side by side, and sidewalls to the package, on top of which a glass or plastic window may be placed. If one relies on reflection from this window, then one has to consider whether the dimensions allow significant signal to reach the photodiode from the VCSEL. Assuming the available angular emission from the VCSEL, the height of the lid may need to be lifted higher above the VCSEL, which may prevent the package from achieving the desired low profile.

A second version of a package where the VCSEL and photodiode monitor sit side by side is shown in FIG. 8. In this case, the flat window is replaced by a diffuser. The diffuser creates a certain angular field of view for most of the light that leaves the package, but a small percentage is scattered parallel to the diffuser glass, and gradually scattered back down toward the photodetector. Due to the lateral scatter, the distance between the VCSEL and the monitor diode may be larger, and the signal received by the photodiode is less sensitive to the spacing between the VCSEL and monitor diode. However, this monitor photodiode takes up more space in the package, and this approach only works when it is required or desirable to include a diffuser.

Another way to monitor the output power of the array, while minimizing the height of the reflecting or scattering window above, is to incorporate the photodiode monolithically onto the VCSEL chip. By reducing the lateral distance from the VCSEL to the monitor, the reflecting or scattering surface may be lower.

Another aspect of miniaturization for many applications, particularly consumer, is to develop a flip chip bonded VCSEL. FIG. 9 illustrates schematically such an approach. Both cathode and anode contacts are made from the top surface of the chip. The chip may then be flipped over, for instance using solder to attach to a circuit board or sub-mount, and allowing the light to be emitted through the original substrate. In this case, optics may be attached or fabricated into the substrate. The flip chip approach may contribute to miniaturization by eliminating bond pads, which increase the package area required. The incorporation of optics into the back side of the wafer, may help to miniaturize the package and/or reduce cost, by replacing the need for the external optic attached to the lid of the package.

Based upon the desirable characteristics for an optical emitter for illumination and sensing, it would be beneficial if the illumination source had a high slope efficiency. In other words, the source would generate more optical power per unit current. The benefits of a high slope efficiency would include the ability to reduce the footprint of the chip for a desired optical power level, or alternatively to be able to improve the output power if the footprint is held constant. Another key benefit of the higher slope efficiency would be the ability to achieve a shorter rise time when modulating or pulsing the VCSEL device. This is particularly useful for 3D sensing or imaging using the Time of Flight mechanism.

For 3D sensing, in order to achieve the necessary power required for imaging over a field of view, VCSEL arrays have been used to generate enough optical power. However, in the simplest implementation of 3D sensing, an array of VCSELs may share both a common anode and a common cathode, and all individual VCSELs are turned on and off together, as was illustrated by VCSEL array 104 in FIG. 1.

However, alternatively a VCSEL chip could be segmented into individual regions with the VCSELs in a given region modulated together, while the other segments are modulated independently. A couple of illustrations of this approach are shown in FIG. 10. VCSEL chip 1002 is a single chip is divided into four similar sized segments. This might be done in order to control total optical output power and electrical power consumption, because 1, 2, 3, or 4 segments could be activated depending upon how much optical power is required. Alternatively, by combining the chip with one or more lenses, the light from the different segments may be steered to different areas of interest. In VCSEL array 1004, on the other hand, one segment is quite small, while the other is significantly larger. An example of the application of such a chip might be the use of the small segment as a narrow beam of light for a point sensor, while the remainder of the chip provides more power for illumination of an area to be imaged.

However, for individual modulation of a VCSEL or a segment monolithically integrated on the same conducting substrate, one must choose between driving the segments assuming a common anode or common cathode arrangement. For VCSELs, a common cathode arrangement is much more common, as the most mature substrates with the lowest defect density are doped n-type, and hence the VCSELs share a common cathode. P-doped substrates allowing for a common anode exist, but are generally smaller and/or higher defect density. Smaller substrates lead to higher product costs, while substrate defects may lead to defects in the device which reduce reliability. Insulating substrates also exist, but also generally have a higher defect density, and also complicate the fabrication process of the devices as they still require contact to both sides of the junction, and one connection may no longer be made through the substrate.

FIG. 11 illustrates the circuit diagram comparison of a common cathode diode design for a multi-segment VCSEL array to a common anode design for a multi-segment VCSEL array. Generally, a common anode configuration is preferred, as it allows for a driver that is smaller and lower power For both bipolar junction transistors (BJTs) and metal oxide semiconductor field effect transistors (MOSFETs), n-type devices have lower resistance and therefore higher current handling capability than p-type. N-channel FETs (or npn BJTs) are optimally configured as low-side drivers to be placed in a circuit between the load and ground plane. In this type of drive scheme, the transistor becomes a current sink for the laser rather a current source. Therefore, multiple lasers may be individually addressed only if each channel has an isolated cathode contact. The laser anode contacts on the other hand may have a common node tied to a power supply (Vcc).

Assuming one has an array of VCSELs which may be contacted individually, or which is divided into a number of segments, one now needs a way to drive the VCSELs or VCSEL segments, and particularly for time of flight or 3D sensing applications, to switch the VCSEL or VCSEL segment on rapidly. Providing an individual bond pad for each VCSEL or for each segment, may cause the chip size to grow very rapidly. Furthermore, as the array size grows, more interconnect metal lines are required to reach the additional VCSELs, and the pitch between VCSELs will have to grow. For each VCSEL or segment, one may need a driver chip, and as the number grows the overall package size grows and the distance from circuit to VCSEL segment grows, thereby increasing the inductance of the interconnect. Therefore, what is needed in the art is a matrix addressable approach for 2D VCSEL arrays.

In summary, illumination modules for sensing applications are needed with the following features: a compact design which minimizes the footprint of the VCSEL chip, optics and potential photodiode that are incorporated into it, high efficiency, and a minimization of the current and driver to VCSEL inductance for fast pulse rise times, the ability to drive segments of a VCSEL chip independently, preferably with a common anode driver design, and the ability to switch individual VCSELs or VCSEL segments independently of other segments.

SUMMARY

Various implementations disclosed herein include an illumination module that includes an array of VCSELs emitting light, a driver configured to provide current to the array of VCSELs, and an optical element configured to receive the light emitted by the array of VCSELs and output a light pattern from the illumination module.

In some implementations, at least one VCSEL in the array of VCSELs comprises a multi junction VCSEL. In some implementations, the at least one VCSEL includes an integrated heterojunction bipolar transistor (HBT).

In some implementations, the array of VCSELs share a common anode. In some implementations, at least one VCSEL in the array of VCSELs comprises a multi junction VCSEL. In some implementations, the array of VCSELs are bottom-emitting VCSELs.

In some implementations, at least one VCSEL in the array of VCSELs includes an integrated HBT. In some implementations, the at least one VCSEL is a bottom-emitting VCSEL. In some implementations, the at least one VCSEL shares a common anode with at least one other VCSEL in the array of VCSELs.

In some implementations, each VCSEL in the array of VCSELs includes an integrated HBT and the array of VCSELs comprises a plurality of rows and a plurality of columns. In some implementations, each VCSEL in each row shares a common emitter of the integrated HBT and each VCSEL in each column share a common base of the integrated HBT such that each VCSEL in the array of VCSELs is individually addressable. In some implementations, at least one VCSEL in the array of VCSELs is a multi junction VCSEL. In some implementations, at least two VSCELs in the array of VCSELs share a common anode.

In some implementations, the array of VCSELs is segmented into a first segment of VCSELs configured to emit light and a second segment of VCSELs configured to detect light emitted by the first segment of VCSELs. In some implementations, the first segment of VCSELs are forward biased and the second segment of VCSELs are reverse biased. In some implementations, at least one VCSEL in first segment of VCSELs is a multi junction VCSEL. In some implementations, at least one VCSEL in the first segment of VCSELs includes an integrated HBT.

In some implementations, the optical element is integrated into the array of VCSELs. In some implementations, the optical element is deposited onto a substrate of the array of VCSELs. In some implementations, the module further includes a photodetector located adjacent to the array of VCSELs. In some implementations, the module further includes a photodetector located on top of the optical element. In some implementations, the array of VCSELs is segmented into a first segment of VCSELs configured to emit light and a second segment of VCSELs configured to detect light emitted by the first segment of VCSELs. In some implementations, at least one VCSEL in the array of VCSELs is a multi junction VCSEL. In some implementations, at least two VSCELs in the array of VCSELs share a common anode. In some implementations, at least one VCSEL in the array of VCSELs includes an integrated HBT. In some implementations, the array of VCSELs is flip-chip bonded on a substrate that includes the driver and a photodetector. In some implementations, the array of VCSELs is flip-chip bonded on a silicon interposer that is connected to the driver, wherein the silicon interposer includes a photodetector.

BRIEF DESCRIPTION OF THE DRAWINGS

FIG. 1 shows examples of prior art VCSEL arrays.

FIG. 2 shows examples of prior art time of flight illumination modules.

FIG. 12 is a cross-structural diagram of VCSELs in accordance with various implementations.

FIG. 27 illustrates a common anode VCSEL array in accordance with various implementations.

FIG. 36 illustrates a mask layout for a VCSEL array with integrated HBTs in accordance with various implementations.

FIG. 38 illustrates a regular VCSEL array and a VCSEL array with an integrated photodetector in accordance with various implementations.

FIG. 41 illustrates another VCSEL array with an integrated photodetector in accordance with various implementations.

FIG. 62 illustrates VCSEL dies with integrated optics combined with a photodetector and driver circuit in accordance with various implementations.

Figure 3:
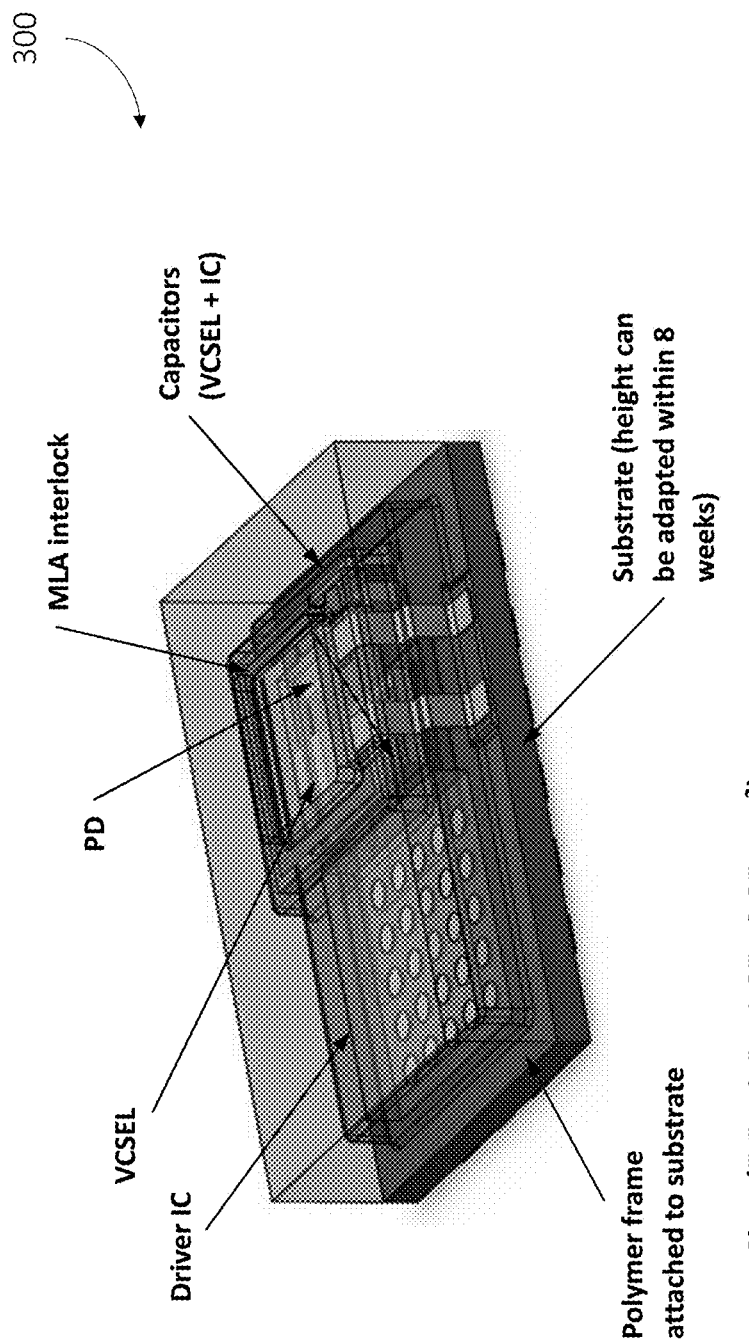
FIG. 3 illustrates another prior art solution for a time of flight illumination module.
Figure 4:
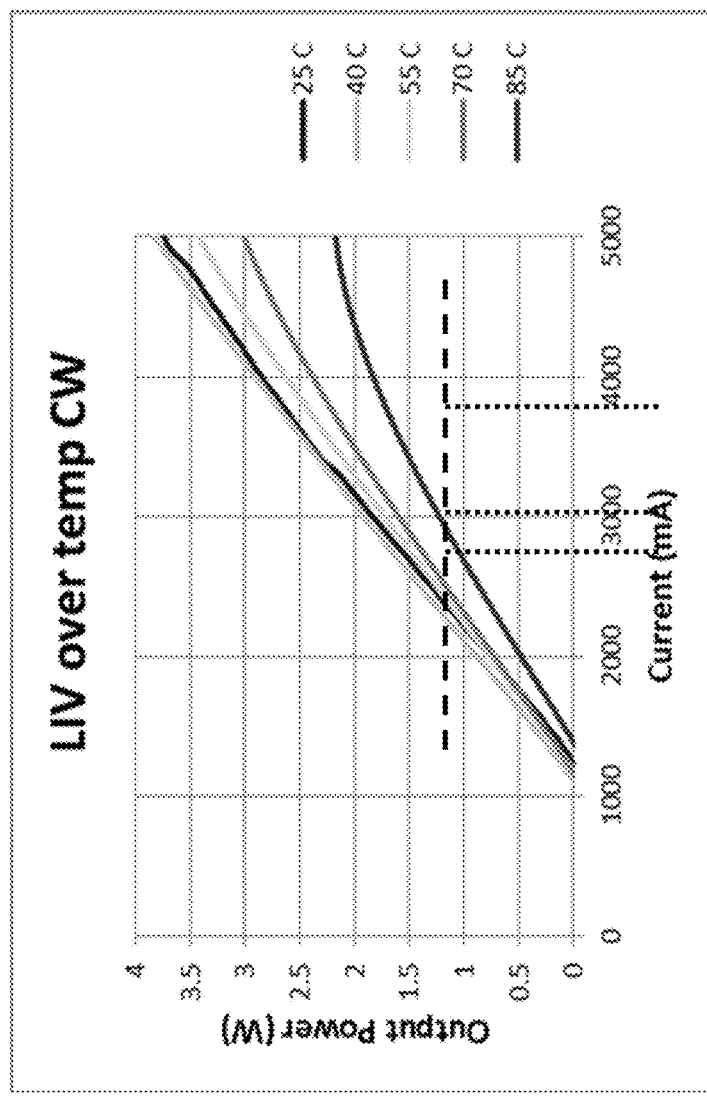
FIG. 4 illustrates a graph of current versus output power of a VCSEL array at a range of operating temperatures.
Figure 5:
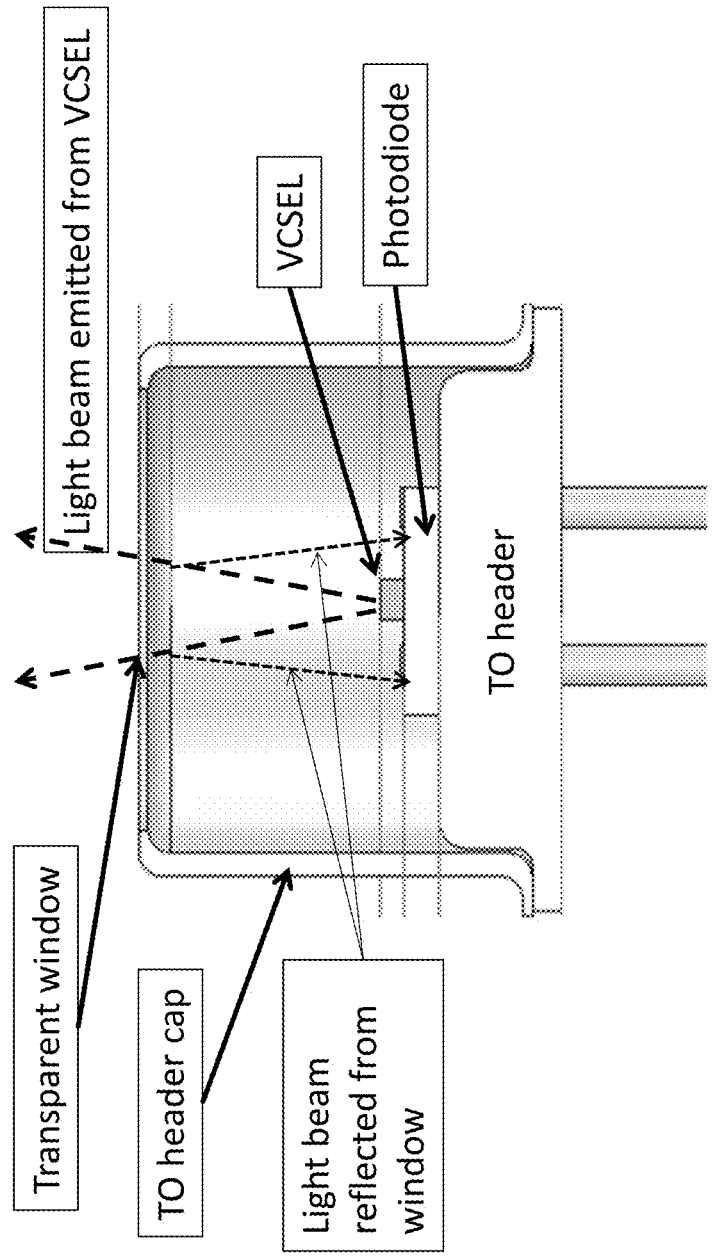
FIG. 5 is an example of a prior art transistor outline.
Figure 6:
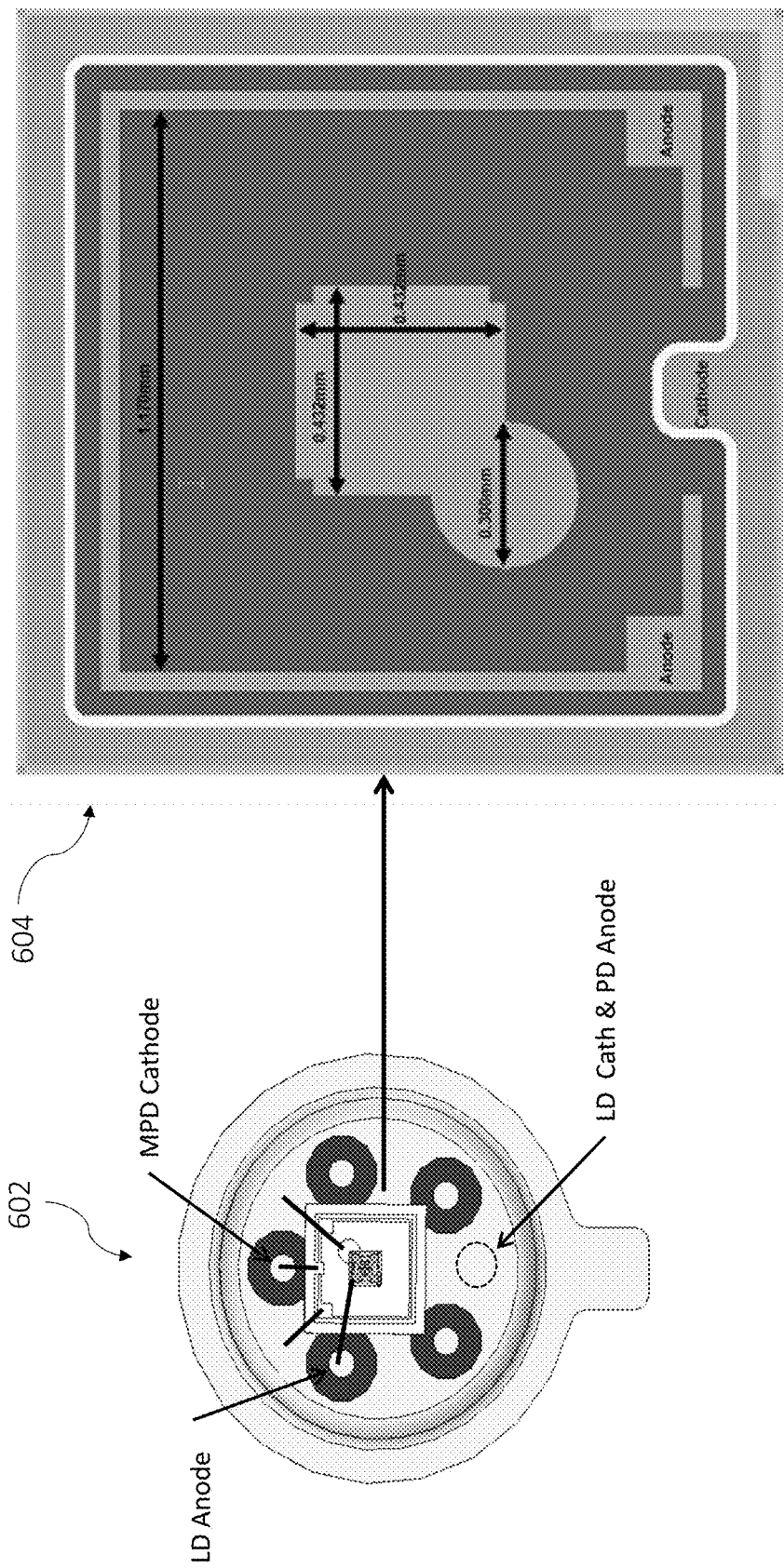
FIG. 6 is another example of a prior art transistor outline.
Figure 7:
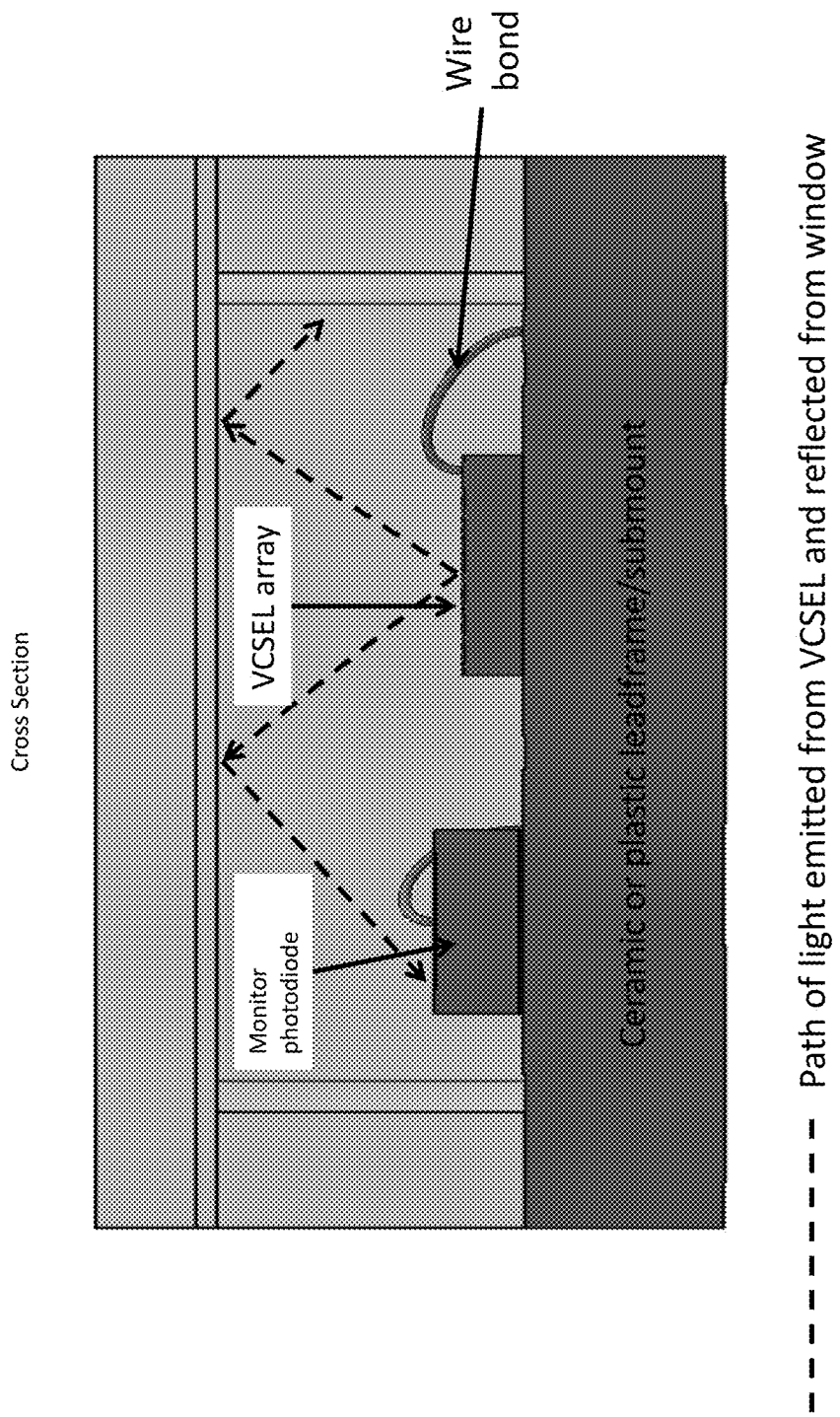
FIG. 7 shows a prior art approach for incorporating a photodiode into an illumination module.
Figure 8:
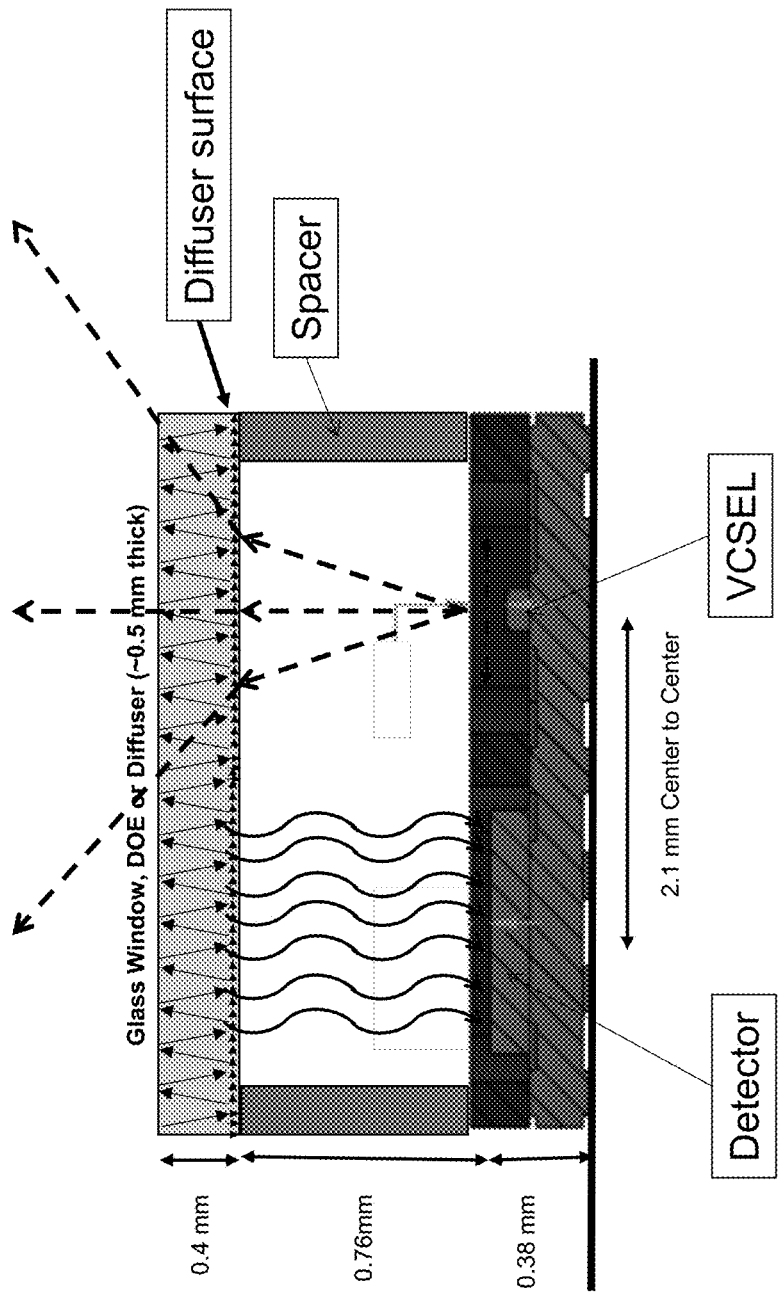
FIG. 8 shows another prior art approach for incorporating a photodiode into an illumination module.
Figure 9:
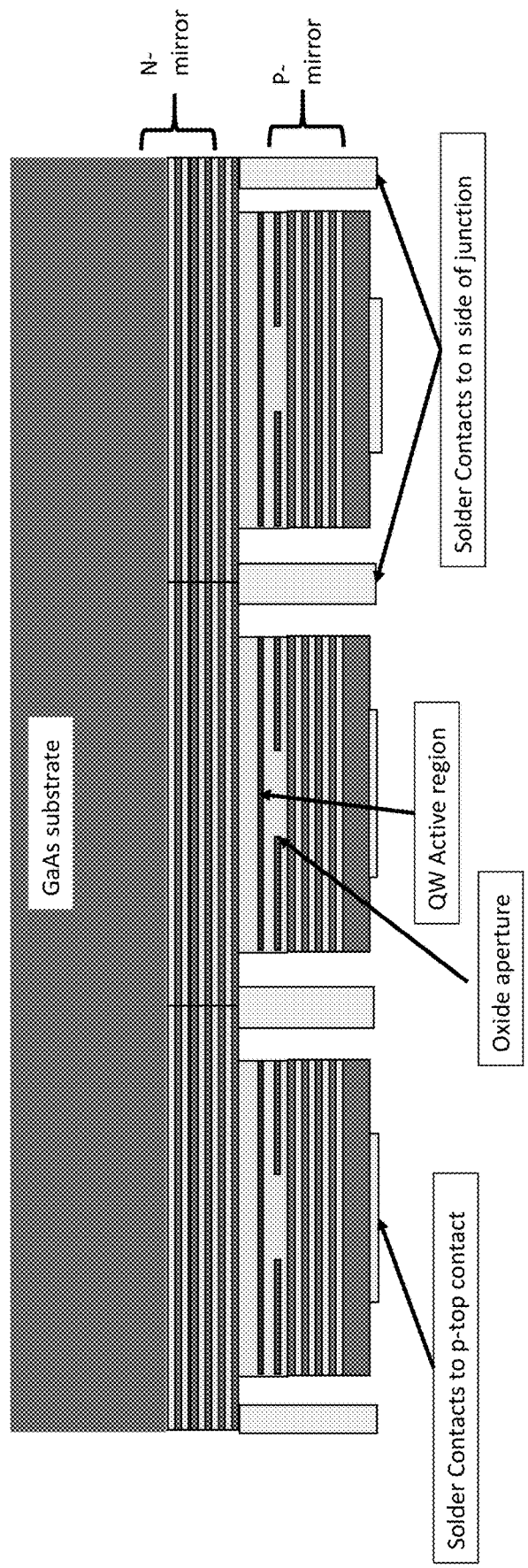
FIG. 9 shows a prior art approach for flip chip bonded VCSELS.
Figure 10:
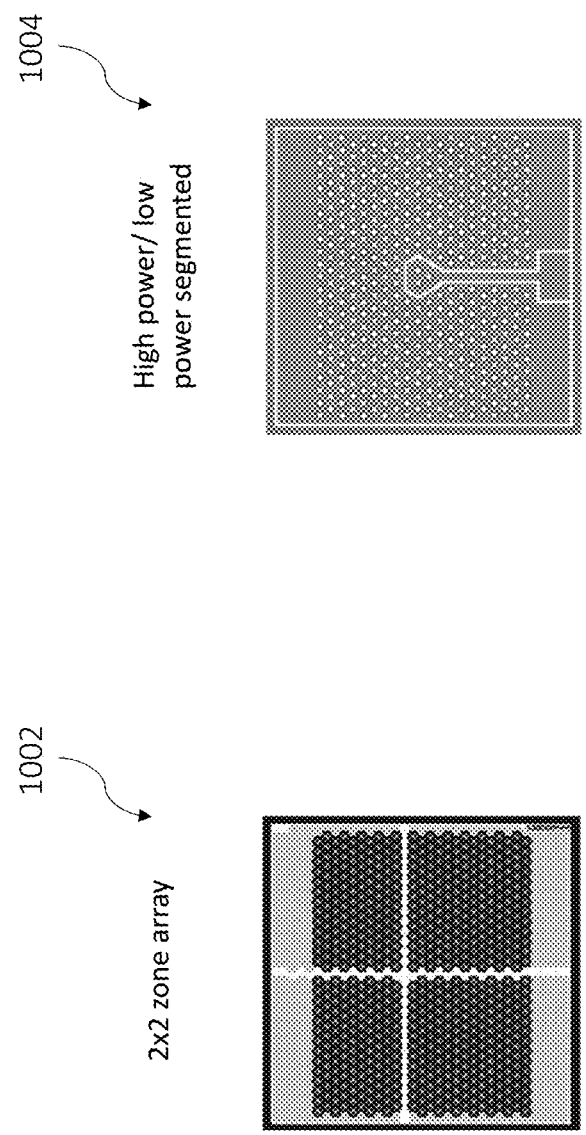
FIG. 10 shows prior art segmented VCSEL arrays.
Figure 11:
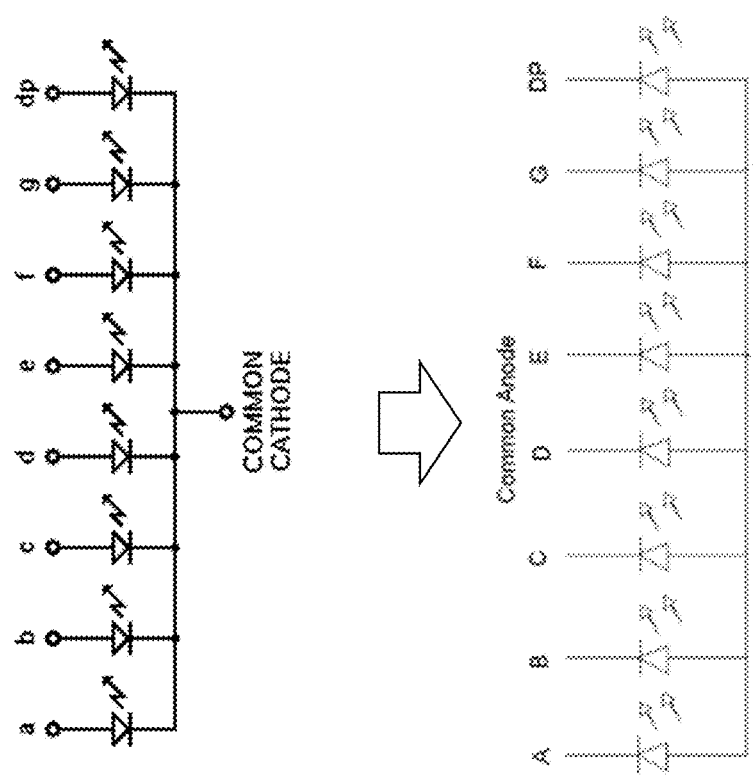
FIG. 11 shows a prior art solution for a VCSEL array with common cathodes.

These and other features of the present implementations will be understood better by reading the following detailed description, taken together with the figures herein described. The accompanying drawings are not intended to be drawn to scale. For purposes of clarity, not every component may be labeled in every drawing.

DETAILED DESCRIPTION

This disclosure describes approaches for addressing the performance optimization and miniaturization of components for 3D sensing and other applications. Multi junction VCSELs allow for improved output power as a function of input current. Incorporating multi junction VCSELs into a module including a driver integrated circuit, photodetector, optical beam shaping element, or other features provides a very compact, high performing sensing illumination source. Further functionality may be achieved by subdividing the VCSEL chip into segments and implementing a structure that allows the segments to be individually driven with a common anode driver array. Additional improvements for modulation may include the incorporation of Heterojunction Bipolar Transistors (HBTs) in to the VCSEL array to facilitate high speed switching of the VCSEL segments. Further enhancements for miniaturization may include integrating monitor diodes onto a VCSEL chip for monitoring the output power of a VCSEL or VCSEL array in a manner that allows for compact packaging. Other miniaturization approaches include the incorporation of optics onto the back side of a wafer.

Multi-Junction VCSEL Modules

FIG. 12 is a cross-structural diagram of two different VCSEL designs in accordance with various implementations. VCSEL 1202 is the most commonly produced type. VCSEL 1201 includes a bottom substrate, which is typically GaAs for VCSEL wavelengths ranging from approximately 630 nm up to 1060 nm. However, the substrate could be other materials, such as GaN or sapphire for shorter wavelength VCSELs, or InP for longer wavelength VCSELs. On top of this substrate is grown a Distributed Bragg Reflector (DBR) that is composed of alternating layers of different refractive index in which each layer thickness is ¼ of the emission wavelength. These layers are often n-doped. This is followed by an active region with a p-n junction where injected carriers combine to emit light. At the center of the active region are quantum wells which are typically GaAs for 850 nm emission, GaInP for red VCSEL emission, or InGaAs for emission wavelengths longer than 870 nm. The quantum wells are separated by barrier layers, and the quantum well/barrier structure is sandwiched by confinement layers, which are doped n-type on the substrate side and p-type on the top side. As an example, for 850 nm emission, the quantum wells would be GaAs, barrier layers could be $Al_xGa_{1-x}As$, with x=0.25, and confinement layers could be $Al_xGa_{1-x}As$ with x=0.50. On top of the p-doped confinement layer is deposited a second DBR composed of a stack of quarter wavelength thick layers which are also doped p-type. The active region thickness total (quantum wells, barrier layers and confinement layers) may be one optical wavelength, but could be any integer multiple of half wavelengths. An alternative to this structure reverses the doping layers with the p-type doping on the bottom of the structure and the n-type doping on the top.

VCSEL 1204 is a two junction VCSEL. The structure is similar to the single junction VCSEL 1202 except for the active region. In this case the active region contains two p-n junctions centered on two sets of quantum wells. Each set of quantum wells may include one or more wells, although typically the number is between 1 and 4 quantum wells separated by barrier wells. In this case each set of quantum wells may be separated by a confinement layer. Between the two quantum well p-n junctions is a tunnel junction. The p- and n-doping on each side of the tunnel junction is very high to reduce the breakdown voltage and allow current to flow through the junction. Usually the doping is chosen so that the transmission through the junction has a nearly ohmic character.

Figure 13:
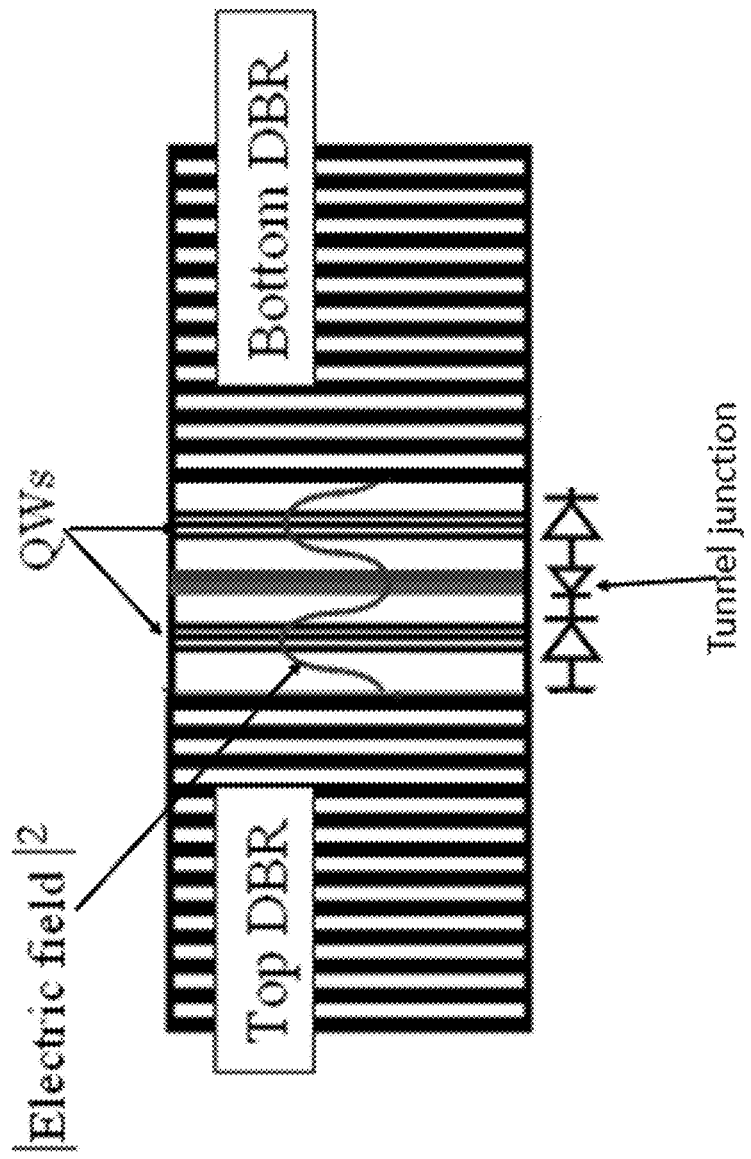
FIG. 13 is a representation of the active region of a two-junction VCSEL in accordance with various implementations.

FIG. 13 is a representation of the active region of a two-junction VCSEL in accordance with various implementations. After the bottom n-type mirror is deposited, an n-type confinement layer is grown. Next is a nominally undoped set of 1-4 quantum wells separated by barrier layers. Then a confinement layer is grown which starts out p-doped. In the middle of the confinement layer, a tunnel junction is placed, with the p-type doping increased to 10 $e^{19}/cm^3$ or higher doping, and then switching abruptly to high n-type doping (10 $e^{19}/cm^3$ or higher). The rest of the intermediate confinement layer is grown with a lower concentration of n-type doping, followed by nominally undoped quantum well active region, and then followed by a p-type confinement layer and the p-type DBR. The active region therefore has two quantum well active regions centered at p-n junctions and separated by a tunnel junction. The purpose of the tunnel junction is to allow current to flow through a reverse biased junction without an excessive penalty due to the voltage required to transfer current through the reverse biased junction. The two p-n junctions allow the recombination of holes and electrons at the two junctions to generate light.

For high efficiency, the quantum well layers should be positioned at the peak of the electric field, while the tunnel junction should be positioned at a minimum of the electric field. This is illustrated in FIG. 13. Top and bottom mirrors sandwich the active layer. Two sets of quantum wells are located at the peak of the electric field with a forward biased p-n junction centered on each set of quantum wells, while a reverse biased tunnel junction is located between the two quantum well active regions and is at a minimum of the electric field. This helps minimize the absorption resulting from the high doping in the tunnel junction.

Figure 14:
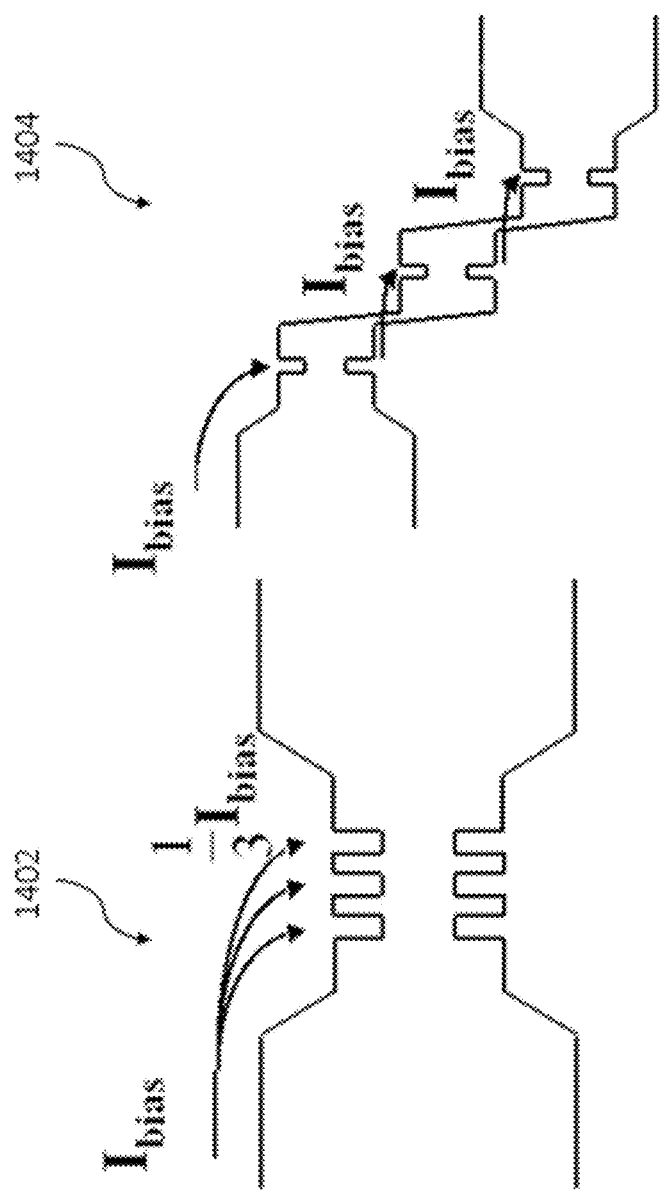
FIG. 14 illustrates the conduction band and valence band structure of quantum wells in accordance with various implementations.

FIG. 14 illustrates the conduction band and valence band structure of various quantum wells in accordance with various implementations. Diagram 1402 represents a conventional quantum well device which is not biased, while diagram 1404 shows the band structure of a multi junction active region, in this case with 3 separate quantum well p-n junctions separated by tunnel junctions and placed under bias. With sufficient bias applied, the tunnel junctions pass current easily in the reverse biased condition, while the p-n junctions at the quantum wells are forward biased.

Figure 15:
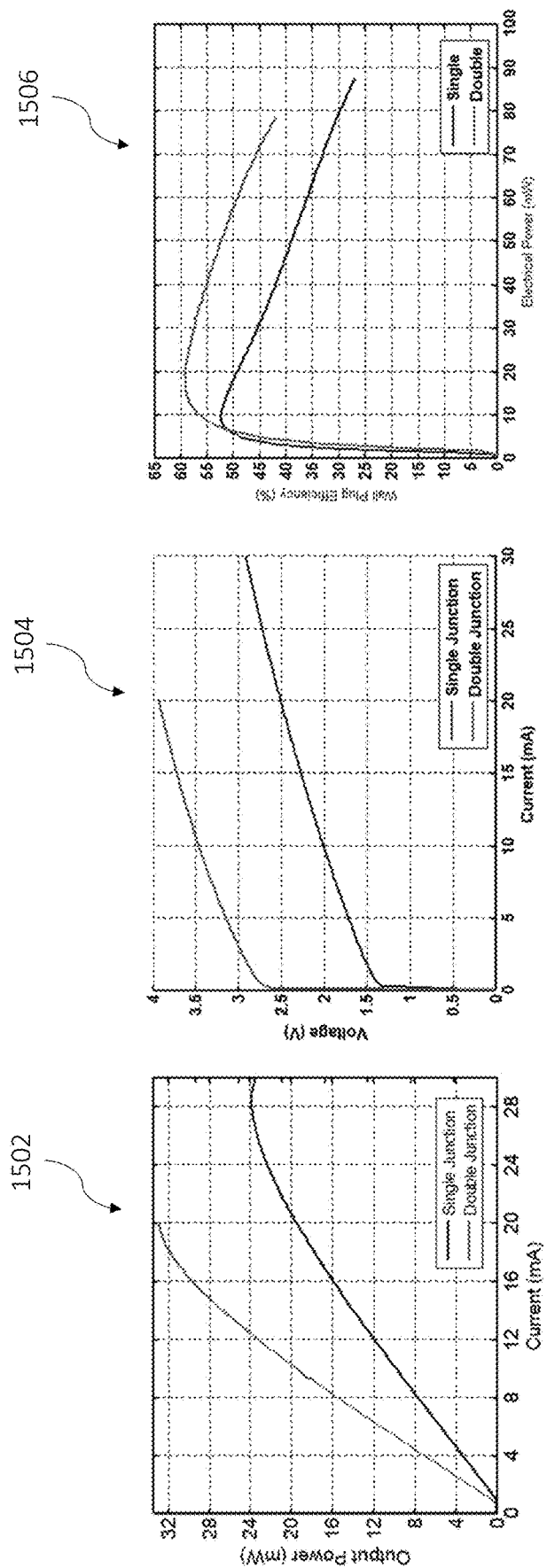
FIG. 15 shows graphs comparing the performance between a single junction VCSEL and a double junction VCSEL in accordance with various implementations.

FIG. 15 shows graphs comparing the performance between a single junction 940 nm VCSEL and a double junction 940 nm VCSEL in accordance with various implementations. The two designs are compared for output power versus current in graph 1502, for voltage versus current in graph 1504, and for efficiency versus output power in graph 1506. In graph 1502 it is seen that the slope efficiency, i.e. the output power divided by input current, is significantly higher for the double junction VCSEL. The slope efficiency for the single junction is approximately 1 W/A, while the slope efficiency of the two-junction VCSEL is approximately double, or 2 W/A. On the other hand, graph 1504 illustrates the voltage versus current of the two designs. For example, the voltage required to drive 10 mA of current through the single-junction VCSEL is 2V, while the voltage required to drive 10 mA through the double junction VCSEL is 3.5V. Finally, in graph 1506 we see that the peak electrical to optical power conversion efficiency of the single junction VCSEL is around 52% at an electrical power dissipation of 9 mW, while the peak efficiency of the double junction VCSEL is approximately 59% at an electrical power dissipation of around 15 mW. The improved efficiency may be explained by the fact that the threshold currents of the two designs are quite similar, and the slope efficiency of the double junction device is essentially double that of the single junction design, but the voltage increase is less than 2×. The voltage is a function of the junction voltages plus the resistance times current through the mirrors. While the junction voltage doubles due to the presence of two junctions, the series resistance remains approximately the same.

Figure 16:
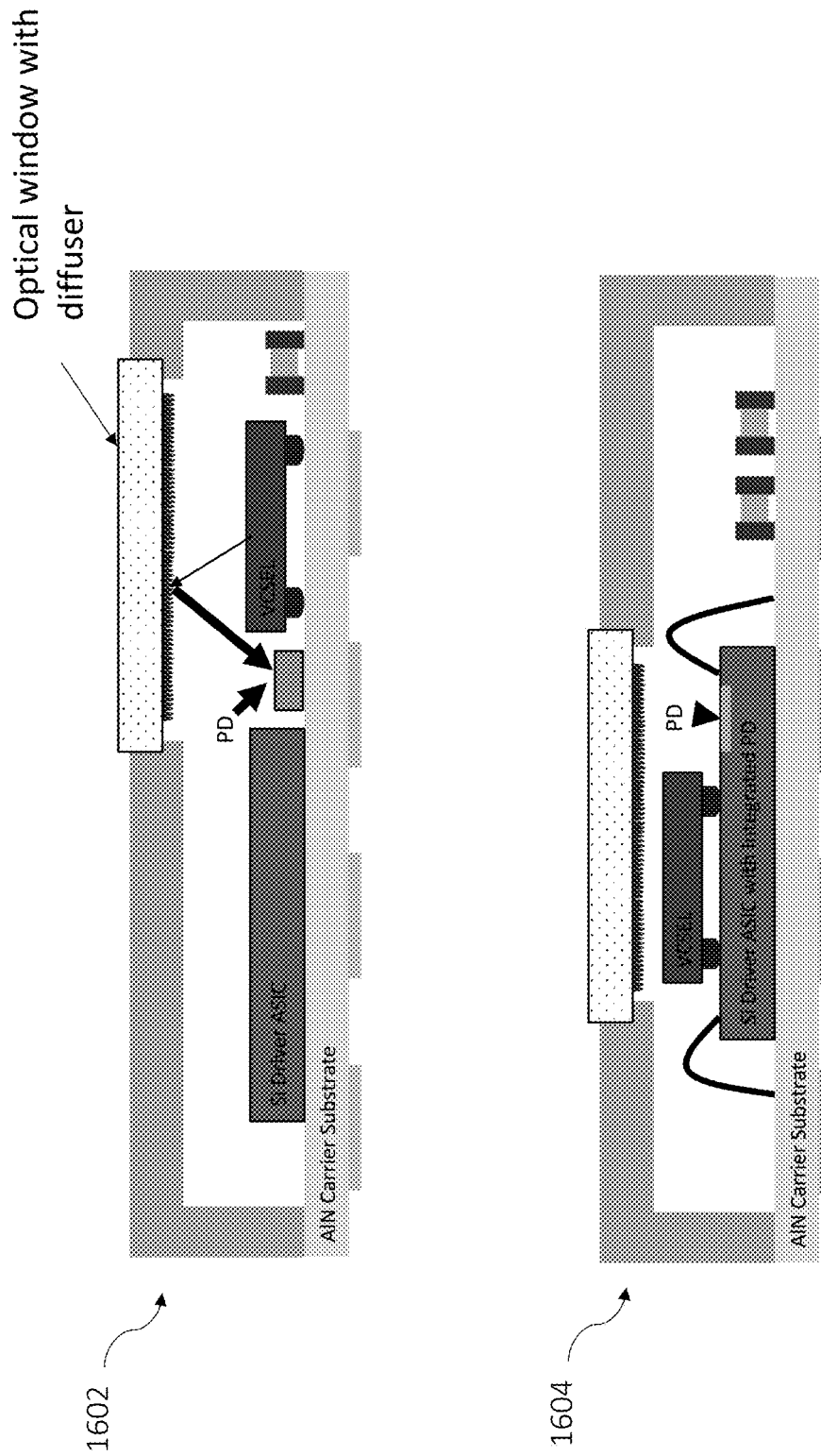
FIG. 16 is a block diagram illustrating illumination modules with VCSELs and integrated drivers in accordance with various implementations.

For applications such as Time of Flight based 3D sensing, the VCSEL arrays may be combined with a driver integrated circuit (IC) that provides a short pulse, typically in the range of 1 to 10 nanoseconds, although it could be both shorter or longer. It is important that the rise time of the pulse be as short as possible in order to have the best time, and hence distance, resolution in a 3D time of flight application. FIG. 16 is a block diagram illustrating illumination modules with VCSELs and integrated drivers in accordance with various implementations. In some implementations an illumination module includes an optical element that creates a particular light pattern or field of view. In the modules illustrated in FIG. 16, the optical element is a diffuser that converts the normally circular beam into a rectangular field of view. Another function is to incorporate a photodetector (PD) that may monitor the output of the VCSEL and also detect if the optical element is somehow lost or damaged. Light may be reflected or scattered from the diffuser or window down onto the photodetector. Illumination module 1602 shows the photodetector adjacent to the VCSEL and both separate from the driver while illumination module 1604 shows the photodetector incorporated into the driver and the VCSEL chip mounted on top of the driver.

Other passive elements such as capacitors and resistors may be incorporated in the module for improved performance. All these elements may be incorporated into a housing, with a clear glass or optical element incorporated as a window that allows the light to exit the module. The base of the module may be a printed circuit board, a lead frame, a ceramic sub-mount or any other substrate that provides mechanical support and electrical signal routing. Electrical connection to the semiconductor chips (VCSEL, photodetector, driver integrated circuit) and passive electrical components may be provided with wire bonds, bump bonding to the substrate or wire bonding or bump bonding directly between devices.

Figure 17:
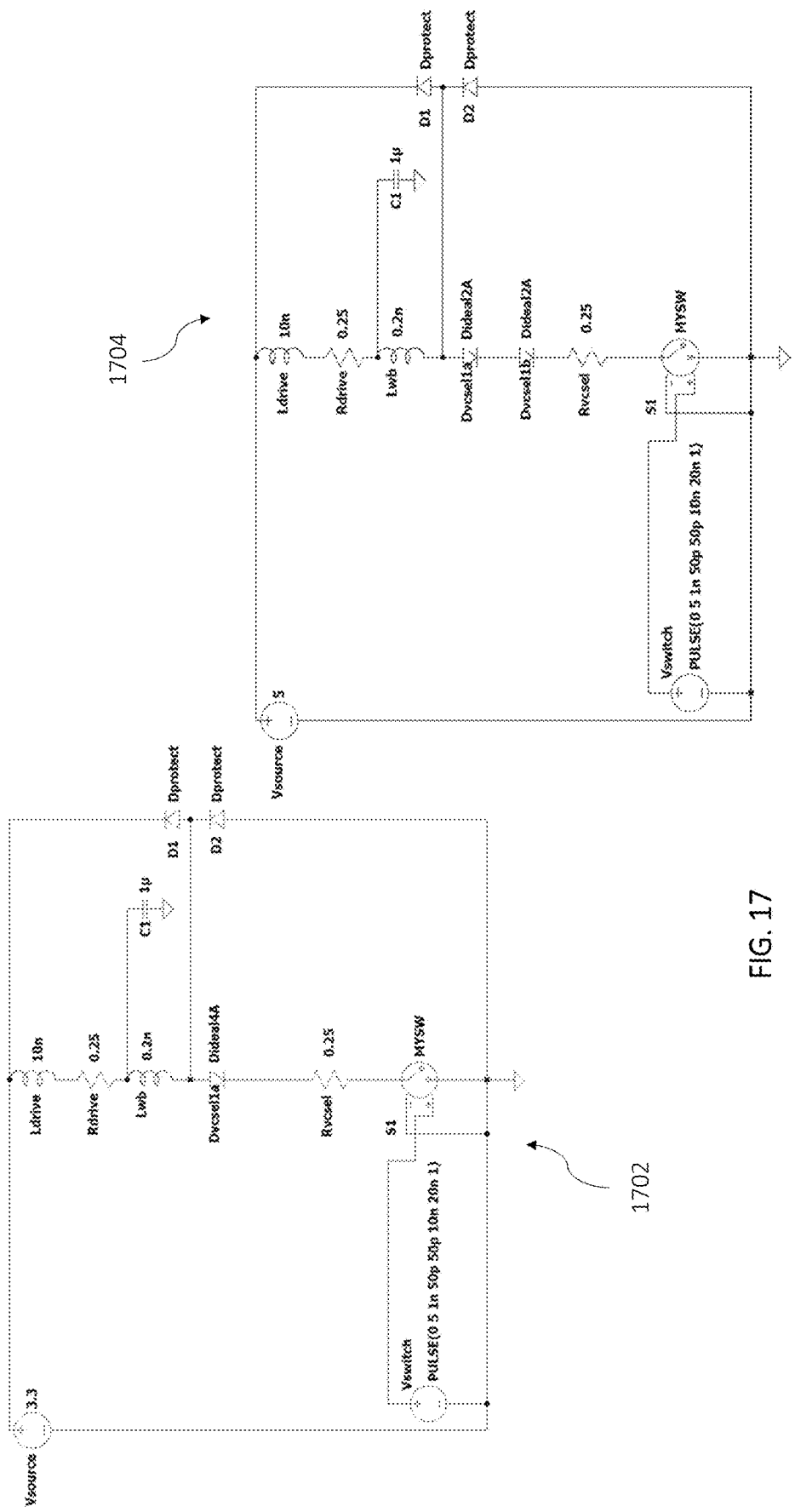
FIG. 17 shows equivalent circuit estimates for single and double junction VCSELs in accordance with various implementations.

The VCSEL die may be electrically connected to the driver IC which provides the nanosecond range pulse to the VCSEL. Several laser driver architectures are available including those based on silicon CMOS or high power GaN FETs. Often the switching speed of a driver and laser individually may be greater than several GHz but the response of the system is limited by the interconnection of the two components. The response time of the VCSEL (i.e., rise time of the optical light pulse) is affected by the rise time of the electrical pulse, the parasitics (capacitance and resistance) of the VCSEL chips, and inductance due to the connection method between the driver and the VCSEL. Particularly at high currents, the inductance of the connection method may dominate. For instance, the inductance may be due to a wire bond or bonds, traces travelling through the sub-mount, or the bump bond attachment to the driver or sub-mount. SPICE simulations have been done to estimate and compare the rise time of the single junction VCSEL versus the double junction VCSEL. FIG. 17 shows equivalent circuit estimates for single and double junction VCSELs in accordance with various implementations. Circuit diagram 1702 shows the equivalent circuit estimate for the single junction VCSEL, while circuit diagram 1704 shows the equivalent circuit for the double junction VCSEL. An interconnect inductance of 0.2 nanohenrys was assumed, while the resistance of the VCSEL array was assumed to be 0.25 ohms. In order to make the comparison, driving conditions were assumed for the two designs that would result in the same amount of optical output power. For the single junction VCSEL, a driving current of 4 A was assumed, while for the double junction VCSEL a driving current of 2 A was assumed, since the slope efficiency is approximately 2× higher.

Figure 18:
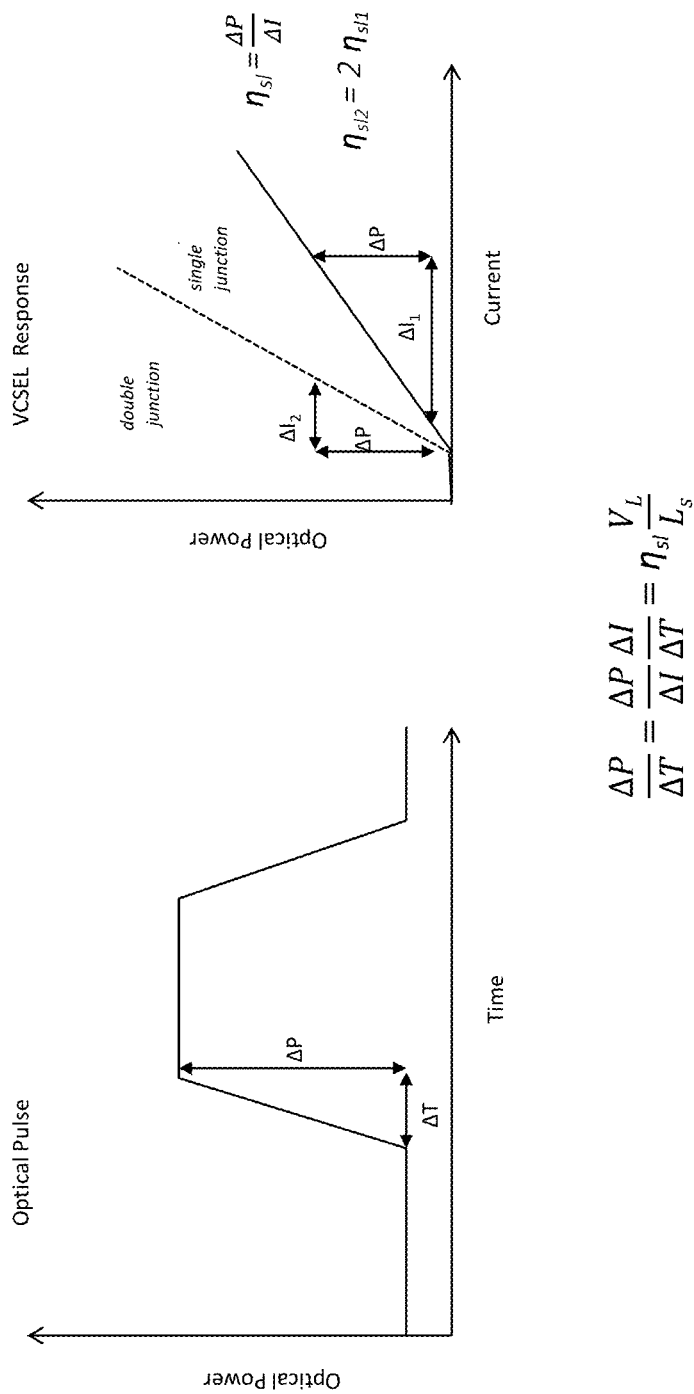
FIG. 18 illustrates the current response time for single and multi junction VCSELs in accordance with various implementations.

Transient response of current through the inductor, and also the VCSEL, is defined as $dI/dt=L_s/V_L$, in which $L_s$ is the inductance and $V_L$ is the supply voltage. Switching speed therefore may be optimized by minimizing inductance or increasing the available supply voltage. However, a multi junction VCSEL offers another approach for increasing the speed of the circuit. As shown in FIG. 18, the total response of the system is characterized by $dP/dt=dP/dI*dI/dt$. If we consider bias conditions above VCSEL threshold then $dP/dI=\eta_{s1}$, the slope efficiency, so the response becomes $dP/dt=\eta_{s1}*L_s/V_L$. For a single junction VCSEL the maximum slope efficiency is limited to 100% differential quantum efficiency, but for the multi-junction VCSEL the differential quantum efficiency may greatly exceed 100%. The maximum slope efficiency for n stages becomes: $\eta_{s1}/\lambda*1.24$ [A*um/W]. The rise time may then be proportionately reduced by the number of stages in the multi junction VCSEL. Furthermore, if the total current required to operate VCSEL is lower, then resistive losses due to other parasitic elements in the module are also proportionately reduced, resulting in a higher efficiency system.

Figure 19:
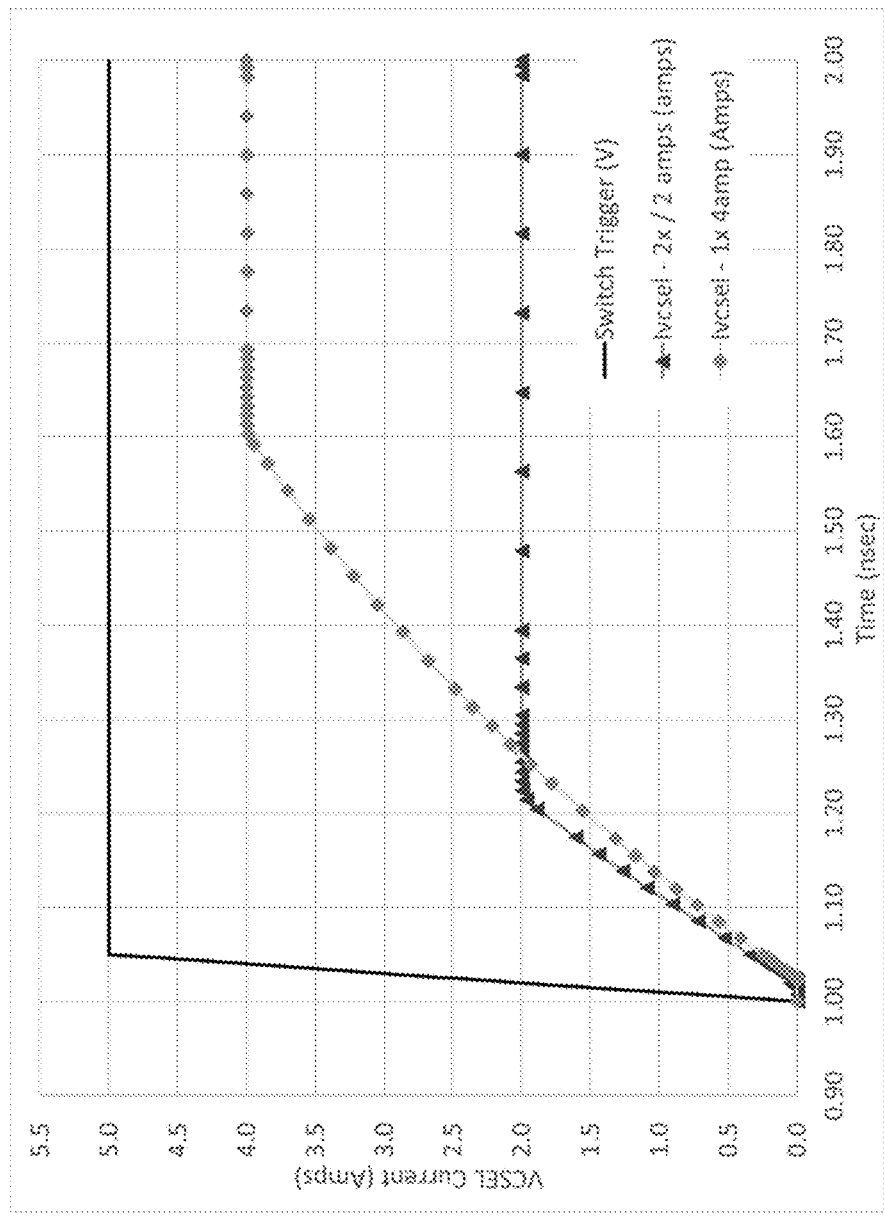
FIG. 19 shows a graph comparing the rise time of a single junction VCSEL and a double junction VCSEL in accordance with various implementations.

FIG. 19 illustrates the outcome of a SPICE simulation, using the equivalent circuits of FIG. 17. The plot shows the rise time of the current flow through each type of device, which corresponds to the rise time of the light emission. The rise time for the current to go from 20% of maximum to 80% of maximum is shown for each type of design. For the single junction VCSEL (upper curve), the 20/80 risetime is estimated to be 416 picoseconds, while for the double junction VCSEL (lower curve), the estimated rise time is 134 picoseconds. Thus FIG. 19 illustrates the benefit of using the double junction VCSEL for Time of Flight or LIDAR applications. The reduction in required current leads to a much faster rise time, and hence improved depth resolution.

For a consumer application, in which the voltage may be limited to the range of less than 5 volts, the double junction VCSEL design would be suitable and would bring the advantages of a faster rise time for improved distance resolution in 3D sensing, and would also provide the advantage of higher power per chip area, or alternatively a smaller chip area for a constant level of output power. For LIDAR applications, a triple junction, or even more junctions could further enhance the output power per area, while providing the same advantage of fast rise time and associated improved distance resolution. For LIDAR applications, several multiple junction VCSEL chip arrays could be incorporated into a module, along with one or more driver circuits for providing the electrical pulses to the VCSEL die.

Figure 20:
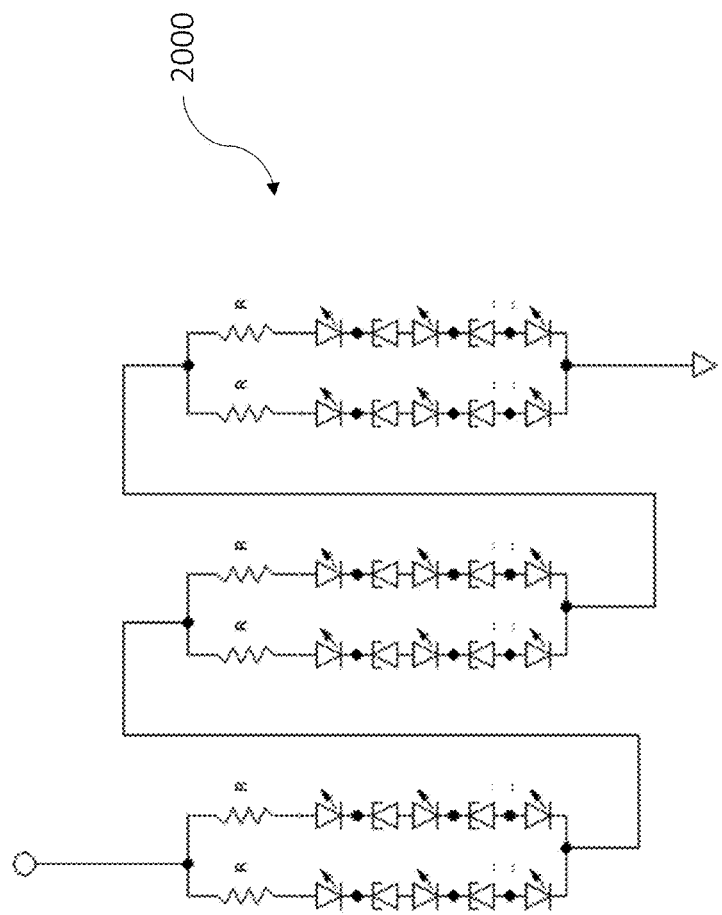
FIG. 20 shows a circuit diagram of three VCSELs connected in series in accordance with various implementations.

For very high power systems several VCSEL arrays could be connected in series or parallel to tailor the required voltage and current to exactly match the optimal load of the driver. The interconnection could be made within a single VCSEL chip or by tiling multiple chips on a circuit board, sub-mount, or directly onto the driver itself. FIG. 20 shows a circuit diagram 2000 of three VCSELs connected in series in accordance with various implementations. In circuit diagram 2000, three sets of VCSELs are connected in series, but each set includes two triple junction VCSELs in parallel. In general, any combination of VCSELs in parallel and series is possible.

The multi junction designs may be developed in both a top emitting VCSEL or bottom emitting VCSEL and may also be implemented in any wavelength suitable for a VCSEL. This includes long wavelength (>1 micron) VCSELs based upon the InP system, near IR VCSELs (750 nm to 1100 nm) VCSELs based upon the AlGaAs/GaAs/InGaAs materials system, red VCSELs based upon the AlGaAs/InGaP materials system, and blue and green VCSELs based upon the AlGaN/GaN/InGaN materials system.

While FIG. 16 illustrates VCSELs being incorporated into a module that includes optics, and a driver IC, the VCSEL could also be provided in a simple first level package, with or without the optics included in the package, and integrated on a board with the driver IC. The optics may also be integrated directly onto the VCSEL chip itself.

Common Anode VCSEL Arrays

Figure 21:
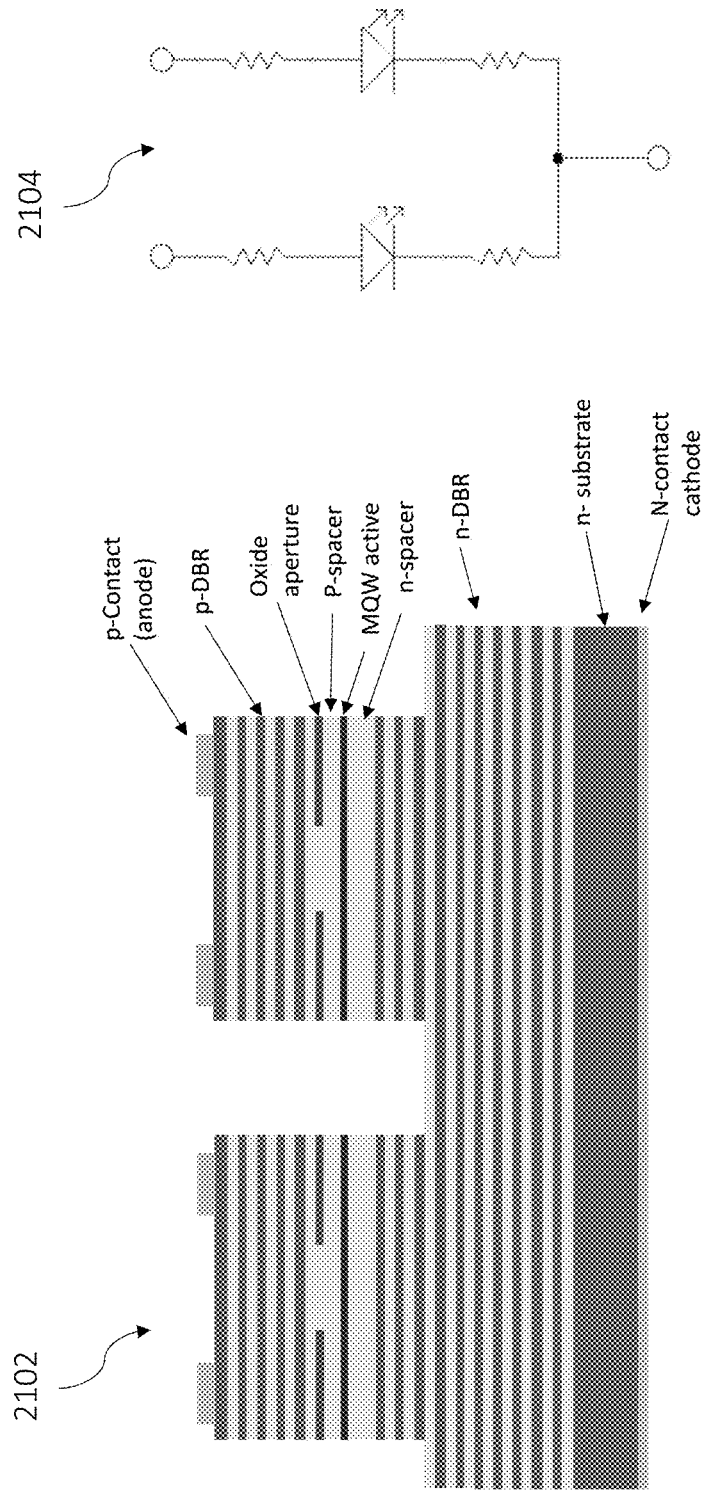
FIG. 21 illustrates a prior art common cathode VCSEL.

FIG. 21 illustrates a prior art common cathode VCSEL 2102 as was previously shown in FIG. 12, except two VCSEL diodes are shown. Starting at the bottom of VCSEL 2101, there is an n-metal contact to the n-doped substrate. In the case of VCSEL wavelengths ranging from around 650 nm to 1060 nm, this substrate most likely would be GaAs, but could also be InP or GaN for other wavelength ranges. On top of the substrate are epitaxially deposited n-doped DBR mirror layers composed of alternating layers of two different compositions with different refractive indices. For instance, the two layers could be GaAs and AlAs or different compositions of the ternary AlGaAs. This is followed by the quantum well based diode junction. On top of the mirror is an n-doped spacer layer, followed by nominally undoped multi-quantum wells, and then by a p-doped spacer layer. On top of this active region is grown a p-doped DBR mirror similarly composed of GaAs, AlAs or its ternary AlGaAs. A metal contact to the p-doped layers is deposited and patterned on top of the structure. Two diodes are shown in FIG. 21, with a mesa etched around each diode that reaches down to the bottom n-doped mirror, thus isolating the p-side of the diodes. One layer with a higher aluminum composition than the others (AlAs or very high aluminum containing AlGaAs) is grown in the structure. After etching of the mesas around each diode, the structure is exposed to steam, which results in this high aluminum containing layer being converted to $Al_2O_3$. The oxidation process is controlled to leave an opening in the center of the mesa. The oxide is insulating, thus providing a current aperture to confine current flow to the center of the mesa. Diagram 2104 represents the circuit layout of the VCSEL 2102, showing that they share a common cathode but have separate anode contacts.

Figure 22:
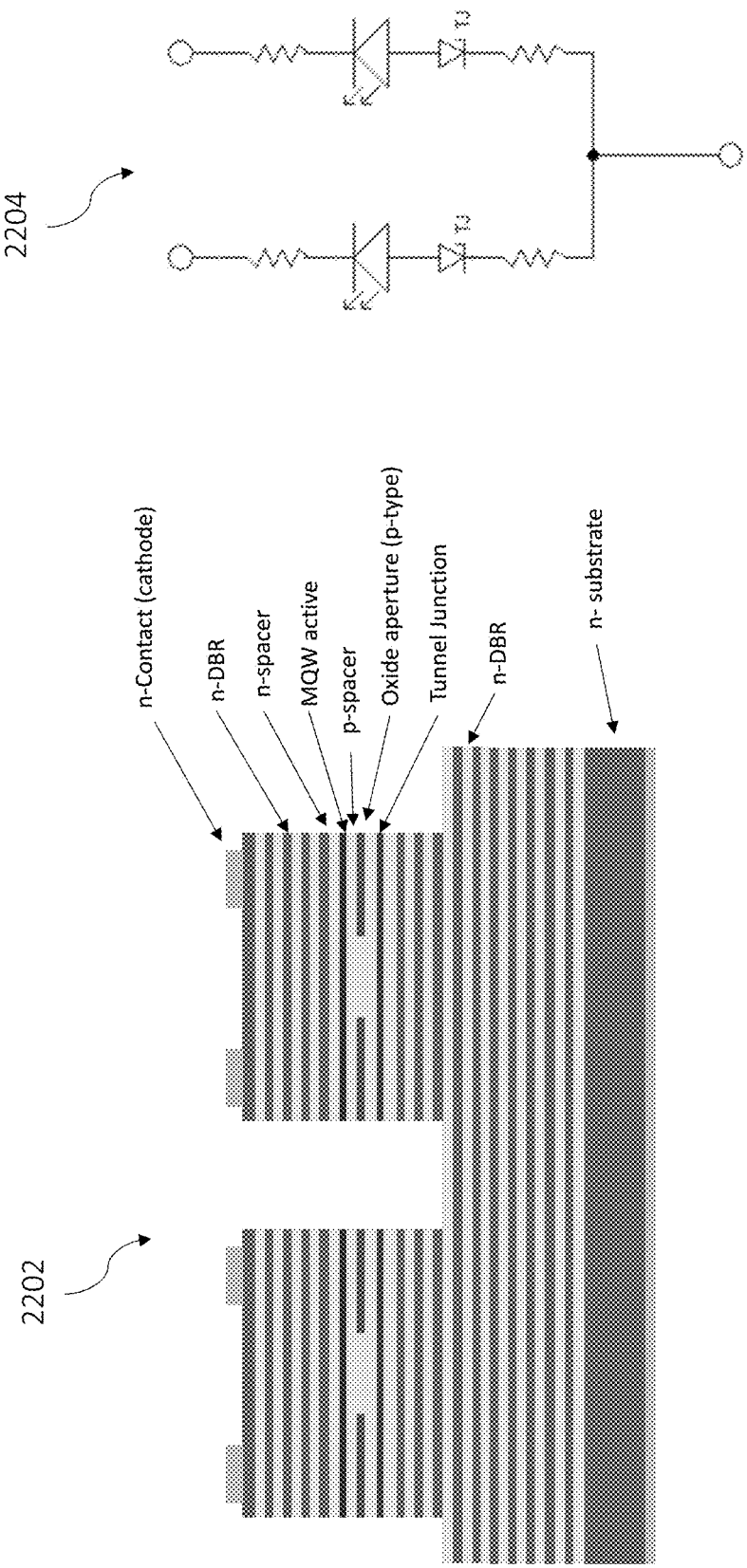
FIG. 22 illustrates a common anode VCSEL in accordance with various implementations.

FIG. 22 illustrates a common anode VCSEL 2202 in accordance with various implementations. The structure begins as before, with a metal contact to the n-type material of the substrate. This is followed as before with an n-doped DBR mirror stack. An n-doped spacer layer follows, but then a tunnel junction is grown. The tunnel junction includes a very highly doped n-type layer directly on top of the n-spacer layer, followed by a very highly doped p-type layer. Next to the highly doped p-layer of the tunnel junction is grown a p-type spacer layer, followed by nominally undoped multiple quantum wells, and then followed by an n-doped spacer layer. Compared to VCSEL 2102, in which the light emitting junction is n-p, (i.e. the bottom layer is n-doped and the top is p-doped), in VCSEL 2202 the light emitting junction is reversed and is now a p-n junction. On top of the n-spacer layer is grown an n-type DBR mirror and a metal forming an ohmic contact to these n-type layers is deposited and patterned on the top surface. A mesa is etched around each diode as before, and current confinement is providing by oxidizing a high aluminum containing layer to form a current aperture, as before.

Diagram 2204 represents the circuit layout of the VCSEL 2202. In this structure, the junction has been inverted such that the p-side of the junctions are tied together as a common anode. When the multi-quantum well junctions are operated in forward bias to emit light, the tunnel junctions will be reverse biased. Although the tunnel junctions will be reverse biased in operation, the very high levels of doping result in a very low breakdown voltage of the junction, such that the transmission of current through the tunnel junction under reverse bias appears to be almost ohmic in nature. The function of the tunnel junction is to allow current to flow through an n-type substrate and n-type mirror to the p-side of the junction. This structure allows the design to remain built on an n-doped substrate, but the fabrication of the device is nearly identical to the fabrication of a conventional VCSEL. The n-doped top mirror also has an advantage, in that the carrier absorption of n-type doping is less than that of p-type doping, potentially resulting in lower loss and higher efficiency.

Figure 23:
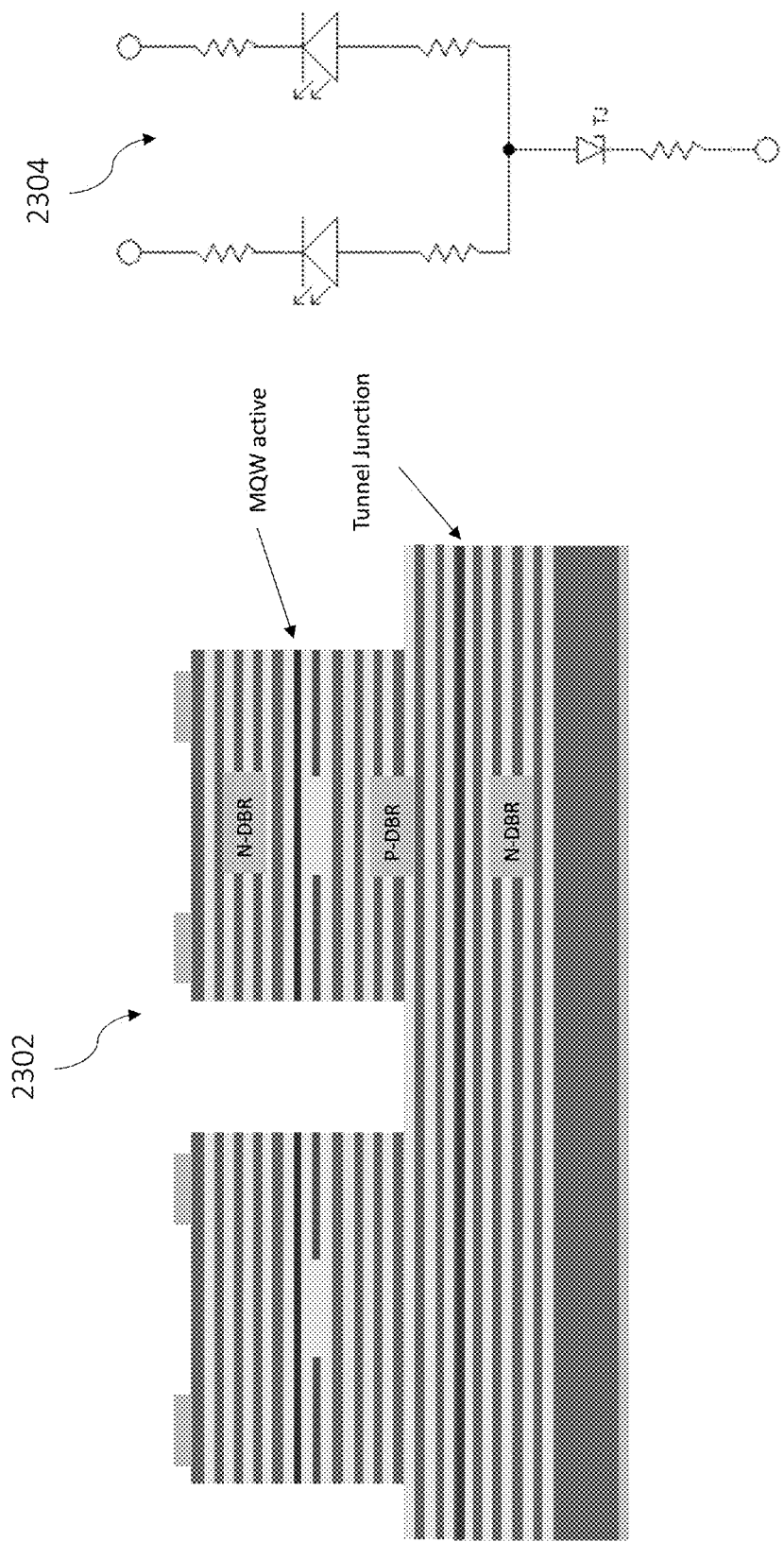
FIG. 23 illustrates another common anode VCSEL in accordance with various implementations.

FIG. 23 illustrates another common anode VCSEL 2302 in accordance with various implementations. In VCSEL 2302, the tunnel junction is moved deeper into the bottom mirror. In this case, again starting from the bottom up, a metal contact is deposited on the substrate side of the structure, with the substrate doped n-type. Partway through the bottom mirror a tunnel junction is created, again with high n-type doping followed by high p-type doping. The rest of the bottom mirror is grown with p-type doping. Placing the tunnel junction into the bottom mirror results in a bottom DBR that is partial p-type and partial n-type. A p-doped spacer is grown, followed by nominally undoped multi-quantum well active layers, and an n-type spacer. As in FIG. 22, the top mirror is now doped n-type, and a metal contact is deposited and patterned on the top surface of this structure. As before, a trench is etched around each diode, and the carrier confinement layer is created through oxidation. The corresponding equivalent circuit is shown in diagram 2304. In this case the tunnel junction is shared by the two diodes. This may further reduce resistance and removes the highly doped layers from the active region where the light is generated, but at the cost of p-doped mirror layers close to the active region.

Figure 24:
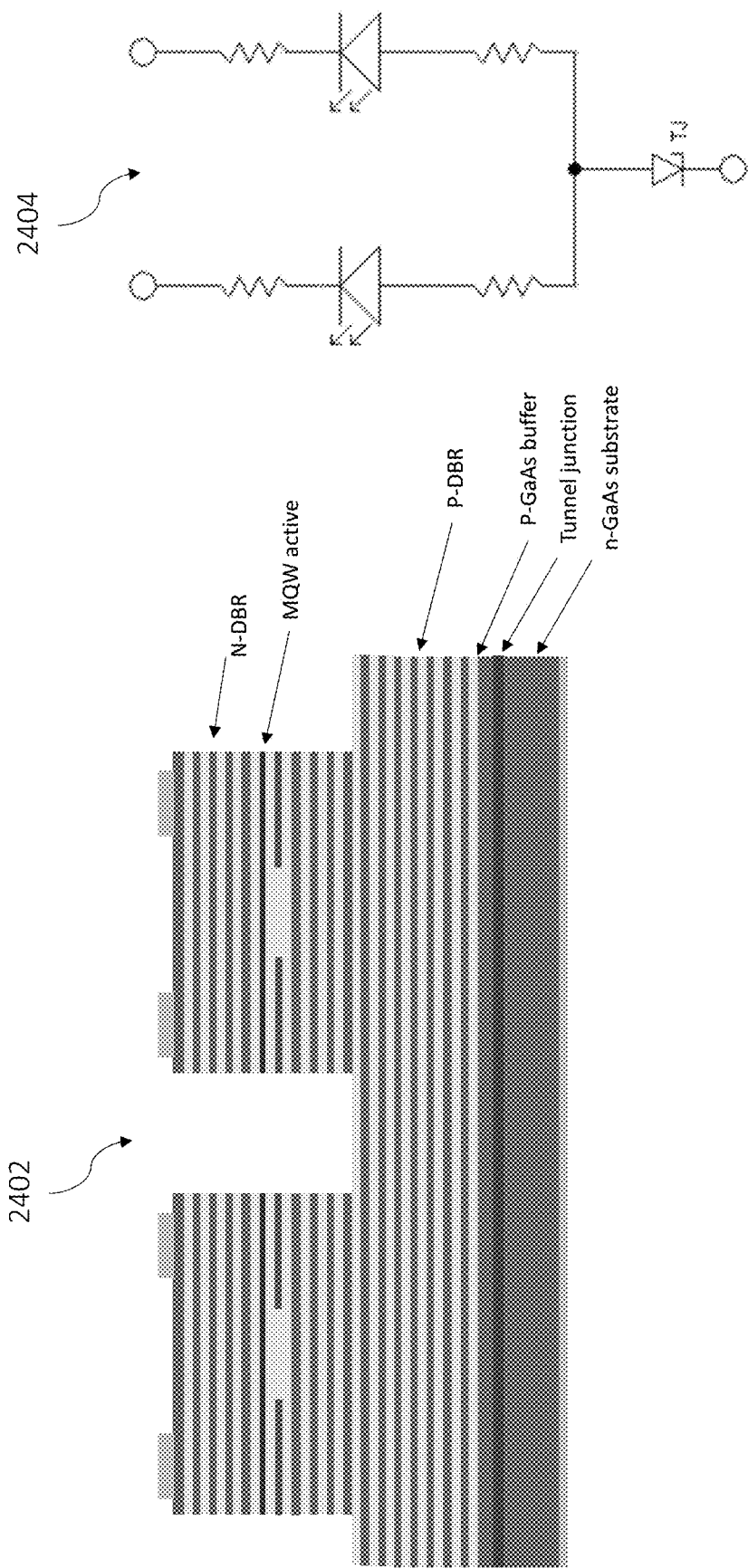
FIG. 24 illustrates another common anode VCSEL in accordance with various implementations.

FIG. 24 illustrates yet another common anode VCSEL 2402 in accordance with various implementations. In this case, the tunnel junction is moved to a buffer layer grown on top of the substrate. On top of the n-type GaAs, an optional n-type buffer may be grown, followed by the highly doped n-type layers, and highly doped p-type layers to form the tunnel junction, and then by a p-doped bottom DBR mirror. As before the active region includes a p-spacer, nominally undoped multi-quantum well active region, an n-type spacer, an n-doped top DBR mirror and a top metal contact. The equivalent circuit diagram is shown in diagram 2404, which looks equivalent to diagram 2304, although the quantitative values of the resistor values may differ somewhat.

Figure 25:
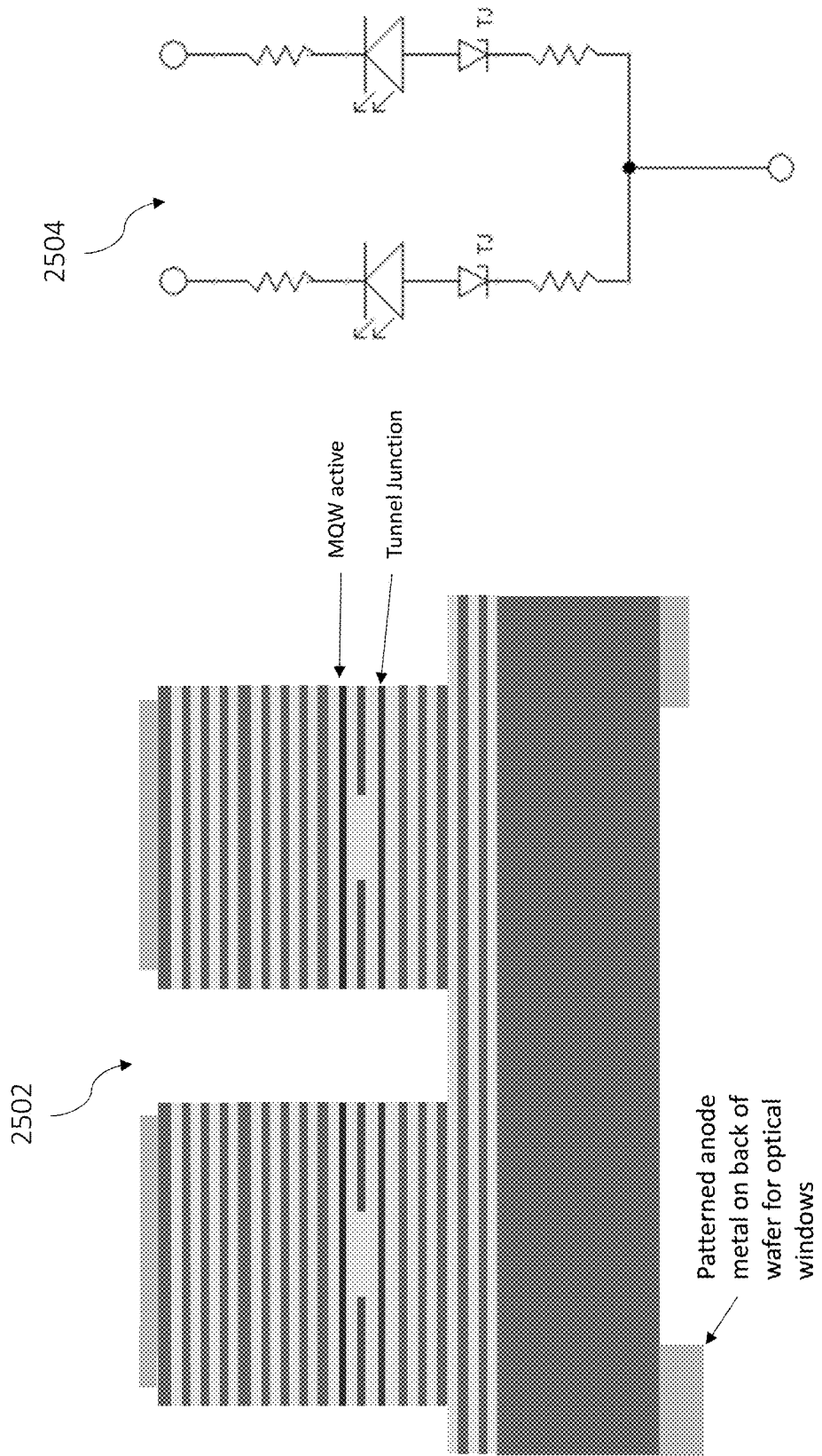
FIG. 25 illustrates a bottom-emitting common anode VCSEL in accordance with various implementations.

FIGS. 22-24 illustrate VCSEL structures that are top emitting, i.e. the light is emitted from the top surface of the VCSEL. FIG. 25 illustrates the structure of a "bottom emitting" VCSEL 2502, i.e. a device designed to emit through the bottom substrate, in accordance with various implementations. In this case the semiconductor layers and the equivalent circuit are the same as VCSEL 2202 in FIG.

22. However, the epitaxial layers are chosen to favor light emission through the substrate. This means that the emission wavelength should be greater than 870 nm, and preferably 930 nm or greater to minimize absorption of light in the GaAs substrate. This implies that the multi-quantum wells may be an InGaAs composition designed to emit light at 870 nm or greater. Also, the number of periods in the DBR mirrors will be chosen so that the top DBR mirror will be highly reflective, while the bottom mirror (closest to the substrate) will be slightly less reflective, enhancing the emission through the substrate side. Since emission is through the substrate, the top metal contact may completely cover the VCSEL mesa, while the bottom metal contact will be patterned to leave open windows for light to be emitted through the bottom. Diagram 2504 represents the circuit layout of the VCSEL 2502.

Figure 26:
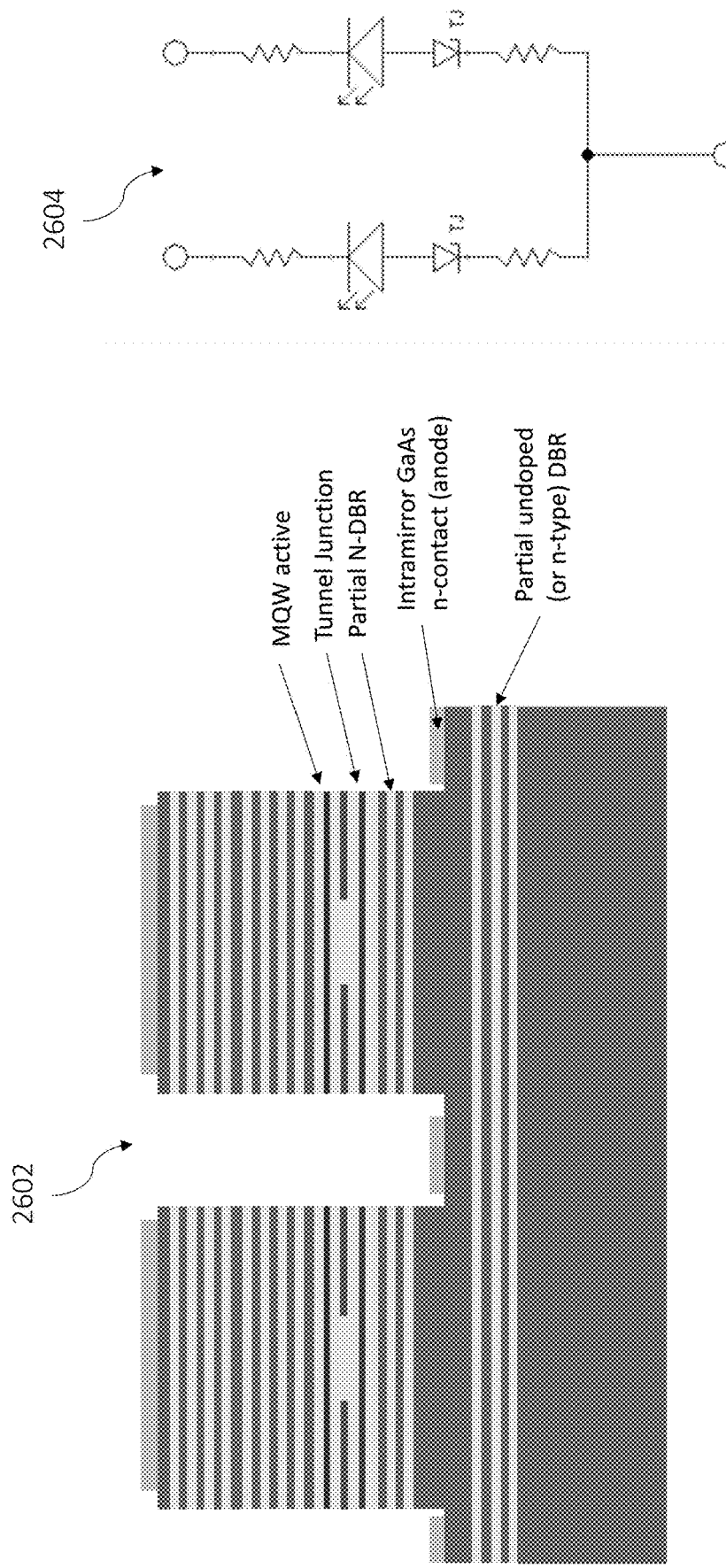
FIG. 26 illustrates another bottom-emitting common anode VCSEL in accordance with various implementations.

FIG. 26 illustrates a schematic design of another bottom-emitting common anode VCSEL 2602 in accordance with various implementations. Since an n-doped substrate is relatively thick compared to the thickness of the VCSEL, the residual free carrier absorption of a doped substrate may noticeably reduce the overall efficiency. In VCSEL 2602, the structure is deposited on an undoped substrate. In this case a doped buffer layer may be grown, either under the bottom mirror or within the bottom mirror. This layer is sufficiently thick with sufficient doping to allow a metal contact to be made to this layer. The rest of the bottom DBR n-doped mirror is grown, followed by the tunnel junction, the p-doped spacer, the multi-quantum well active region, an n-doped spacer and a top n-doped DBR mirror. In this case, the mesa should be etched sufficiently deep to reach this buffer layer, so that a metal contact may be deposited at the bottom of the etched region to form a contact to the anode side of the junction. The top metal may completely cover the VCSEL mesa, as light will be emitted through the bottom. Diagram 2604 represents the circuit layout of the VCSEL 2602.

In some implementations, VCSEL 2602 may be varied by growing the buffer layer on top of the substrate and under the bottom mirror, or to place the buffer layer on top of the bottom mirror, right before growing the spacer layer and tunnel junction. In some implementations, the buffer layer may be eliminated, and the mesa is etched down into the n-doped metal mirror, making the electrical contact directly to these layers.

The above-described approaches for creating a common anode array may also be combined with a multi junction VCSEL. As described above, a multi junction VCSEL contains two or more p-n junctions for generating light and allows the current to be re-cycled by placing a tunnel junction between the active regions. An example of such a multi junction VCSEL is VCSEL 1204 in FIG. 12. As described previously, a dual junction VCSEL may start with a bottom metal contact, an n-doped substrate, and an n-doped DBR bottom mirror. This is followed by the spacer layer, a multi-quantum well active region, and a p-doped spacer. A tunnel junction comes next with a highly doped p-type layer, followed by a highly doped n-type layer with these two layers forming the tunnel junction. Another n-doped spacer layer is followed by a second set of nominally undoped multi-quantum wells and another p-doped spacer layer. Then a p-doped DBR top mirror is grown, and a metal contact layer is deposited and patterned. In operation, the two multi-quantum well junctions are forward biased, and electrons and holes combine to emit light. The tunnel junction is reverse biased and due to the high doping will have a low breakdown voltage and hence allows current to pass with nearly ohmic characteristics. Therefore carriers may be re-cycled. The performance of this structure was presented in FIG. 15. The structure may also improve the speed performance of an array for applications like a Time of Flight sensor. Package inductance may limit speed when driving high current into a VCSEL array, but the reduction of the required current for a given output power may result in a faster rise time of the optical output power. Additional junctions may be added, separated by tunnel junctions to further increase the output power versus current.

The multi junction VCSELs just described may also be designed to create a common anode array. FIG. 27 illustrates a common anode VCSEL array 2702 in accordance with various implementations. Describing the layers of VCSEL array 2702 from the bottom up, it starts with the metal contact on the substrate size. The substrate is doped n-type, and an n-doped DBR bottom mirror is deposited on the substrate. Next comes an n-doped spacer, followed by a tunnel junction composed of a highly doped n-layer, followed by a highly doped p-layer. A p-spacer layer comes next, followed by the nominally undoped multi-quantum well active layer, and then an n-doped spacer. A second tunnel junction follows, then a p-doped spacer, a second nominally undoped multi-quantum well active region, and an n-doped spacer. The top DBR mirror is n-doped, and the metal contact is deposited and patterned on the top surface. The two tunnel junctions accommodate two multi-quantum well n-p junction active regions such and allows for both the top and bottom DBRs to be doped n-type so that segmented arrays may be driven in a common anode configuration. Diagram 2704 represents the circuit layout of the VCSEL array 2702.

Additional junctions (three or more) may be added to VCSEL array 2702 by adding a tunnel junction and another p-n junction quantum well region per junction. The variants for the location of the tunnel junction closest to the substrate, as described in FIGS. 22-24, may similarly be applied to the multi junction cases.

Figure 28:
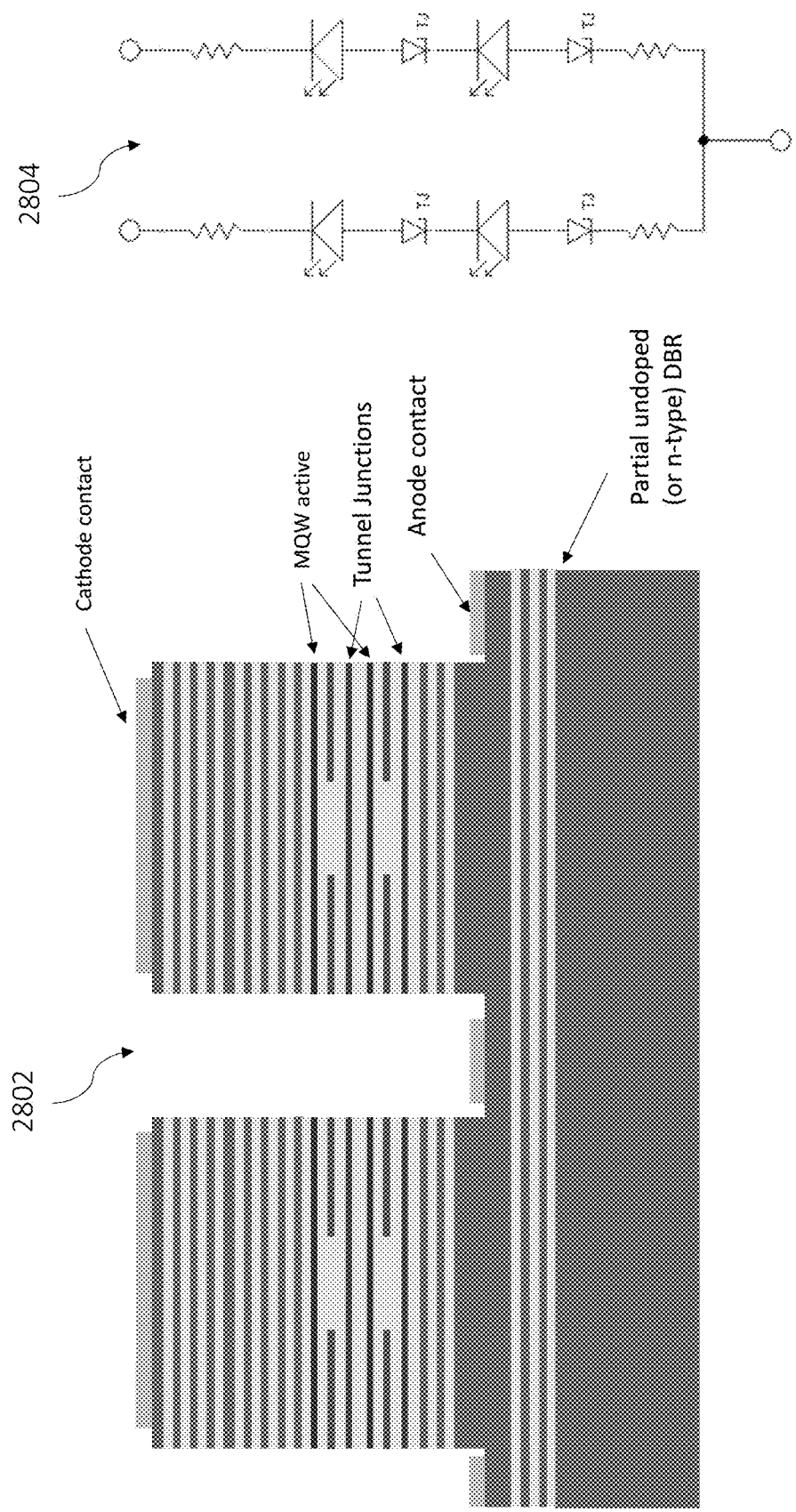
FIG. 28 illustrates a bottom-emitting common anode VCSEL array in accordance with various implementations.

A multi junction common anode segmented VCSEL array may also be fabricated in the bottom emitting format. FIG. 28 illustrates a bottom-emitting common anode VCSEL array 2802 in accordance with various implementations. VCSEL array 2802 may be deposited on a semi-insulating substrate. An n-doped buffer layer is shown as grown within the bottom mirror and is doped n-type. The mesa around each diode may then be etched down to this layer and a metal contact deposited and patterned. As before, the buffer layer may be deposited under the bottom mirror, within the mirror, or on top of the bottom mirror. Diagram 2804 represents the circuit layout of the VCSEL array 2802.

Figure 29:
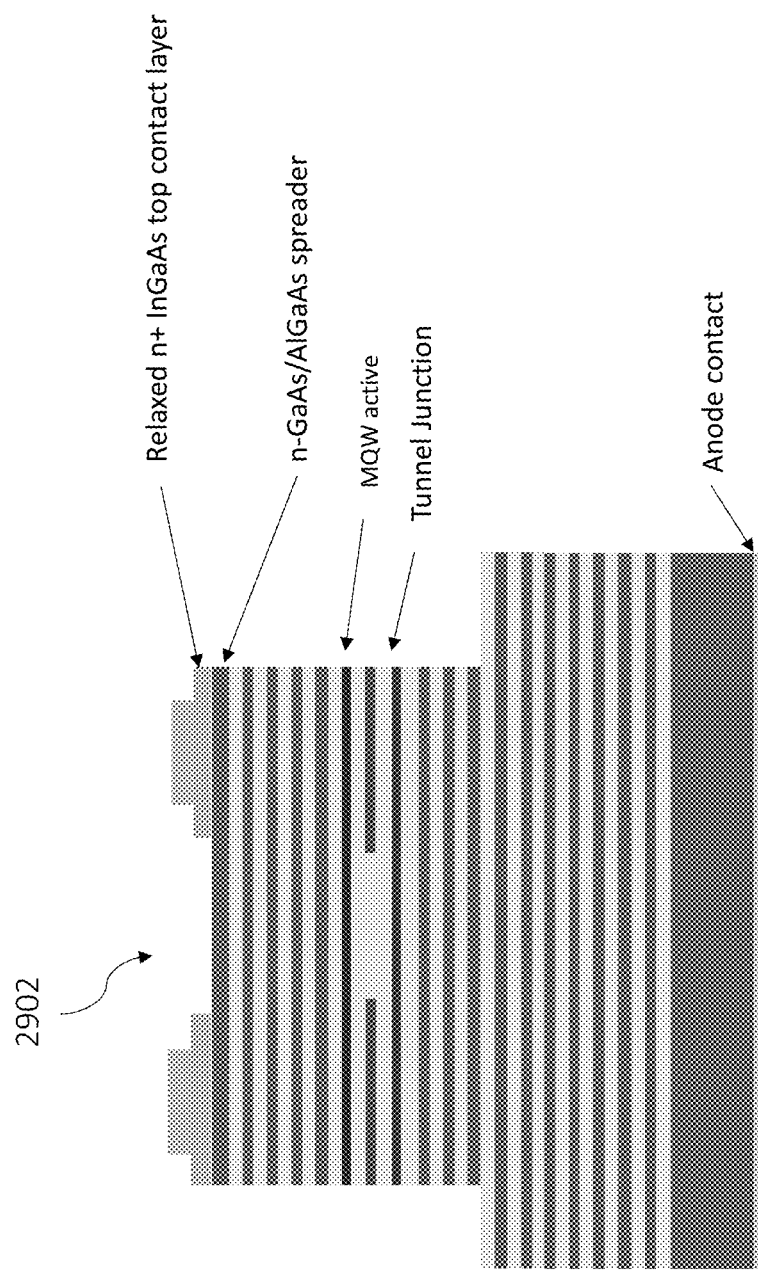
FIG. 29 illustrates a VCSEL with an n-doped top layer in accordance with various implementations.

A conventional VCSEL ends with a p-type material. Typically, the material at the very top surface of the epitaxial layer structure is highly doped p-type, allowing current to easily tunnel through to a deposited metal layer. However, this approach is typically less effective for n-type GaAs or AlGaAs at the surface. It is more difficult to achieve the required high doping. A metal stack may be used which diffuses or forms an intermetallic layer at the surface to ensure ohmic behavior. However, these reactions may lead to reliability issues. Another approach is to reduce the potential between the surface of a GaAs layer and the metal by inserting a relatively highly n-type doped InGaAs layer at the top surface of the structure which enables a good ohmic contact without requiring an alloying process. The InGaAs layer prevents n-metal diffusion into the top DBR. This is illustrated in VCSEL 2902 in FIG. 29, which shows an InGaAs layer on the top surface located under the patterned metal contact. The InGaAs layer is etched away from the emitting surface of the VCSEL, however, in order to avoid light absorption in this layer.

Figure 30:
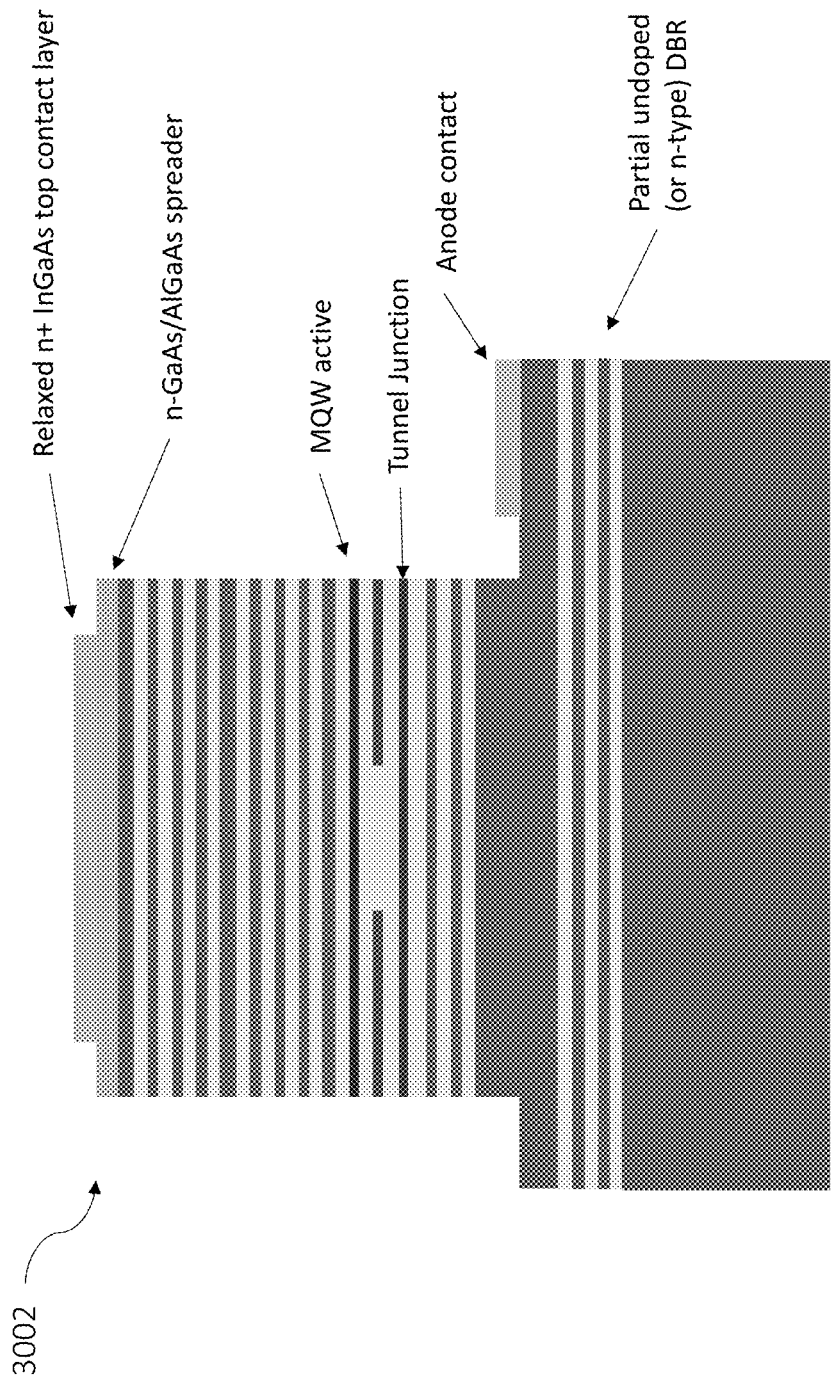
FIG. 30 illustrates a bottom-emitting VCSEL with an n-doped top layer in accordance with various implementations.

FIG. 30 illustrates a bottom-emitting VCSEL 3002 with an n-doped top layer in accordance with various implementations. As with VCSEL 2902, the top layer of VCSEL 3002 may be a InGaAs contact layer. In this case the top contact metal and the InGaAs contact layer cover the entire mesa, since light is being emitted through the substrate side. In this version, the substrate is non-conductive, and the anode side contacts are made by etching down to a doped buffer layer and depositing and patterning the contacts as was described with reference to FIG. 26.

VCSELs with Integrated HBT

Figure 31:
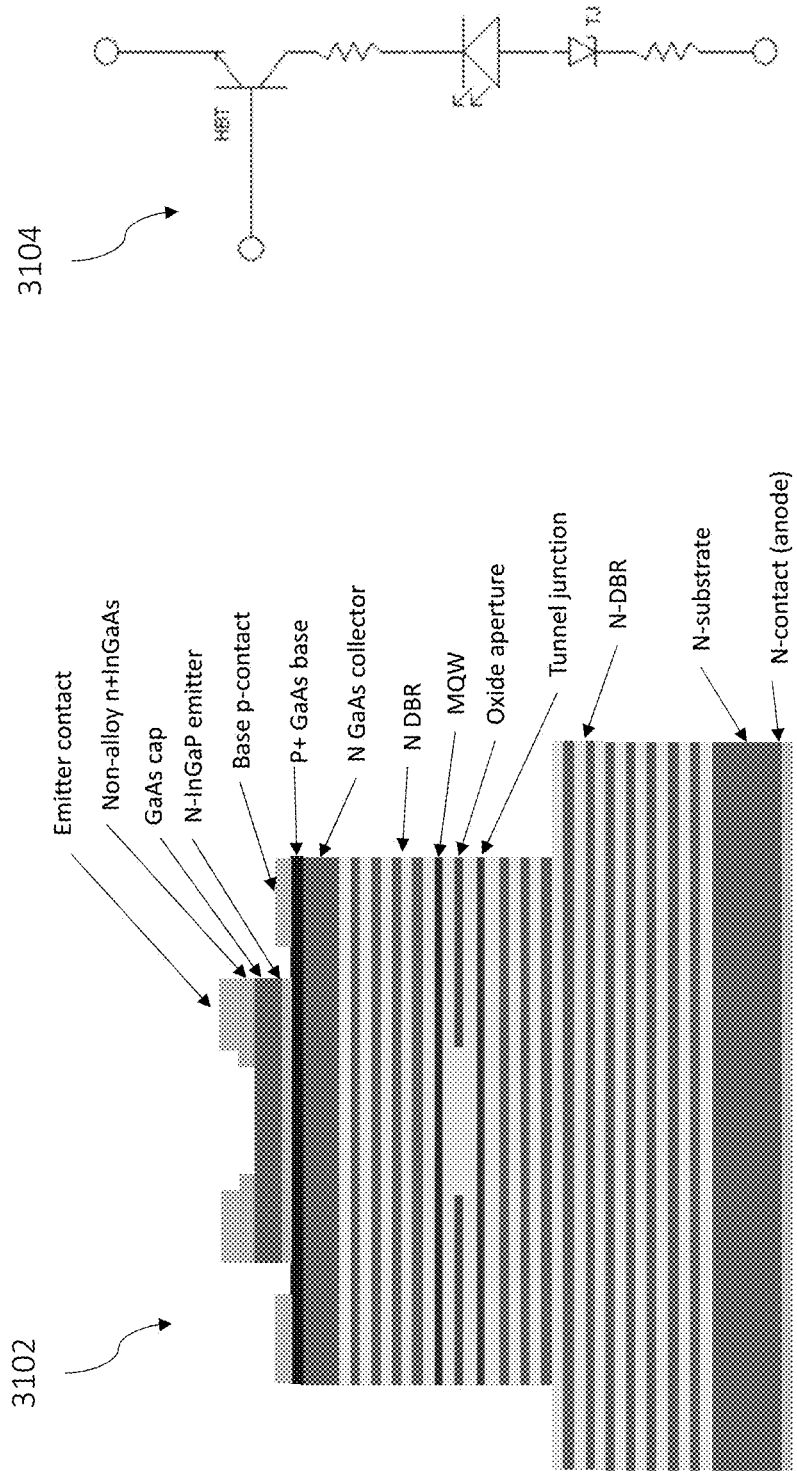
FIG. 31 illustrates a common anode VCSEL with integrated HBT in accordance with various implementations.

The diode structures described above, with two n-type mirrors and a tunnel junction, may also be incorporated into a three-terminal device by integrating with an n-p-n HBT. FIG. 31 illustrates a common anode VCSEL 3102 with integrated HBT in accordance with various implementations. VCSEL 3102 is similar to VCSEL 2202 described with respect to FIG. 22. As previously prescribed, the layers starting from the bottom may include a bottom metal contact, n-doped GaAs substrate, n-doped mirror, n-spacer layer, tunnel junction, p-spacer containing the oxide aperture, nominally undoped multi-quantum well active region, n-spacer and an n-doped DBR top mirror. However, on top of this surface is an NPN HBT structure. If the VCSEL 3102 is designed to emit at the wavelength greater than approximately 900 nm, then this structure may include a N-doped GaAs collector layer, a $p^+$ GaAs base layer, an n-doped InGaP emitter layer, a GaAs cap layer, and an n-doped InGaAs layer to serve as a non-alloy contact layer. A larger diameter is etched around the VCSEL diode to allow formation of the oxide current confinement layer. A smaller mesa is etched around the n-doped InGaP emitter layer, the GaAs cap and the $n^+$ doped InGaAs contact layer. A p-type metal contact is made on the top of the $p^+$ GaAs base layer, and an emitter metal contact is deposited and patterned on the InGaAs contact layer. The InGaAs contact layer is also etched away from the light emission area on the top surface of the chip so that light will not be absorbed by this layer.

Diagram 3104 represents the circuit layout of the VCSEL 3102 with integrated HBT. By controlling the voltage to the base contact of the HBT, the HBT functions as a switch, turning on and off the current that flows through the VCSEL. In an array, this switch functionality may allow addressability for the VCSELs in the array. The integration may also assist in improving the switching speed of the VCSEL, with a lower voltage applied to the HBT base controlling the switching of the higher current through the VCSEL device.

Figure 32:
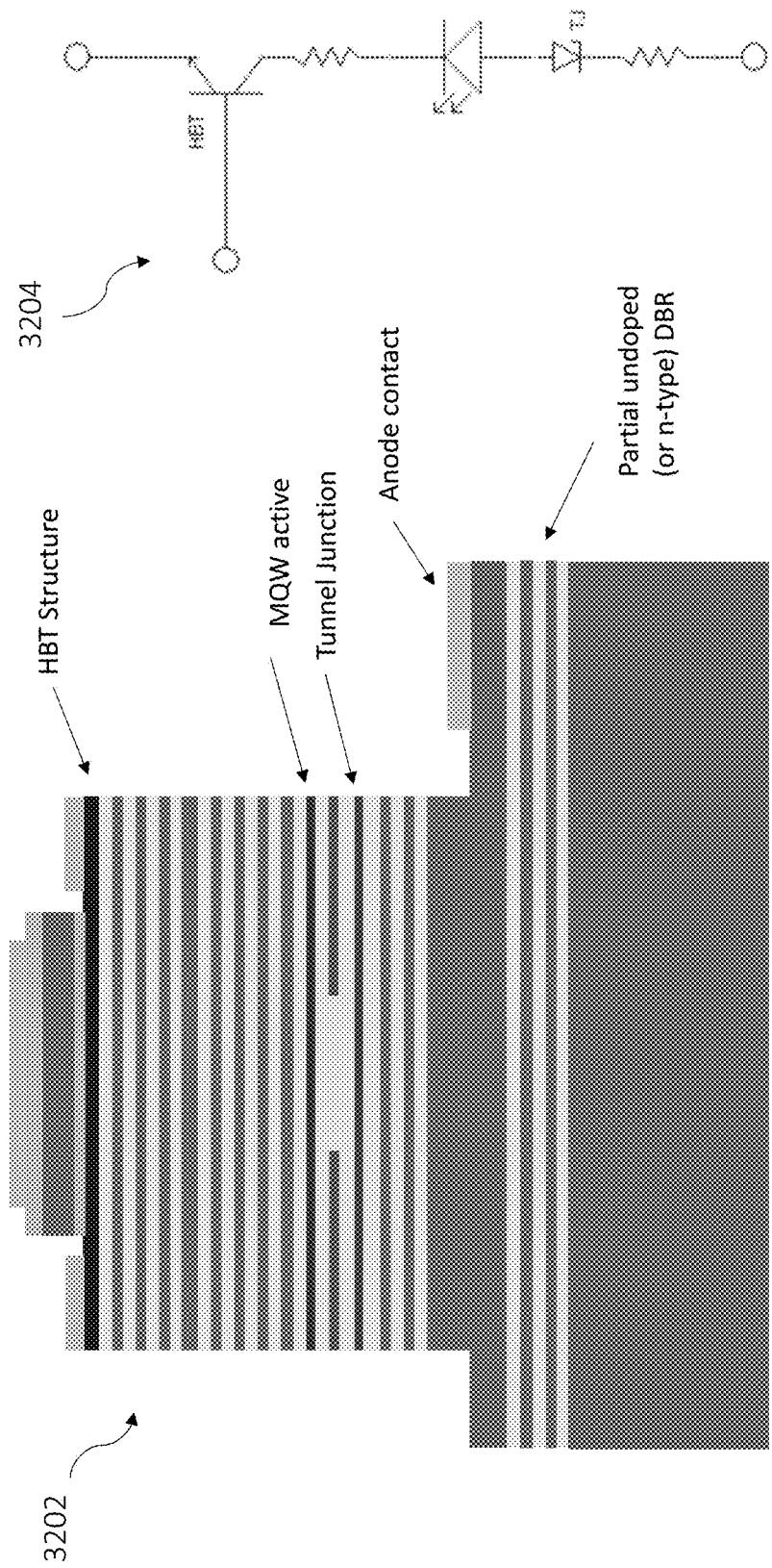
FIG. 32 illustrates a bottom-emitting VCSEL with integrated HBT in accordance with various implementations.

The variations described above in FIGS. 22-30 may also be incorporated into structures integrated with the HBT. For example, FIG. 32 illustrates a bottom-emitting VCSEL 3202 with integrated HBT in accordance with various implementations. This may be a combination of the integrated HBT as shown in FIG. 31 with the bottom-emitting VCSEL design as shown in FIG. 26. A buffer layer for contact is included in the bottom n-type mirror, and the VCSEL diode mesa etch is etched down to this layer. The metal which serves as the contact to the VCSEL as well as effectively the HBT collector contact is deposited and patterned on this layer.

The multi junction designs may be developed in both a top emitting VCSEL or bottom emitting VCSEL and may also be implemented in any wavelength suitable for a VCSEL. This includes long wavelength (>1 micron) VCSELs based upon the InP system, near IR VCSELs (750 nm to 1100 nm) VCSELs based upon the AlGaAs/GaAs/InGaAs materials system, red VCSELs base upon the AlGaAs/InGaP materials system, and blue and green VCSELs based upon the AlGaN/GaN/InGaN materials system.

Figure 33:
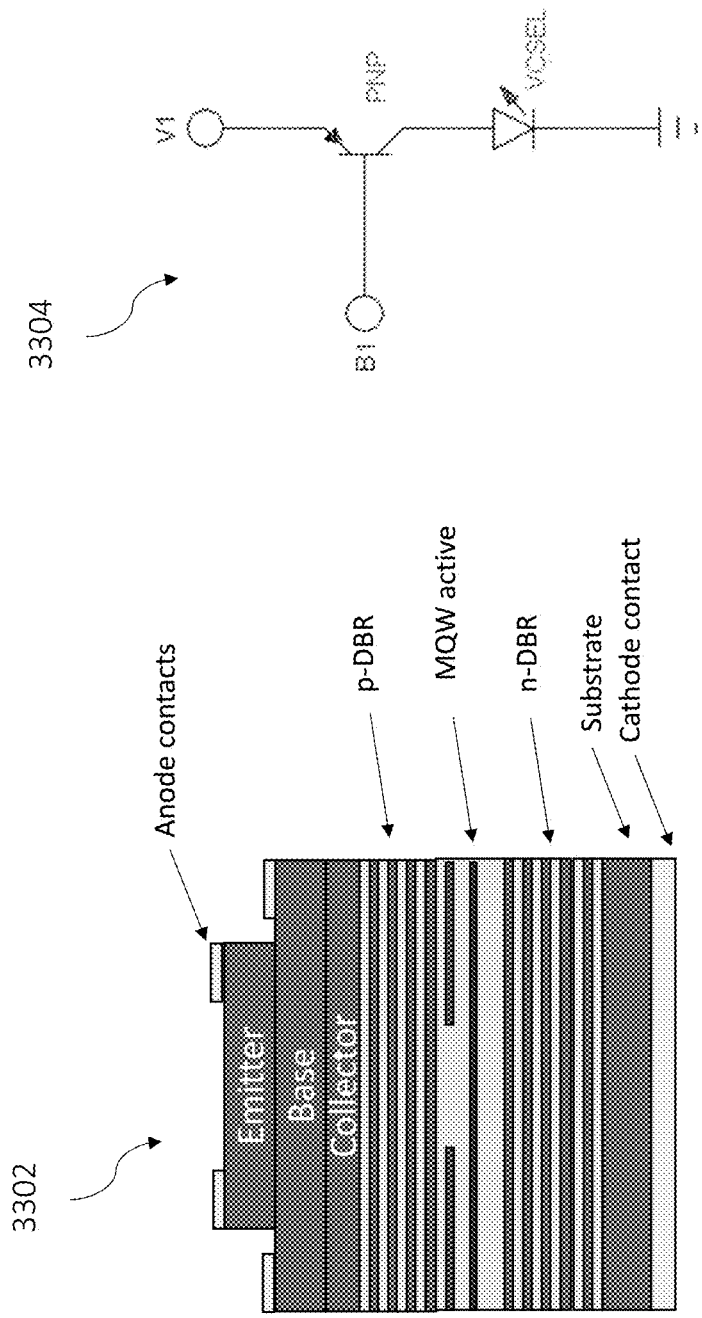
FIG. 33 illustrates a common cathode VCSEL with integrated HBT in accordance with various implementations.

While FIG. 31 illustrates the integration of a VCSEL designed for a common anode with an NPN heterojunction bipolar transistor (HBT), HBTs may also be integrated into a common cathode VCSEL. FIG. 33 illustrates a common cathode VCSEL 3302 with integrated HBT in accordance with various implementations. Starting from the bottom, there is a metal contact on the bottom surface, then a GaAs substrate, which frequently has n-type doping. On top of the substrate, is an n-type DBR mirror, followed by a Quantum Well active region. This active region is made up of multiple layers, including quantum wells separated by barrier layers, and with spacer layers on either side of the quantum and barrier layers. On top of the active region is a p-doped DBR. Within this DBR is usually a layer containing a high percentage of Al, which is subsequently oxidized to convert it from (nearly) AlAs to an insulating aluminum oxide layer which forms a current confinement layer. This layer is not fully converted, leaving a conductive area through which current may flow.

The layer on top of the top p-doped mirror is the collector layer for the HBT, and in one embodiment, is doped p-type. On top of the collector is the n-doped base layer, followed by the p-doped emitter layer. In this structure, a mesa is etched to expose the base layer, and metal contacts are deposited onto both the base and the emitter layers. In this implementation, the light from the VCSEL passes through the layers and the emission window on the top of the structure, and this emission window may be protected by a transparent dielectric layer. In order to achieve efficient emission from the structure, the thicknesses of the collector, base and emitter layer should add up to an odd number of λ/4 optically thick layers. The composition of the emitter, base and collector layers must be chosen so as not to cause absorption of the emitted light. For example, for a VCSEL emitting at 940 nm, the layers may include most compositions in the GaAs/AlGaAs/AlAs materials system. However, for a VCSEL emitting at 850 nm, a GaAs layer cannot be used, and the emission should all be AlGaAs layers of sufficiently high Al content to avoid absorption of the GaAs. This usually means a composition of $Al_xGa_{1-x}As$, where x is greater or equal to 0.12. Alternatively, a GaAs layer could be sufficiently thin, or placed at a null in the optical standing wave to limit absorption of output light being transmitted though these layers.

Diagram 3304 represents the circuit layout of the VCSEL 3302. With the bottom cathode at ground, and a voltage applied to the top metal in contact with the emitter, the emitter, base and collector layers form a PNP transistor which is in series with the VCSEL diode. With a voltage applied to the emitter, controlling the bias to the base layer of the transistor allows one to switch on and off the current flowing through the VCSEL. For example, there may be a string of VCSELs with a common cathode, and a metal contact connecting all the emitters, but separate contacts to the base for each VCSEL. If a bias is applied to one base, the corresponding VCSEL will turn on, while the remaining VCSELs will remain off.

As shown in FIG. 31, the HBT could be designed to be NPN, and then interfaces more naturally to the VCSEL structure of FIG. 31 which is designed to with two n-mirrors so that the structure may be driven with a common anode. It would also be a natural approach if the VCSEL is inverted by growing on a p-type substrate with a bottom p-mirror and top n-mirror. If combined with the conventional VCSEL structure shown in FIG. 33, then a highly doped n-p tunnel junction between the collector layer and the VCSEL active region is required in order to allow current to flow through the VCSEL. The structure may be designed for the VCSEL to be bottom emitting as was illustrated in FIG. 31. In that case, the metal contacting the emitter layer may completely cover the top mesa, and an opening may be created in the bottom metal to allow for light to be emitted. In this case, the top mirror would be nearly 100% reflective, and then the compositions and thicknesses of the HBT would no longer need to be non-absorbing and a specific thickness, as the light is no longer being transmitted through them. In a fourth variation, the HBT structure could also be placed within one or the other of the DBR structures. Depending upon location, one may need to carefully control the thickness, doping and composition to maintain the mirror reflectivity and not create a source of absorption.

Figure 34:
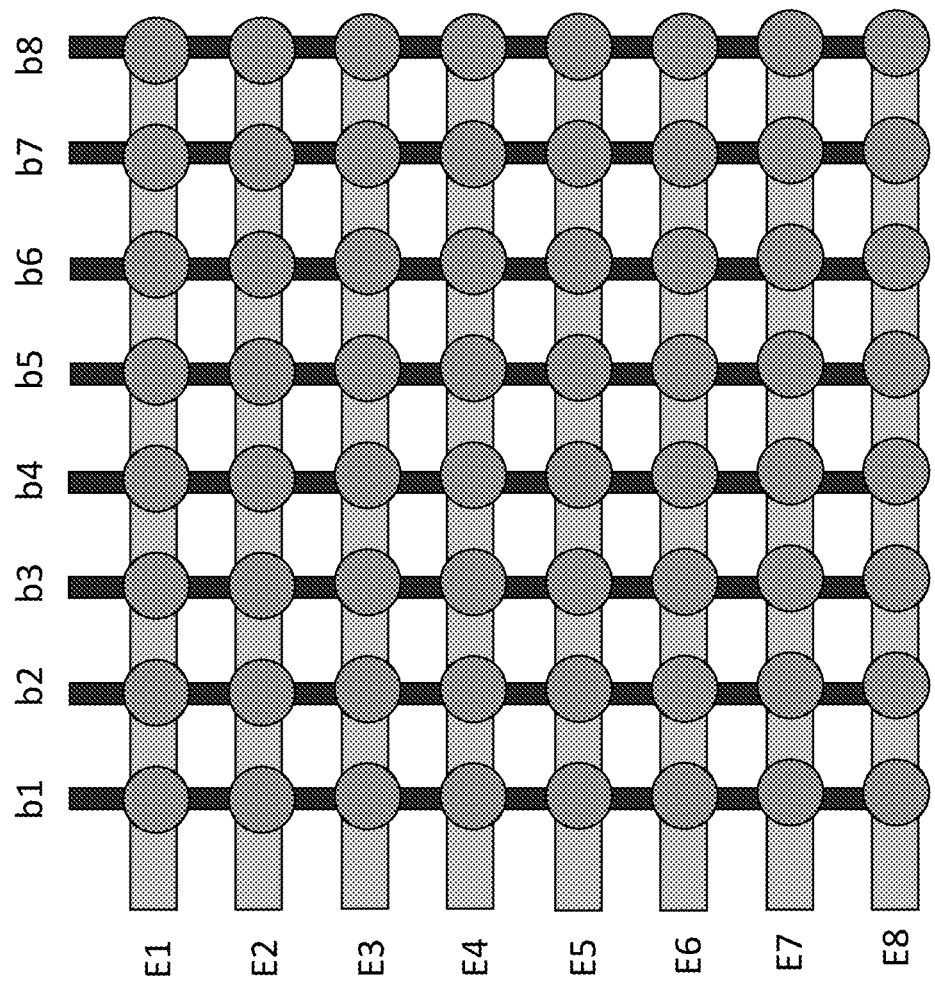
FIG. 34 illustrates a VCSEL array with integrated HBTs in accordance with various implementations.

FIG. 34 illustrates a VCSEL array 3400 with integrated HBTs in accordance with various implementations. Integration of HBT structures in the stack with the VCSELs may be used to create an approach for addressability of a two-dimensional array of VCSELs. This layout assumes that a common contact is made to the bottom of the chip. On the top side, the emitters of all the HBT/VCSELs in a row (E1-E7) share the same emitter interconnect metal with the metal contacting the emitter layers of all VCSELs in the row. The base layers of all the HBTs in a column (b1-b8) are connected with a common base metal interconnect, contacting the base layer in each HBT/VCSEL in the column. If a single emitter row and a single base column are activated, then the VCSEL at the intersection of the two will light up. A single base column and multiple emitter lines could be activated, and then the multiple VCSELs in the base column will emit light. Other patterns may be created with a combination of emitter and base line activation.

Figure 35:
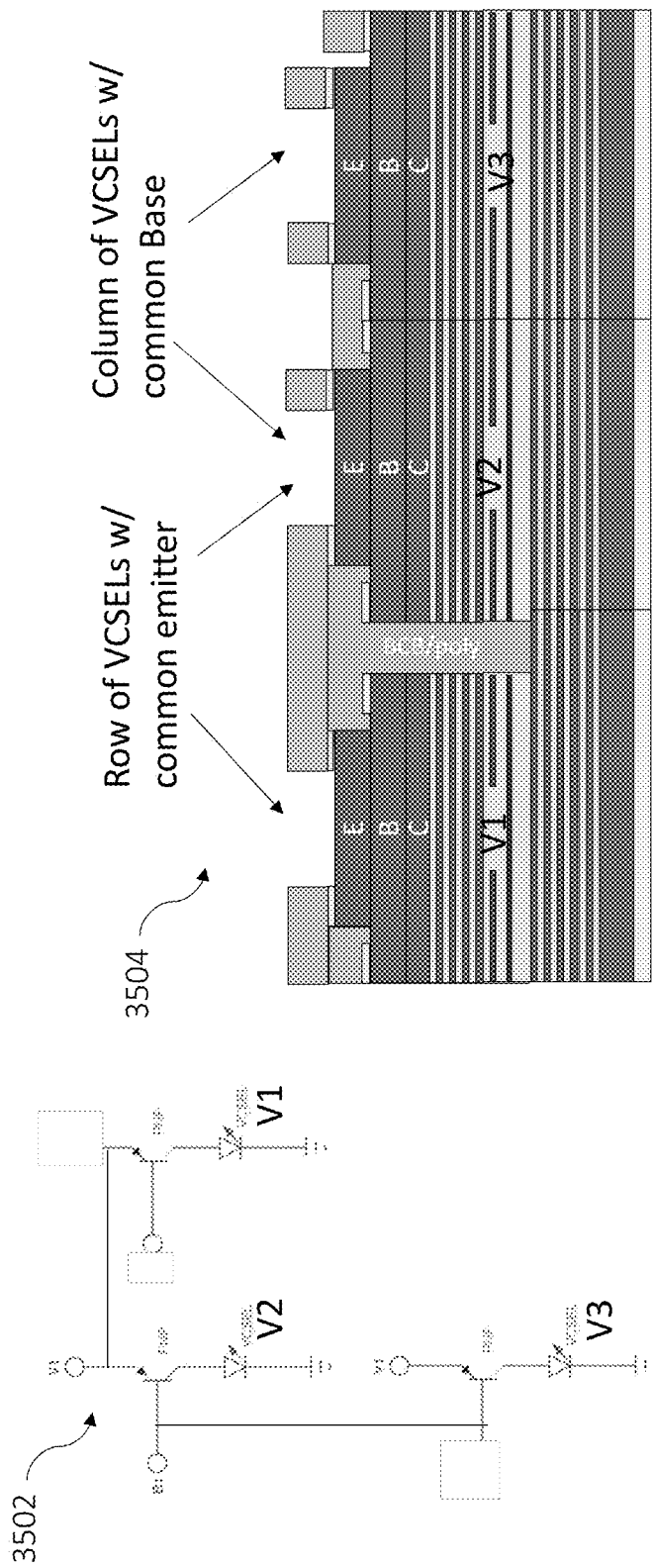
FIG. 35 illustrates a circuit diagram and a profile view of a VCSEL array with integrated HBTs in accordance with various implementations.

FIG. 35 illustrates a circuit diagram 3502 and a profile view 3504 of a VCSEL array with integrated HBTs in accordance with various implementations. FIG. 35 provides more detail on how the connections are made for a 2D matrix implementation. Three VCSELs are shown in FIG. 35 to illustrate how VCSELs in a common emitter row are connected (V1 and V2) and how VCSELs in a common base column are connected (V2 and V3), but in general any number of VCSELs may be connected in the same manner. Each VCSEL may have the same set of layers: bottom metal, substrate, bottom mirror, active quantum well region, oxidation layer for carrier confinement, top mirror, collector, base, emitter, and top metallization. The area labelled BCB/poly is an etched area created to allow the oxidation process of the carrier confinement layer to occur. It is then filled with a polymer material, such as benzocyclobutene (BCB) or polyimide to re-planarize the wafer. An etch down to the top of the base layer is made, and an ohmic contact deposited, and then metal ohmic contacts are made to the top surface emitter layers. An interconnect metal connecting all the base layers in a column may be deposited. This interconnect may be covered by an additional BCB layer or polyimide so that an interconnect metal may connect all of the emitter layers in the perpendicular direction.

FIG. 36 illustrates a mask layout for a VCSEL array with integrated HBTs in accordance with various implementations. The area labelled base mesa shows the border to where the etch is made down to the oxidation layer so that oxidation of the current confining layer may be done. The emitter mesa shows where an etch is done to reach the semiconductor base, and where the base metal may be deposited. Both mesas are covered by a polymer planarizing layer, so that the emitter interconnect metal may be deposited which crosses over the base metal contacts.

VCSELs with integrated HBTs may be used in a variety of ways. For example, as described above it may be used to create an array switch matrix to turn on a selected pattern of VCSELs. In another example, the HBT may be used as an integrated driver for enabling high speed switching. In another example, it may also be used as a distributed driver in an array. By locating the driver at each VCSEL, the entire array may be switched on at high speed.

Figure 37:
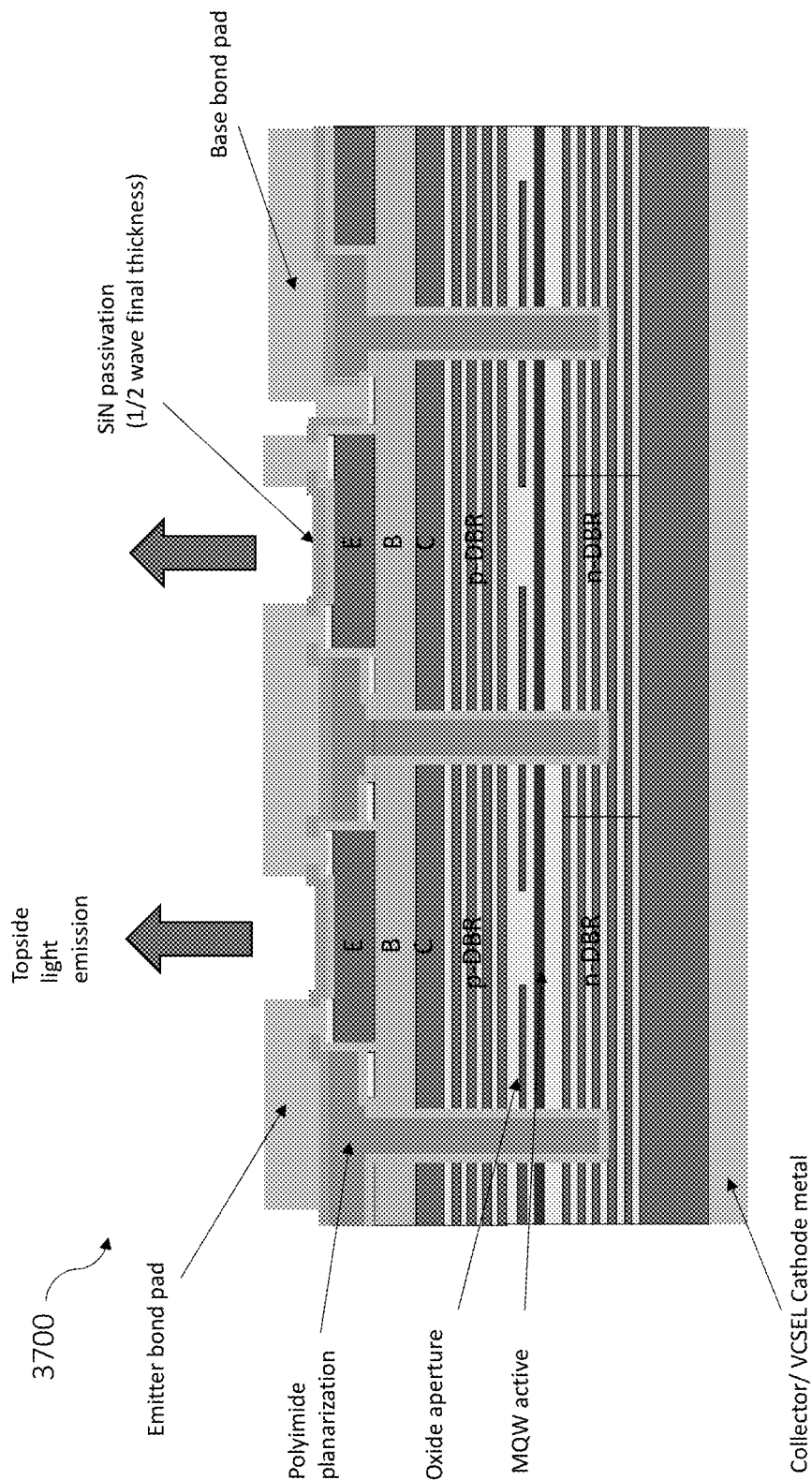
FIG. 37 illustrates an example fabrication of a VCSEL array with integrated HBTs in accordance with various implementations.

FIG. 37 illustrates an example VCSEL array 3700 with integrated HBTs in accordance with various implementations. An example fabrication process is described below for VCSEL array 3700, but fabrication of such an array is not limited to the parameters described below. Persons of ordinary skill in the art may understand that variations of the fabrication process may be contemplated herein.

In this example, the epitaxial structure for VCSEL array 3700 may be grown on an n-doped GaAs substrate for wavelengths in the range of 630 nm to 1060 nm. An n-doped DBR is grown next, followed by an n-i-p doped active region containing quantum wells for light emission, then followed by the p-doped mirror and then the layers that form the HBT. This includes first the p-doped collector, the n-doped base, and the p-doped emitter. In this wavelength range the DBR layers and the HBT layers may include a variety of compositions of $Al_xGa_{1-x}As$ or InAlGaP. For 630 nm to 700 nm emission, the quantum well and other active region layers may come from the InAlGaP materials system. For 700 nm to 860 nm, the active region layers may include AlGaAs materials, and from 870 nm to 1060 nm the quantum wells may include InGaAs with AlGaAs or GaAsP spacer layers. Wavelengths below 630 nm and beyond 1060 nm may also be achieved. For example, wavelengths below 630 nm could be achieved by growth of a structure in the InAlGaN materials system, while wavelengths longer than 1060 nm might use the InP/InGaAsP materials system.

An etching may be done to reach the base, leaving an emitter mesa. Then metal contacts may be deposited on both the base and the emitter layers. Another etch may be performed that extends beyond the oxidation layer and to, or beyond, the active layer region. After the oxidation layer has been exposed, a wet oxidation step may be used to partially oxidize this layer. However, it is timed to leave a region in the middle of the mesa un-oxidized so that current may flow through this region. After oxidation a deposition of a protective nitride layer is carried out that covers all the mesas and metals.

Next, a planarization layer may be deposited that includes a material like BCB or polyimide that fills the etched trenches, followed by a deposition of a second protective nitride. Next, the nitride materials may be etched in order to open the metal pads where contact should be made between the contact metals, and the subsequent interconnect metal layers. After that, interconnect metal that connects the rows and columns of VCSELs to bond pads at the edge of the chip may be deposited. The substrate may then be thinned to the desired chip thickness, followed by the deposition of a metal cathode contact on the back side of the wafer. At this point the wafer may be tested at the wafer level, and subsequently diced into individual VCSEL chips.

FIG. 37 shows a profile view of a final VCSEL array 3700 after completing the fabrication process described above. The VCSEL array 3700 includes two VCSELs sharing a common emitter contact. The arrows at the top of the drawing illustrate where the laser light is emitted from the top surface of the chip.

VCSELs with Integrated Photodetectors

As described previously, it is also important in an illumination module to be able to monitor, and potentially control the output power of the VCSELs. This may be done with a photodetector, and the integration of the detector in the same chip as the VCSEL chip may assist in additional miniaturization of a VCSEL based illumination module. The following describes approaches for this integration.

FIG. 38 illustrates a regular VCSEL array 3802 and a VCSEL array 3804 with an integrated photodetector in accordance with various implementations. VCSEL array 3802 is a typical VCSEL array die design or layout. The die is pictured from the top surface of the VCSEL die, which includes 812 VCSEL apertures, as represented by the small circles. A common metal layer connects all of the VCSEL apertures together, so that they are turned on and off together. The VCSEL light is emitted from the top surface.

FIGS. 5-8 illustrate how a VCSEL die such as VCSEL array 3802 may be combined in a package with a separate photodiode. In these packaged examples, the VCSEL die is either placed on top of, or next to a, photodetector die. FIGS. 5-8 show the side view, or cross section of a package. The purpose of the package is to facilitate the electrical and optical interfaces to the chip. The VCSELs are diodes and hence require a contact to the anode and a contact to the cathode to operate. Since the substrate of the VCSEL is usually conducting, this may be accomplished by attaching the VCSEL into the package using a conductive epoxy or solder between the VCSEL substrate and the package. The other contact may be formed by a wire bond to the metal bond pad areas on the top side of the chip.

However, an illumination subassembly may be further miniaturized by integrating the optical power monitor onto the same chip as a VCSEL array, as it puts the monitor closer physically. VCSEL array 3804 is an example of such a design. In this case, the VCSEL array 3804 is divided into two segments, 3806 and 3808. The larger segment (Segment 3806) is the VCSEL emitter array producing optical power. The VCSELs in this array have both a common cathode (back side of the chip) and a common anode (all the VCSELs share a common metal). These devices are forward biased in order to emit light. The smaller segment (Segment 3808) of VCSELs serve as a photodetector and share the cathode (back side of the chip) with the larger VCSEL array but has a separate anode contact. The smaller group of VCSELs share an anode with each other, but it is separate from the anode of the larger array. In order to serve as a monitor of optical power, this segment would be reverse-biased.

In the example VCSEL array 3804, the larger segment 3806 may include several hundred VCSELs (specifically, 427 as pictured in FIG. 38) while the smaller segment 3808 may include 7 VCSELs, but the numbers of VCSELs in each segment and their ratio may vary. The number of VCSELs in the smaller segment 3808 could be as many as 25% of the VCSELs on the chip, but could be as small as a single VCSEL. Smaller segments like this could be arranged in a number of ways, including in a 2D array, or in a 1D array.

Figure 39:
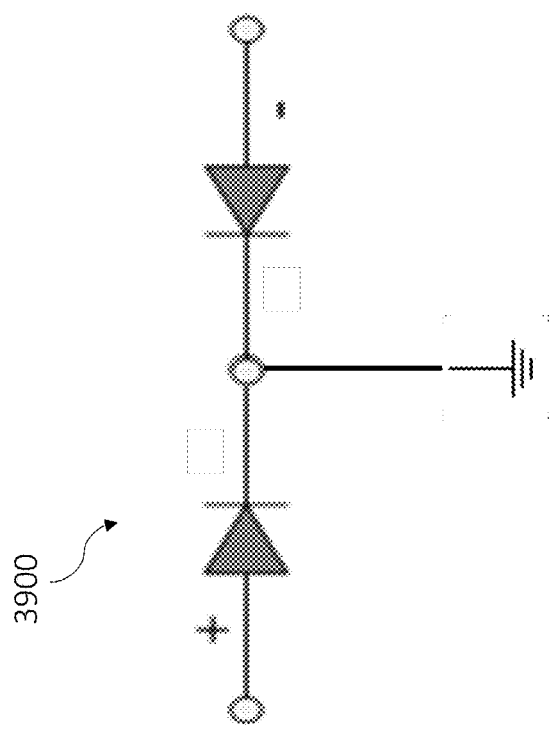
FIG. 39 illustrates a circuit diagram of a VCSEL array with integrated photodetector connected to power in accordance with various implementations.

FIG. 39 illustrates a circuit diagram 3900 of a VCSEL array with integrated photodetector connected to power in accordance with various implementations. Circuit diagram 3900 shows a shared cathode connection to the two segments of an VCSEL array (e.g., segments 3806, 3808). The larger segment is forward biased to emit light, and the smaller segment is reversed bias to detect an optical signal.

Figure 40:
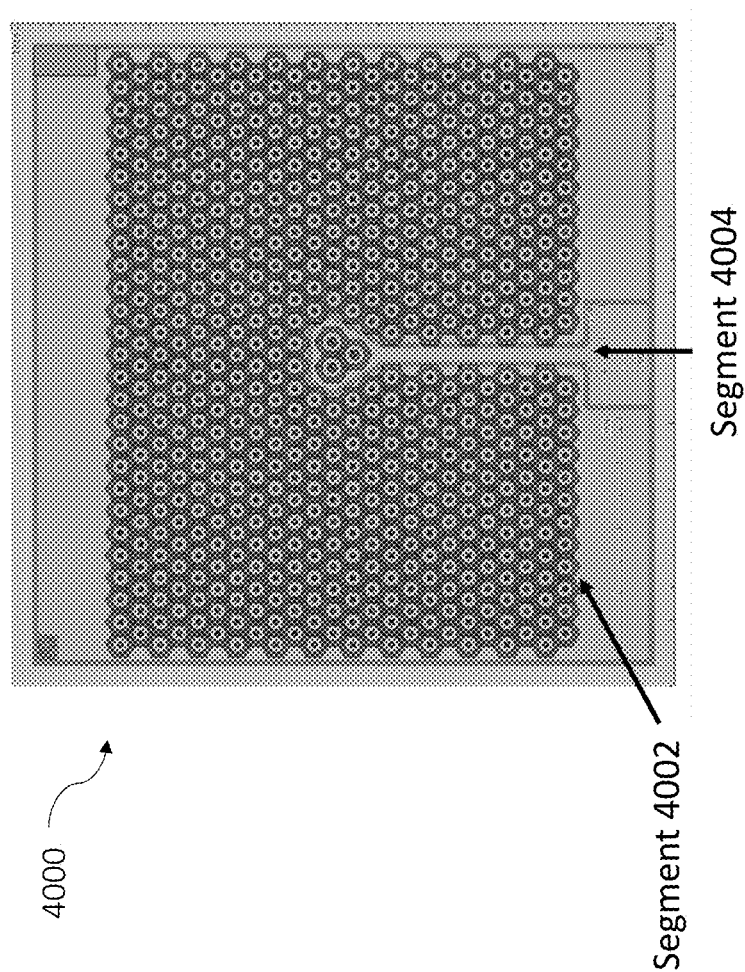
FIG. 40 illustrates another VCSEL array with an integrated photodetector in accordance with various implementations.

FIG. 40 illustrates another VCSEL array 4000 with an integrated photodetector in accordance with various implementations. In this layout, smaller segment 4004 is located in the middle of the array, surrounded by larger segment 4002. This allows smaller segment 4004 to more evenly sample the light emitted from the chip. In alternate implementations, there could be multiple small VCSEL segments/photodetectors distributed around the die (e.g., one segment in each corner).

One limitation of using a small standard VCSEL array as a monitor of the optical power is that the small apertures limit the area that accepts light, limiting the overall responsivity of the monitor photodiode. A solution to this limitation is illustrated in FIG. 41, which shows another VCSEL array with an integrated photodetector in accordance with various implementations. In this example, the smaller segment 4102 serving as the photodetectors may include one large aperture rather than several small apertures as shown in FIGS. 38 and 40. This aperture may be any shape, for example round or rectangular. Segment 4102 may also be placed anywhere on the chip as described with respect to FIG. 40, including the middle, or multiple such areas could be used to better sample the total power of the chip. A metal contact surrounds the aperture area to connect to the anode side of the device, but the total detecting area may be an order of magnitude larger as compared to using standard individual VCSELs, significantly increasing the magnitude of the signal detected.

Figure 42:
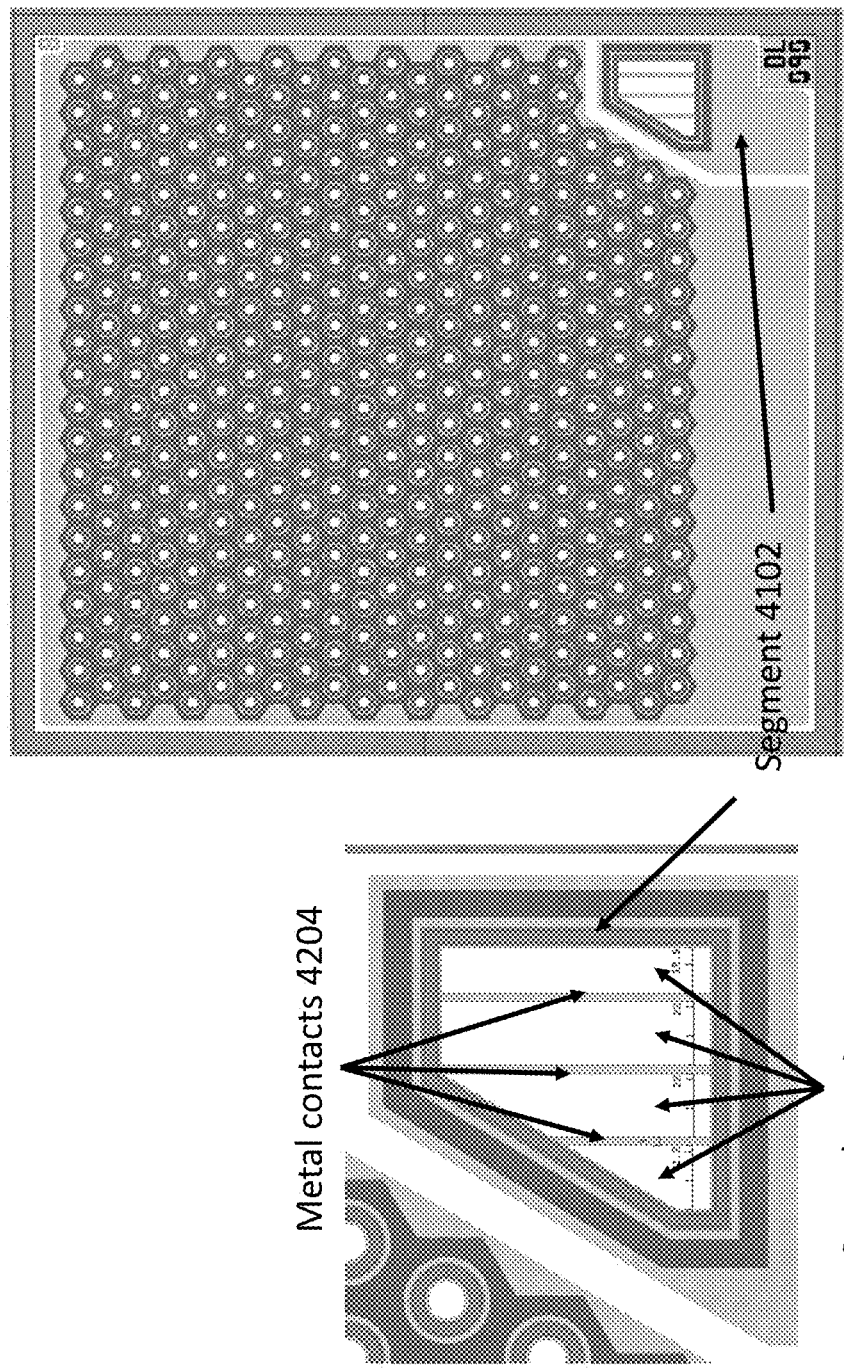
FIG. 42 illustrates another VCSEL array with an integrated photodetector in accordance with various implementations.
Figure 43:
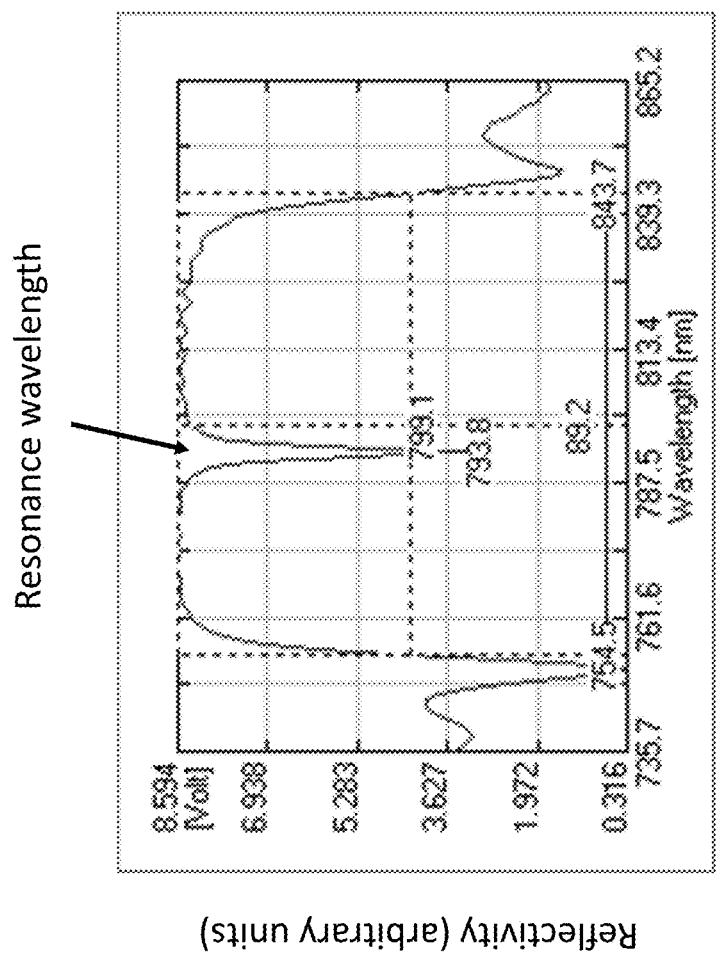
FIG. 43 is a graph showing the reflection spectrum of the semiconductor layers which form the basis of a VCSEL in accordance with various implementations.

However, this approach in turn, creates a limitation that may be minimized by altering the design. As the aperture size of the monitor diode becomes larger, the carrier transit time increases. If the average power is being measured, this is less important, but if the rise time of a pulse, or a train of pulses, is being measured the large area may slow the response, making this more difficult. FIG. 42 illustrates another VCSEL array with an integrated photodetector in accordance with various implementations. The smaller segment 4202 in the VCSEL array may be divided into smaller areas with narrow metal contacts 4204 between the smaller areas. The example shown in FIG. 43 shows long narrow open areas, with a narrow metal contact in between, but other shapes of the metal contacts and open areas, and their arrangements, may also be contemplated. By limiting the shortest path to a metal contact, the response time of the monitor may be increased.

Another issue to be addressed is the wavelength sensitivity of the monitor photodiode area, if it is based simply on the standard VCSEL epitaxial layers, except with reversed bias. FIG. 43 is a graph showing the reflection spectrum of the semiconductor layers which form the basis of a VCSEL in accordance with various implementations. The two mirrors with a cavity between form a Fabry-Perot structure, which is highly reflective, except at the resonance wavelength. In the plot of the reflectivity spectrum versus wavelength shown in FIG. 43, taken from an 795 nm VCSEL wafer, the reflectivity is high (close to 100%) between 754 and 844 nm. There is a dip in the reflectivity at approximately 794 nm, which is the resonance wavelength of the cavity. This is the wavelength at which light may be transferred out of and into the cavity. Therefore, this is nominally the wavelength at which the VCSEL array will lase, but it is also the wavelength at which the diode, when reverse biased, will most efficiently detect light. As the incident light deviates from this wavelength, the responsivity of the detector drops off dramatically because most of the light will be reflected and will not enter the cavity to be detected. If light from the VCSELs on the same chip is being monitored, one might suggest this is not a problem, as the wavelengths should be matched. However, as a VCSEL is driven with increasing amounts of current, more energy is converted to heat, and the junction temperature of the VCSEL rises. In turn, the resonance wavelength will shift slightly to longer wavelengths. On the other hand, much less heat is dissipated in the photodiode monitor, so the wavelength of peak responsivity of the reversed bias segment shifts much less. In this manner the resonance wavelength of the forward biased VCSEL and reverse biased photodiode monitor may become misaligned. There are ways to address this effect. One approach is to add a dielectric, or other optically transparent layer to the surface with a thickness that reduces the reflectivity of the cavity and broadens the resonance. If a dielectric is added to the VCSEL, the desired wavelength is $\lambda/2$. With this thickness, the dielectric is transparent, and does not affect the cavity finesse or wavelength. However, if the dielectric over the photodiode is changed to $\lambda/4$, this will reduce the reflectivity and broaden the resonance spectral width. This is relatively easy to achieve, by using a mask in which material is selectively removed from the surface of the photodiode.

Figure 44:
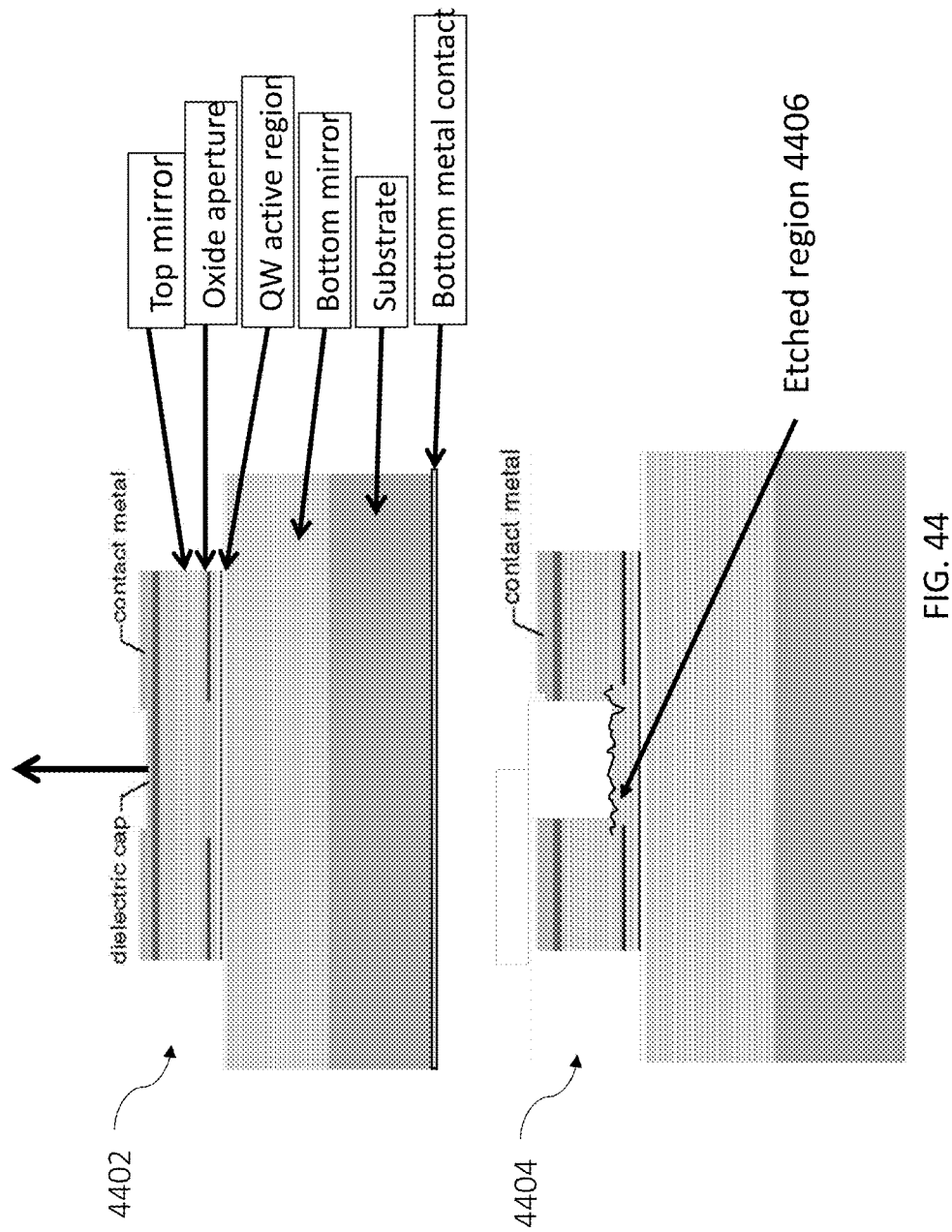
FIG. 44 illustrates a standard VCSEL and a VCSEL and integrated photodetector with reduced wavelength sensitivity in accordance with various implementations.

A second approach for reducing the wavelength sensitivity and improving the responsivity is illustrated in FIG. 44, which illustrates a standard VCSEL 4402 and a VCSEL 4404 and integrated photodetector with reduced wavelength sensitivity in accordance with various implementations. VCSEL 4402 includes a bottom dielectric mirror, a top dielectric mirror, and a quantum well active region which together form the Fabry-Perot cavity. Metal contacts are made to the top and bottom, and a partially oxidized layer provides the current confinement through the structure. A dielectric layer which is an integer number of half wavelength thicknesses may be deposited on the top surface. VCSEL 4404 is a modification of VCSEL 4402 in order to create a monitor diode with less wavelength sensitivity. By etching down partially through the top mirror, a etched region 4406 is created that reduces the mirror reflectivity and broadens the transmission linewidth in the structure. The surface of the etched region 4406 may be somewhat rough, further reducing the reflectivity, while also allowing beams that deviate from normal incidence to more easily enter the cavity and be detected. This is also achieved by masking the VCSEL areas to protect them from this etch, and only etching the areas that form the photodiode monitor.

Figure 45:
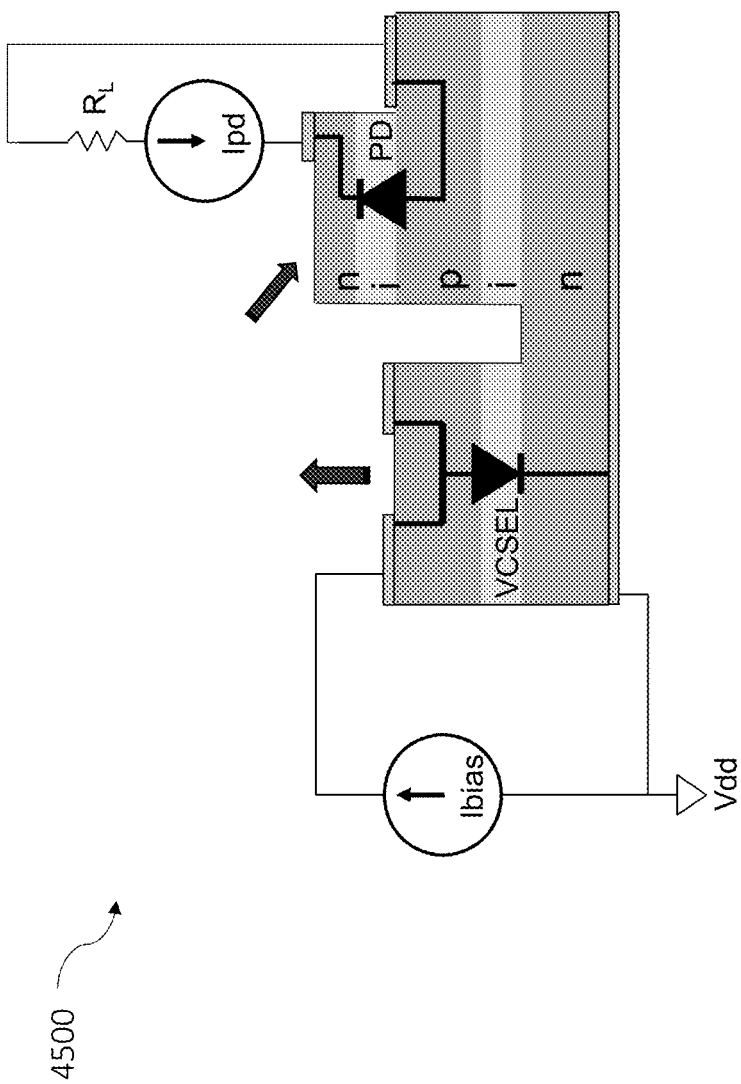
FIG. 45 illustrates another VCSEL and integrated photodetector with reduced wavelength sensitivity in accordance with various implementations.

FIG. 45 illustrates another VCSEL 4500 and integrated photodetector with reduced wavelength sensitivity in accordance with various implementations. In this case, additional layers are grown on top of the VCSEL epitaxial structure, including an updoped (i) layer, and an n-doped (n) layer. This forms a p-i-n junction for the photodiode that shares a p-contact with the top of the VCSEL. The structure also requires the addition of a third metal contacting the top n-doped layer in the epitaxial structure. As before, the VCSEL array is forward biased, and the photodiode monitor is reverse biased. In this approach, the detecting layer is outside of the VCSEL cavity and therefore has reduced wavelength sensitivity. In addition, the thicknesses of the i- and n-layers may be adjusted to optimize the responsivity. However, this approach requires additional epitaxial growth and processing. The entire structure may be grown together, and then the additional "i-" and "n-" layers are etched away from the areas where the VCSELs are processed. It is also possible to grow only the standard VCSEL structure, and then protect the VCSEL areas with a dielectric while growing the additional "i" and "n" layers separately, and removing any material deposited on the surface of the dielectric with a selective etch. Either fabrication approach uses additional photolithography steps to achieve the final structure.

One additional issue that arises from integrating a VCSEL array and a photodiode on the same chip is optical cross-talk. While the lasing light is emitted vertically from each VCSEL aperture, there is additional spontaneous emission that occurs at the p-n junction. This emission is not directional, and so it may travel through the epitaxial layers to neighboring devices. Therefore, the monitor diode may detect light from neighboring VCSELs, in addition to light that is emitted from the VCSELs and reflected or scattered from an external surface. Since the spontaneous emission does not track well with the lasing light emitted from the VCSEL, the cross-talk may give rise to inaccurate results, if the goal is to track emitted laser light.

Figure 46:
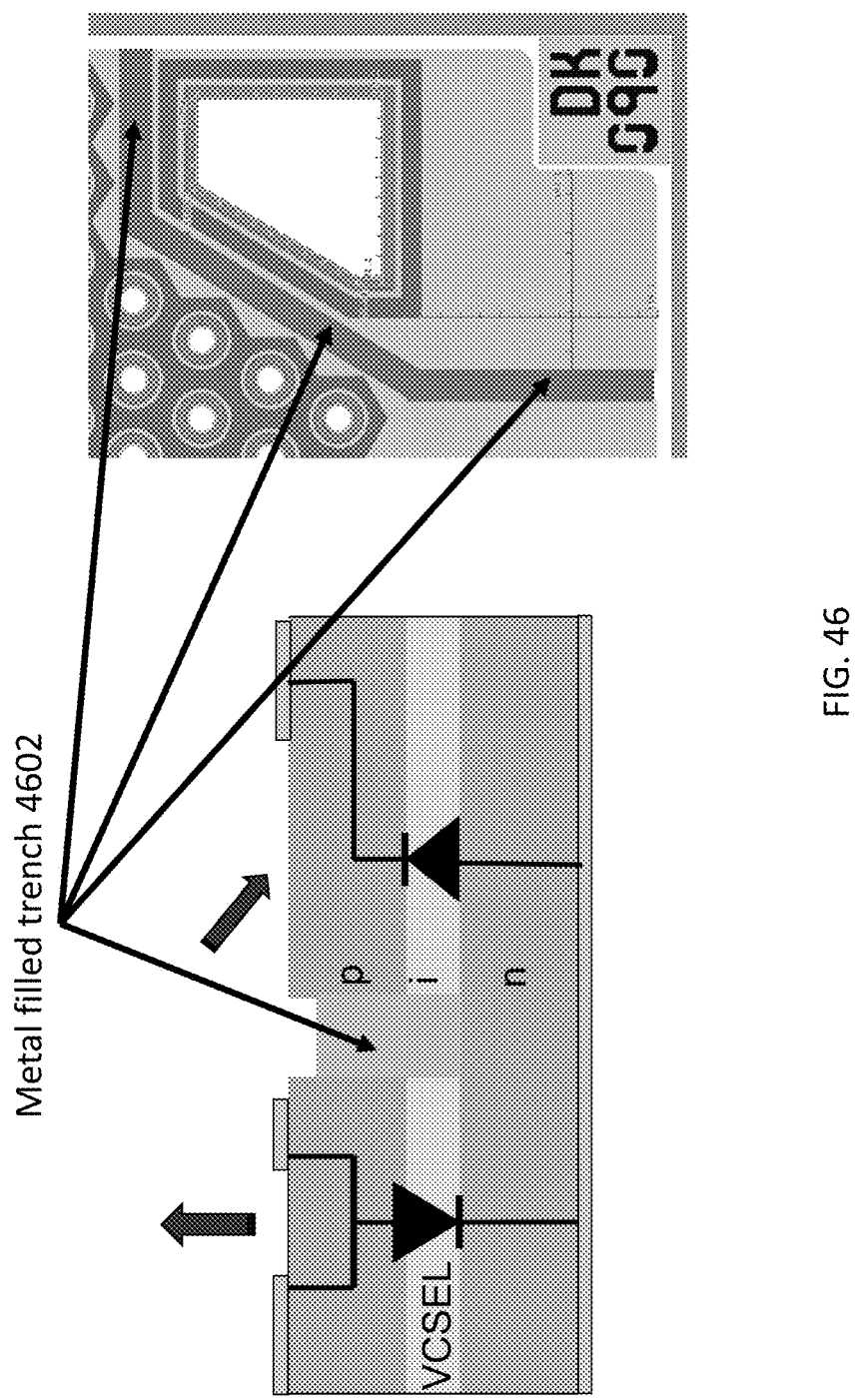
FIG. 46 illustrates another VCSEL and integrated photodetector with a trench in accordance with various implementations.

A solution to this issue is to optically isolate the monitor photodiode from lateral light transmission. This is illustrated in FIG. 46, which shows a VCSEL and integrated photodetector with a metal-filled trench 4602 in accordance with various embodiments. The cross-sectional view on the left of FIG. 46 shows the location of the trench 4602, within the epitaxial structure of the VCSEL. In order to provide optical isolation, trench 4602 is etched between the two types of devices. This trench is filled with an optically absorbing material, such as a metal. Metal will typically be highly absorbing and will hence prevent spontaneous emission from the VCSEL from reaching the photodiode. The top view of the VCSEL chip in the right of FIG. 46 shows both an area with an array of VCSELs, as well as the photodiode area. The figure shows a border area between the two which is filled with metal. The trench could be filled with other materials that are absorbing.

The incorporation of a monitor photodiode onto the same chip as a VCSEL or VCSEL array may simplify the monitoring of the output power of a VCSEL array. This facilitates the control of the output power to maintain a desired signal to noise ratio, to maintain the output power within eye safe levels, or to monitor the rise and fall time of a VCSEL pulse. Multiple approaches have been presented for integrating the monitor diode into the chip, and for the photodiode design and trade-offs between performance and fabrication simplicity.

VCSELs with Integrated Optics

Another design approach for miniaturizing the size of the illumination module is to integrate the optics (such as lenses, diffractive optical elements, diffusers) directly on the chip. This could be done on the top side of the chip, but it is often preferable to add the optics to the back side of the chip, in conjunction with a back-side emitting design.

Figure 47:
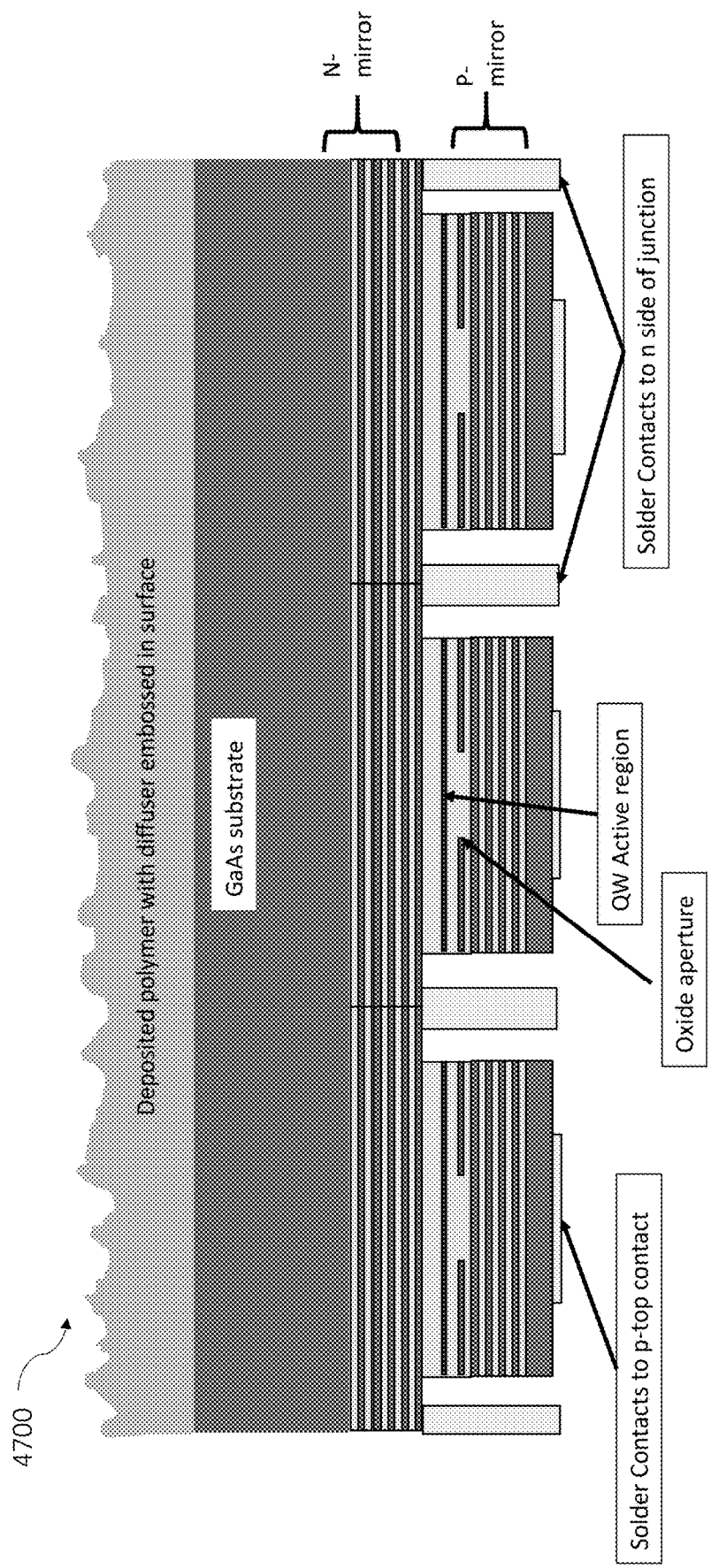
FIG. 47 illustrates a VCSEL die with integrated optics in accordance with various implementations.

FIG. 47 illustrates a VCSEL die 4700 with integrated optics in accordance with various implementations. VCSEL die 4700 incorporates the functionality of VCSEL illumination, beam shaping optics, and driving the VCSEL for fast pulse rise times, while reducing size and cost. The VCSEL die 4700 includes a VCSEL array that has been designed to allow flip chip bonding of the VCSEL to a substrate, with emission from the substrate side of the chip. In this case the GaAs substrate remains so this approach will work for devices with emission wavelengths greater than 870 nm, but preferably greater than 920 nm. For shorter wavelengths, the GaAs substrate may be lessened or removed. However, the die 4700 would suit mobile device or LiDAR applications, which frequently specify wavelengths in the 940 nm range. The die 4700 is shown top side facing down, as it would be attached to a sub-mount or package. Electrical contacts are made to the top surface of the chip, which is typically doped p-type, while a second connection is made by etching through the top mirror structure to the bottom n-mirror, or to an n-doped buffer layer under the n-mirror, or even to the GaAs substrate. The metal contact to this layer is brought to the surface by a metal trace along the side walls to the top surface, or by plating the metal contact, or using a stud bumping process, as shown in FIG. 47.

The GaAs substrate shown may be several hundred microns thick. The back side of the wafer on which the die 4700 is built may be polished, and/or an anti-reflective coating may be deposited on the back side of the wafer. To form the optics, a curable polymer material may be deposited on the back side of the wafer. This deposition may be carried out by lamination, spin coating, spray coating, or various other deposition techniques. A tool which has been machined with a reverse image of an engineered diffuser pattern may be used to emboss this pattern into the polymer. This is followed by curing the polymer. The polymer may be a material that stands up to subsequent chip assembly procedures, such as solder reflow.

Figure 48:
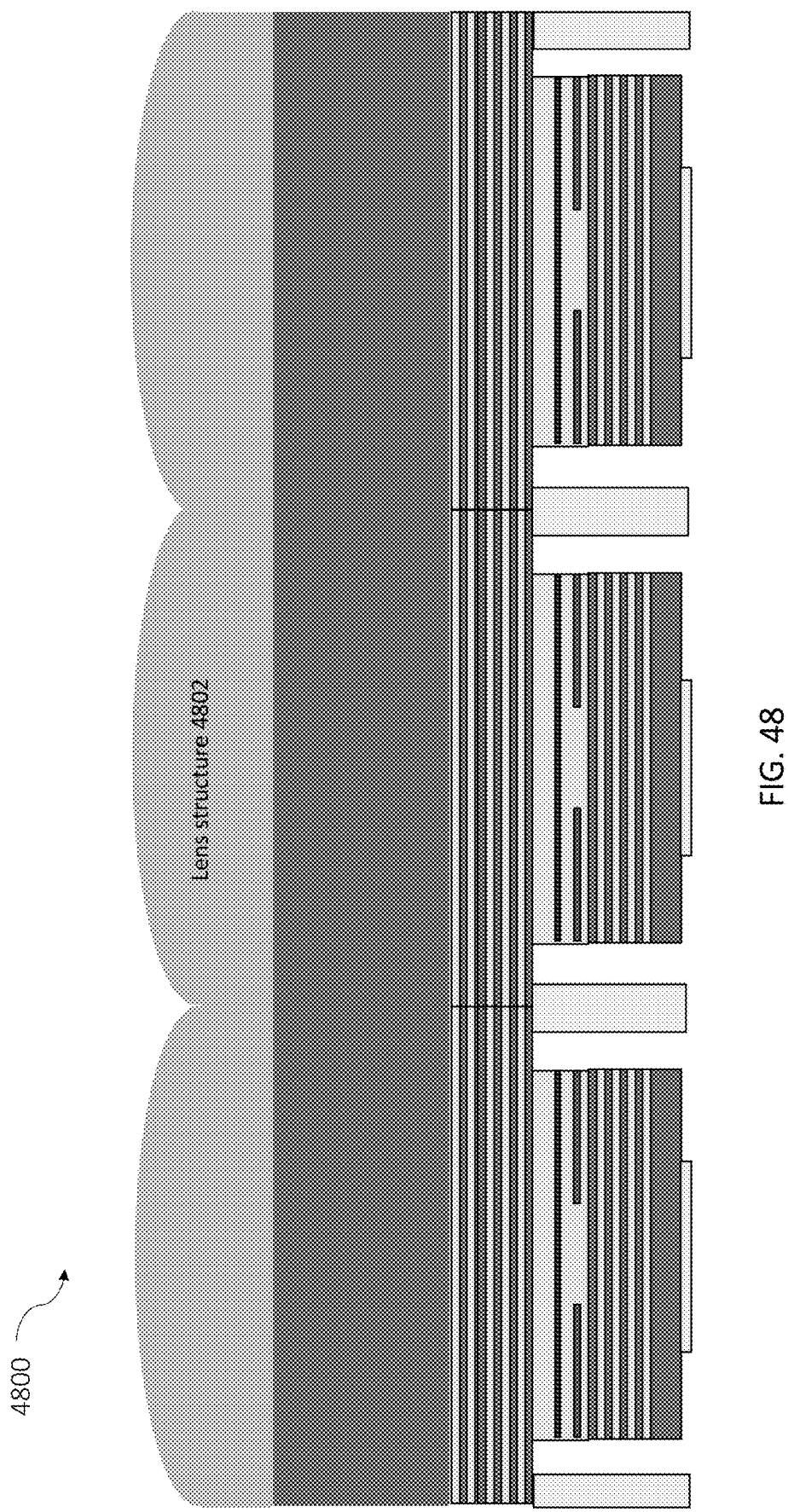
FIG. 48 illustrates another VCSEL die with integrated optics in accordance with various implementations.

FIG. 48 illustrates another VCSEL die 4800 with integrated optics in accordance with various implementations. VCSEL die 4800 is shown top side down, with the same chip design and the same deposition of a curable epoxy on the back surface as VCSEL die 4700 in FIG. 47. However, in this case a lens structure 4802 is embossed on the back side. FIG. 48 shows a one-to-one correspondence between VCSELs and lenses, and this design could be used to collimate, focus, or control the divergence of the VCSEL. However, there are other alternatives as well. For example, the lens structure could be randomized with respect to the VCSEL structure, there could be a many-to-one or one-to-many relationship between the lenses and the VCSELs, or the lenses could be offset relative to the VCSEL in order to beam steer each VCSEL in a different direction. A diffractive grating or gratings could also be patterned on the back side of the wafer.

Figure 49:
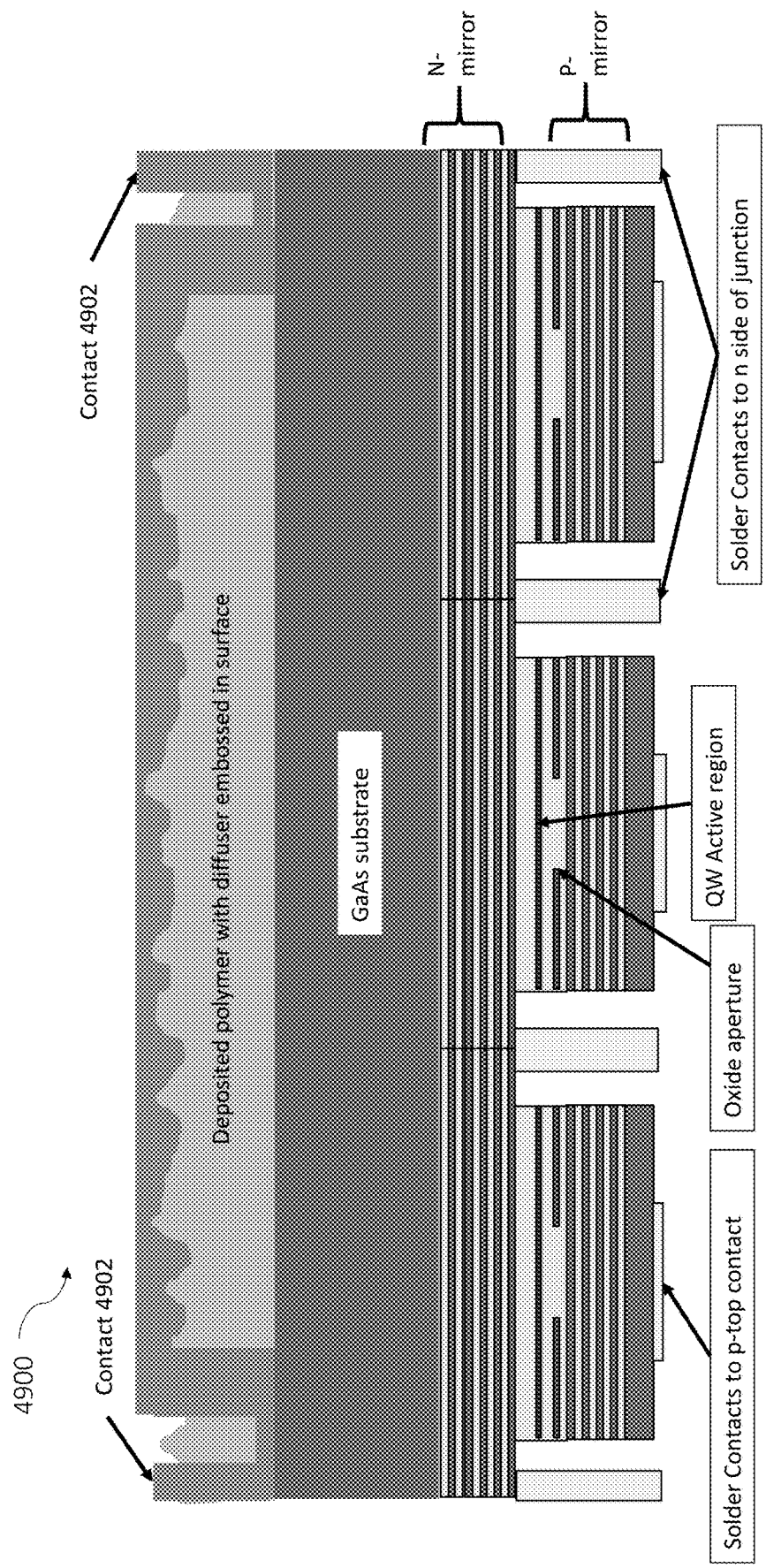
FIG. 49 illustrates another VCSEL die with integrated optics in accordance with various implementations.

FIG. 49 illustrates another VCSEL die 4900 with integrated optics in accordance with various implementations. VCSEL die 4900 is shown top side down, with the same chip design and the same deposition of a curable epoxy on the back surface as VCSEL die 4700 in FIG. 47. Vias may be etched in the polymer material that allow metal contact to the substrate. Metal traces may be patterned on the substrate and/or on the top of the polymer material. The metal would include thin contact strips 4902 so that the majority of the polymer material is uncovered by metal. The contacts 4902 may be used to detect any possible delamination of the polymer or formation of a crack in the polymer from the backside of the chip, thus detecting any possible situation that might create an eye safety risk. This approach works best if the GaAs substrate is undoped.

Figure 50:
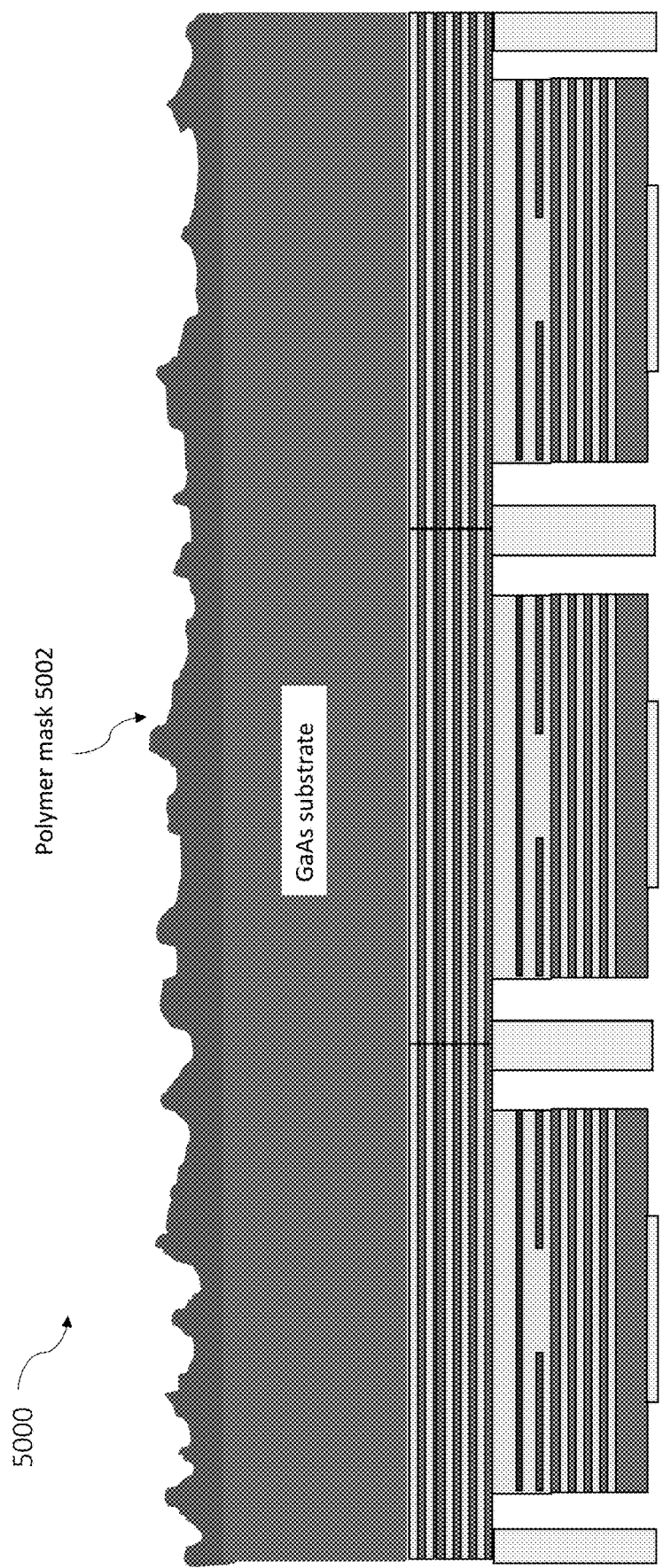
FIG. 50 illustrates another VCSEL die with integrated optics in accordance with various implementations.

FIG. 50 illustrates another VCSEL die 5000 with integrated optics in accordance with various implementations. VCSEL die 5000 is shown top side down, with the same chip design. A curable epoxy on the back surface as VCSEL die 4700 in FIG. 47, and a pattern etched or embossed into a polymer as illustrated in FIGS. 48-49, but this polymer is now used as a mask 5002 for transferring the pattern directly into the GaAs substrate. For example, dry etching may be used to achieve this. This approach has the advantage that the pattern now cannot be removed from the substrate.

Figure 51:
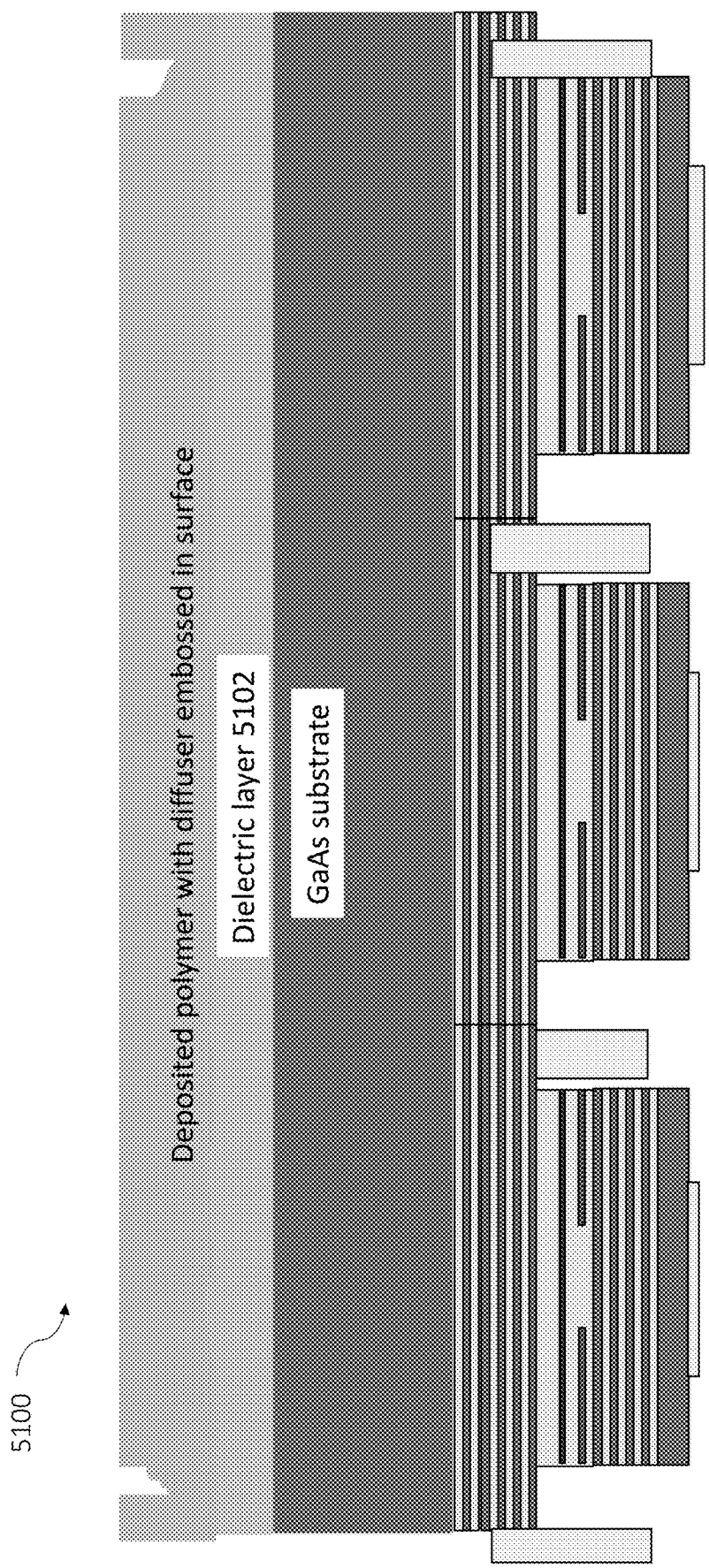
FIG. 51 illustrates another VCSEL die with integrated optics in accordance with various implementations.

FIG. 51 illustrates another VCSEL die 5100 with integrated optics in accordance with various implementations. VCSEL die 5100 is shown top side down, with the same chip design and the same deposition of a curable epoxy on the back surface as VCSEL die 4700 in FIG. 47. In this structure, a dielectric layer 5102 has also been deposited, or bonded to the back side of the wafer, followed by the deposition and embossing or patterning of the polymer. This may be done for several reasons: to provide protection to the die, to provide some structural support if the GaAs substrate is very thin, or removed entirely, and also to provide insulation from a conducting substrate for a circuit to detect if the diffuser layer has delaminated from the chip. FIG. 51 also illustrates a similar approach to adding a continuity layer with metal contacts for detecting if the optical layer has delaminated from the dielectric layer, as previously described with respect to FIG. 49.

Figure 52:
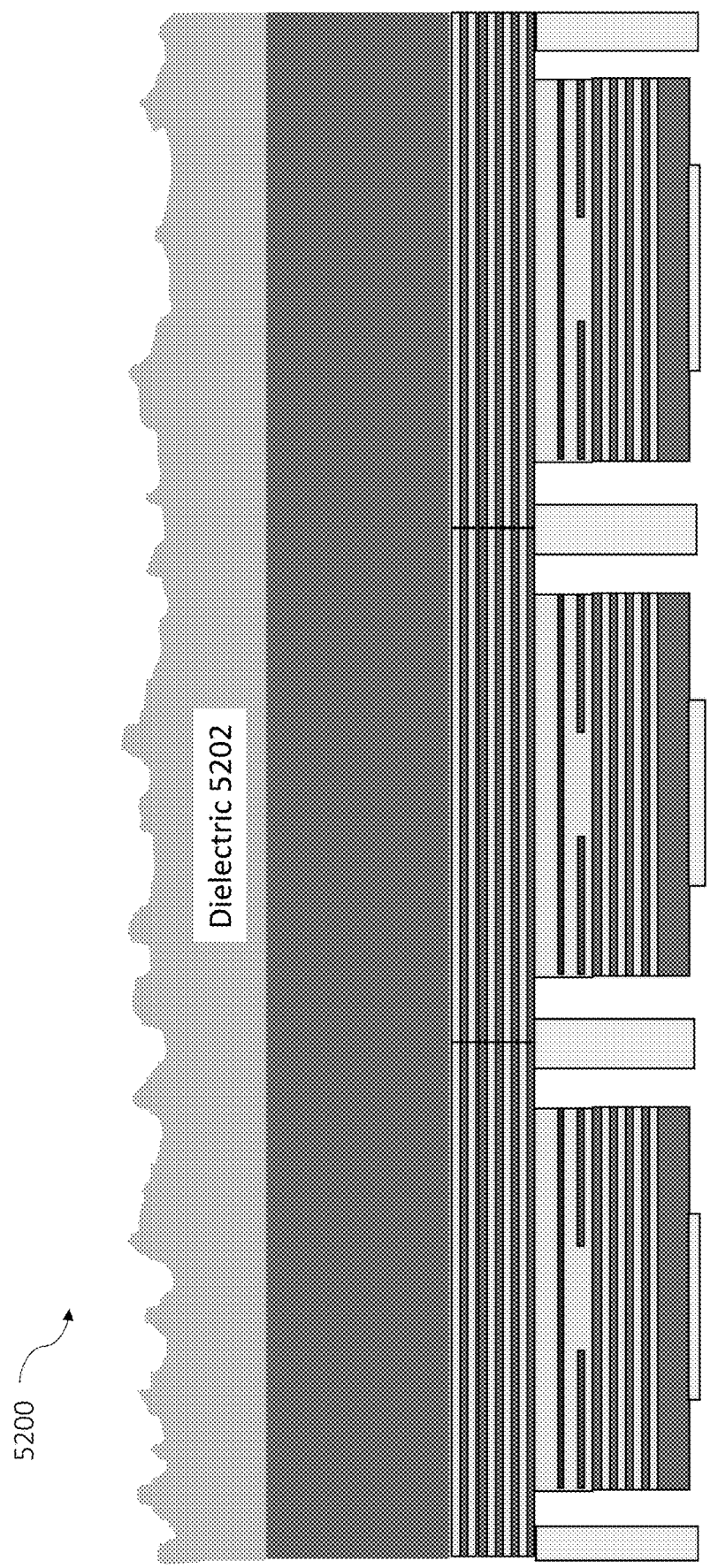
FIG. 52 illustrates another VCSEL die with integrated optics in accordance with various implementations.

FIG. 52 illustrates another VCSEL die 5200 with integrated optics in accordance with various implementations. VCSEL die 5200 is shown top side down, with the same chip design. Once again, the same deposition of a curable epoxy on the back surface as VCSEL die 4700 in FIG. 47 may be implemented to serve as a transfer layer. VCSEL die 5200 may also include a dielectric layer 5202 that is placed on top of the GaAs substrate (or instead of the GaAs substrate) where the pattern etched or embossed in the polymer has been transferred by etching into the dielectric.

Figure 53:
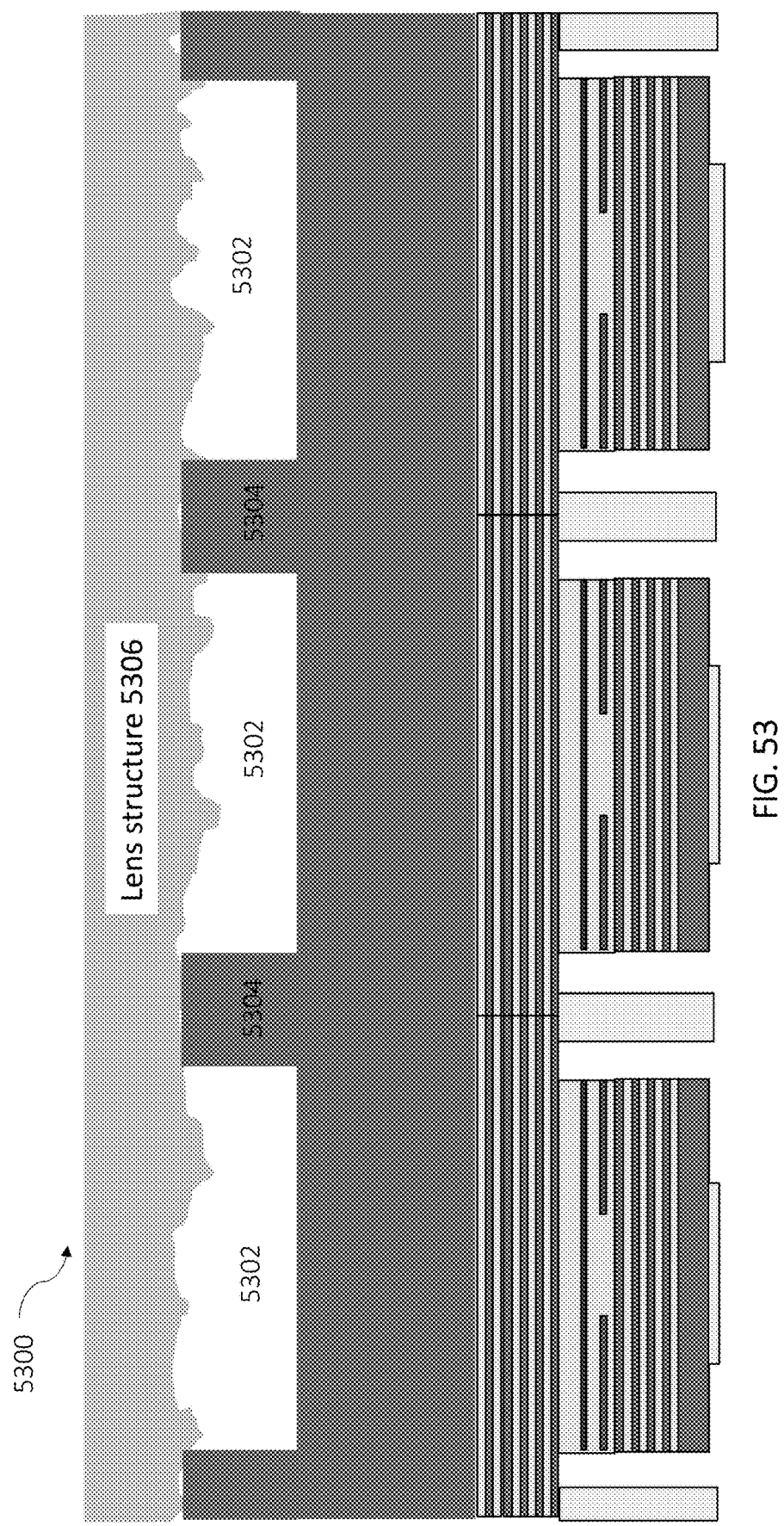
FIG. 53 illustrates another VCSEL die with integrated optics in accordance with various implementations.

FIG. 53 illustrates another VCSEL die 5300 with integrated optics in accordance with various implementations. VCSEL die 5300 is shown top side down, with the same chip design as VCSEL die 4700 in FIG. 47. In this case, pockets 5302 have been etched into the GaAs substrate, with unetched pillars 5304 between the pockets 5302. There could be one pocket per VCSEL, or one pocket for an entire array of VCSELs, or a subset of an array. In this case a diffuser or lens structure 5306 has been created on another transparent substrate which may be glass or other transparent dielectric, polymer, or a polymer layer on glass. This layer may be created by etching, embossing or any other technique. In this case the structure 5306 is mounted with the optically patterned side down, facing the GaAs wafer. This substrate may be attached at the wafer scale by wafer to wafer bonding using the Van der Waals force, by using an adhesive material. While FIG. 53 shows the lens structure 5306 as a diffuser pattern distributed over the whole wafer uniformly, the strength of the attachment may be enhanced by patterning the optics wafer to have un-patterned areas which attach to the unetched pillars of the GaAs substrate.

Figure 54:
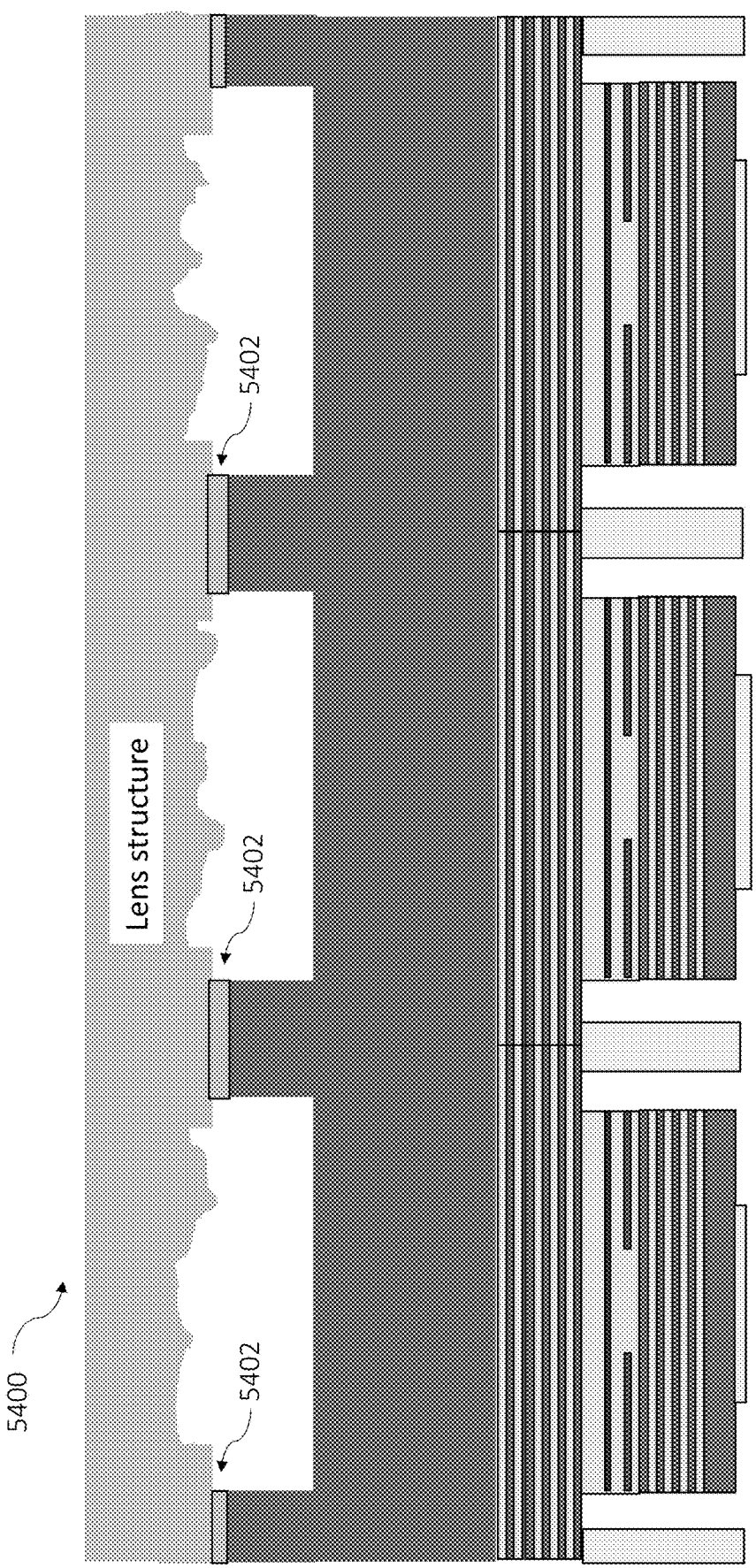
FIG. 54 illustrates another VCSEL die with integrated optics in accordance with various implementations.

FIG. 54 illustrates another VCSEL die 5400 with integrated optics in accordance with various implementations. VCSEL die 5400 is shown top side down, having a similar design to VCSEL die 5300 in FIG. 53. In this case, the lens structure may also be attached using patterned conductive epoxy, a solder layer, or a metal sintered film attachment 5402. The attachment 5402 may be achieved with the metal contact patterned on both the GaAs and transparent optical wafer, or one or the other, with a solder or epoxy material that adheres to the other side. This same approach may be applied to the fabrication of a lens array aligned to the VCSEL structures as described with reference to FIG. 48.

Figure 55:
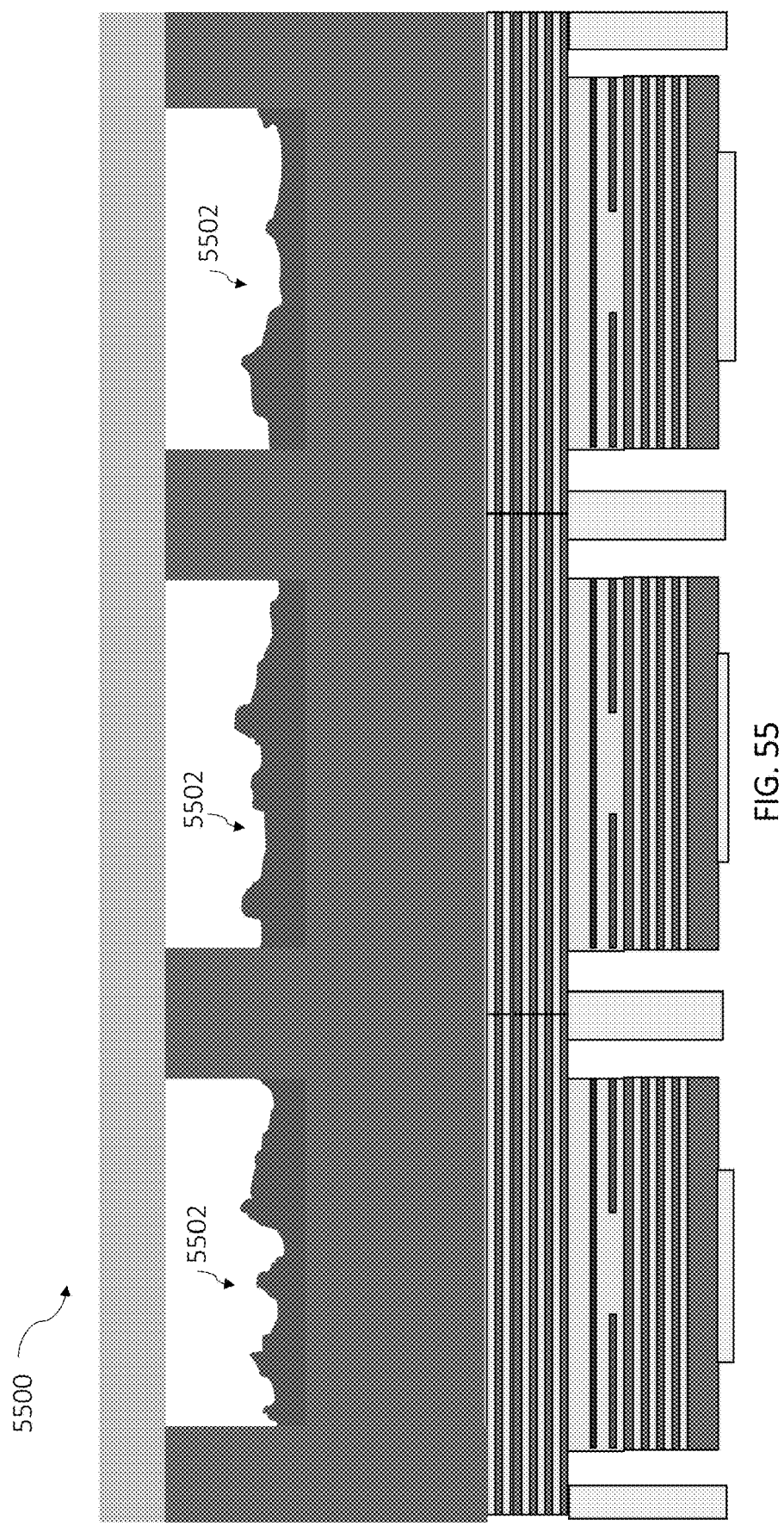
FIG. 55 illustrates another VCSEL die with integrated optics in accordance with various implementations.

FIG. 55 illustrates another VCSEL die 5500 with integrated optics in accordance with various implementations. VCSEL die 5500 is shown top side down, having a similar design to VCSEL die 5300 in FIG. 53. In this version, pockets are etched into the GaAs substrate first. Then diffuser patterns 5502 may be etched into the bottom of each pocket using a variety of methods including the ones already discussed. For example, a polymer or photoresist may be deposited with the pattern etched or embossed into the polymer, or using a gray scale mask to transfer the pattern into a photoresist. Dry etching may then be used to transfer the pattern to the GaAs. Photoresist masking may be used to protect the pillars. This approach allows the diffuser, lens, or grating patterns to be protected during subsequent handling of the wafer. An un-patterned, flat, transparent glass or polymer wafer may be attached to the back side of the wafer in order to provide additional protection to the optics, and also to provide additional structure stability for handling of the wafer during test.

Figure 56:
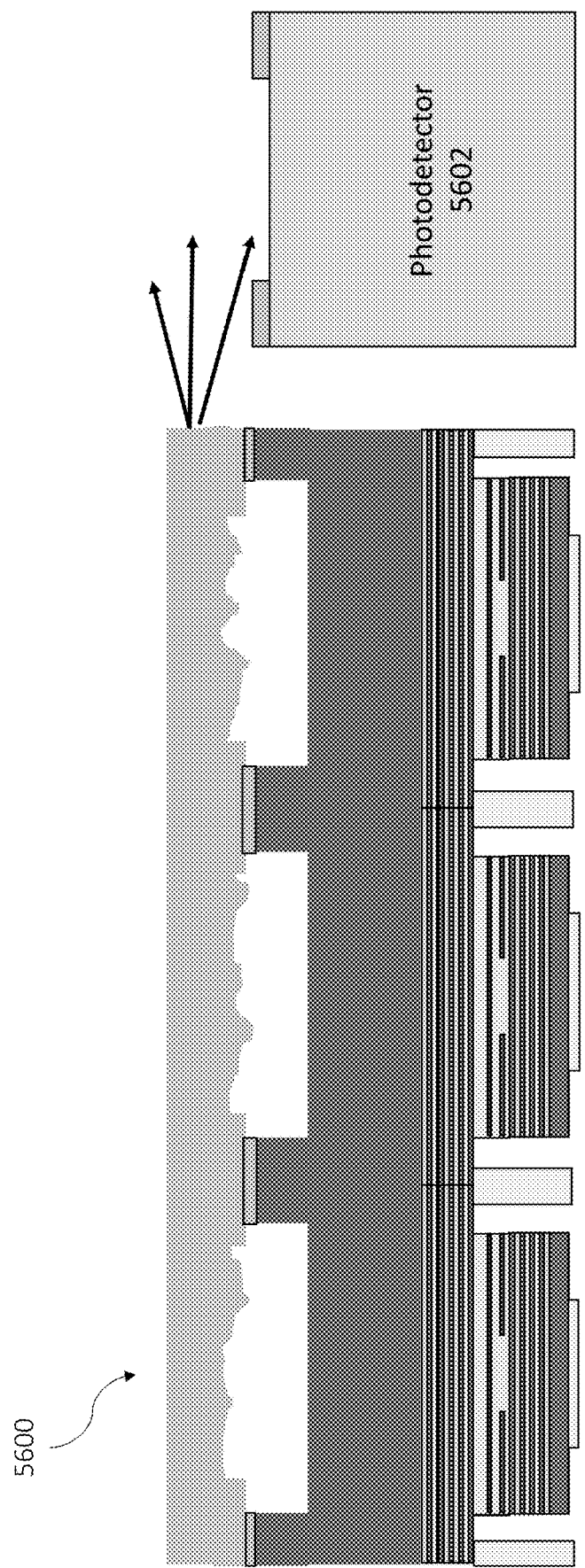
FIG. 56 illustrates a VCSEL die with integrated optics combined with a photodetector in accordance with various implementations.

Another consideration is how a VCSEL chip structure with integrated optics may be combined with a monitor photodiode and/or a driver circuit. FIG. 56 illustrates a VCSEL die 5600 with integrated optics combined with a photodetector 5602 in accordance with various implementations. VCSEL die 5600 is shown top side down, having a similar design to VCSEL die 5400 in FIG. 54. The VCSEL die 5600 may be attached to a circuit board or sub-mount with the solder or bump bonds that were fabricated on the die, and the photodetector 5602 (e.g., photodiode) is placed on the same circuit board or sub-mount right next to the VCSEL die. The sub-mount may be composed of a ceramic, lead frame, semiconductor, or circuit board material. Some percentage of light may be transferred through the optical layer acting as a waveguide and is later scattered back out of the diffuser. The neighboring photodetector 5602 captures this scattered light, and the detected signal would track the magnitude of the light emitted from the VCSEL die 5600.

Figure 57:
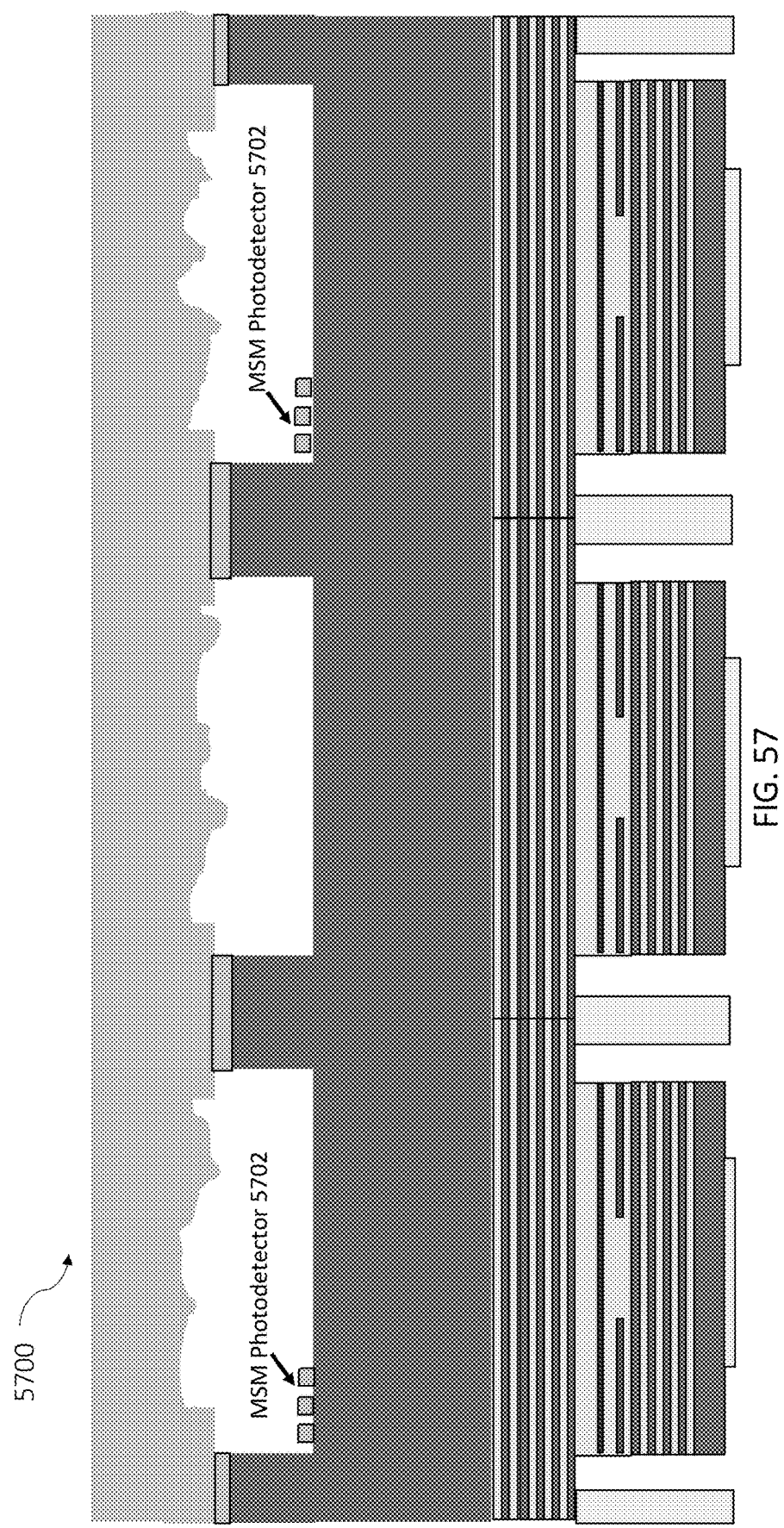
FIG. 57 illustrates another VCSEL die with integrated optics combined with a photodetector in accordance with various implementations.

FIG. 57 illustrates another VCSEL die 5700 with integrated optics combined with a photodetector in accordance with various implementations. VCSEL die 5700 is shown top side down, having a similar design to VCSEL die 5400 in FIG. 54. In this case, metal-semiconductor-metal (MSM) photodiodes 5702 are created on the back side of the GaAs wafer in one or more pockets by depositing metal electrodes which form a Schottky diode on the GaAs. A single MSM photodiode 5702 may be added to the backside of an array of VCSELs, or multiple diodes may be added at the corners or sides of the VCSEL array to facilitate making electrical contact to the MSM diode. One or more wire bonds may connect from the bond pad for the MSM photodiode 5702 on the wafer down to the board.

Figure 58:
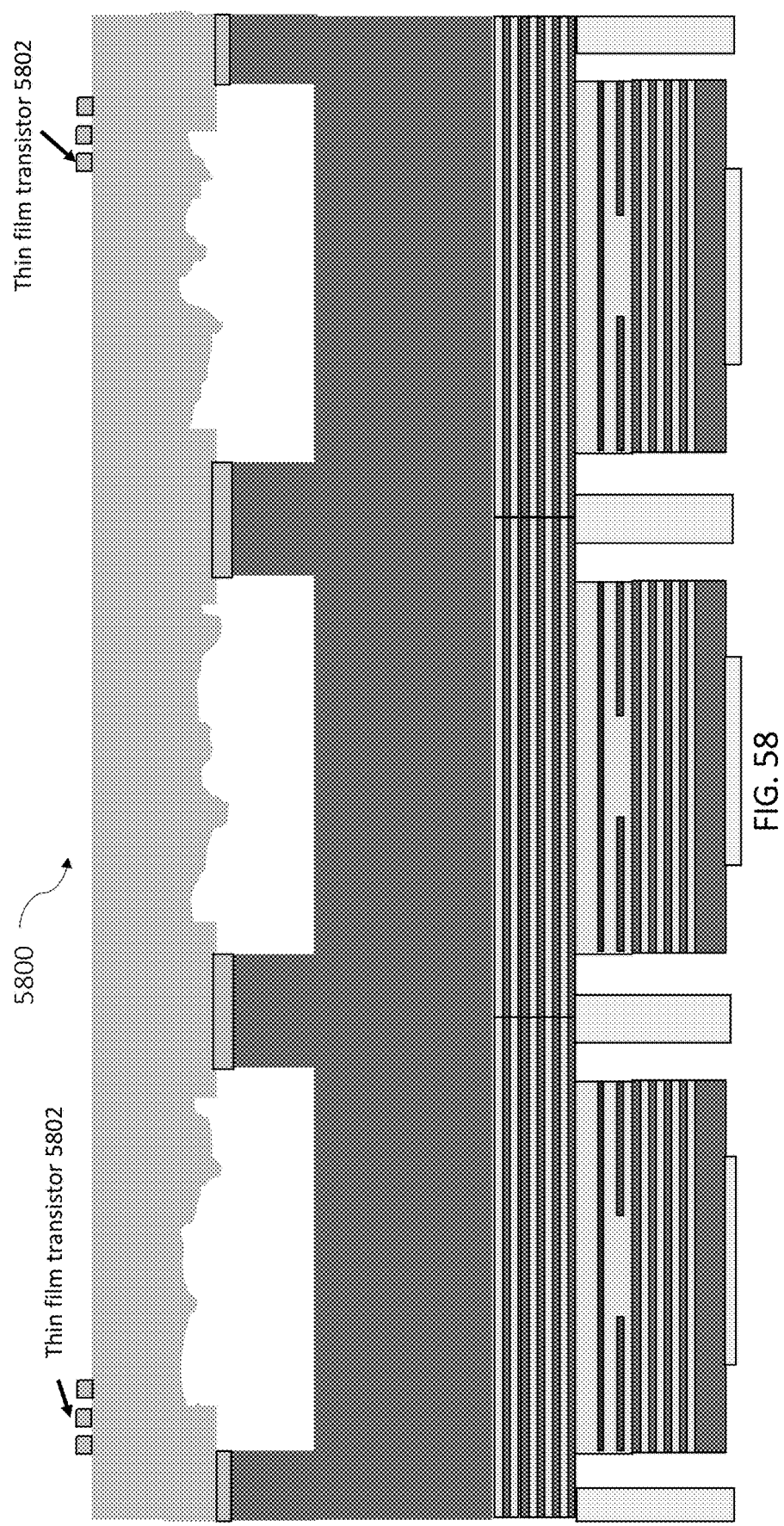
FIG. 58 illustrates another VCSEL die with integrated optics combined with a photodetector in accordance with various implementations.

FIG. 58 illustrates another VCSEL die 5800 with integrated optics combined with a photodetector in accordance with various implementations. VCSEL die 5800 is shown top side down, having a similar design to VCSEL die 5400 in FIG. 54. Thin film transistors 5802 that act as photodetectors may be placed on the top surface of the glass optics. The film transistors 5802 may also be placed at the corners or edges of the array and contact to them may be by wire-bonding from the top of the glass down to the sub-mount or board.

Figure 59:
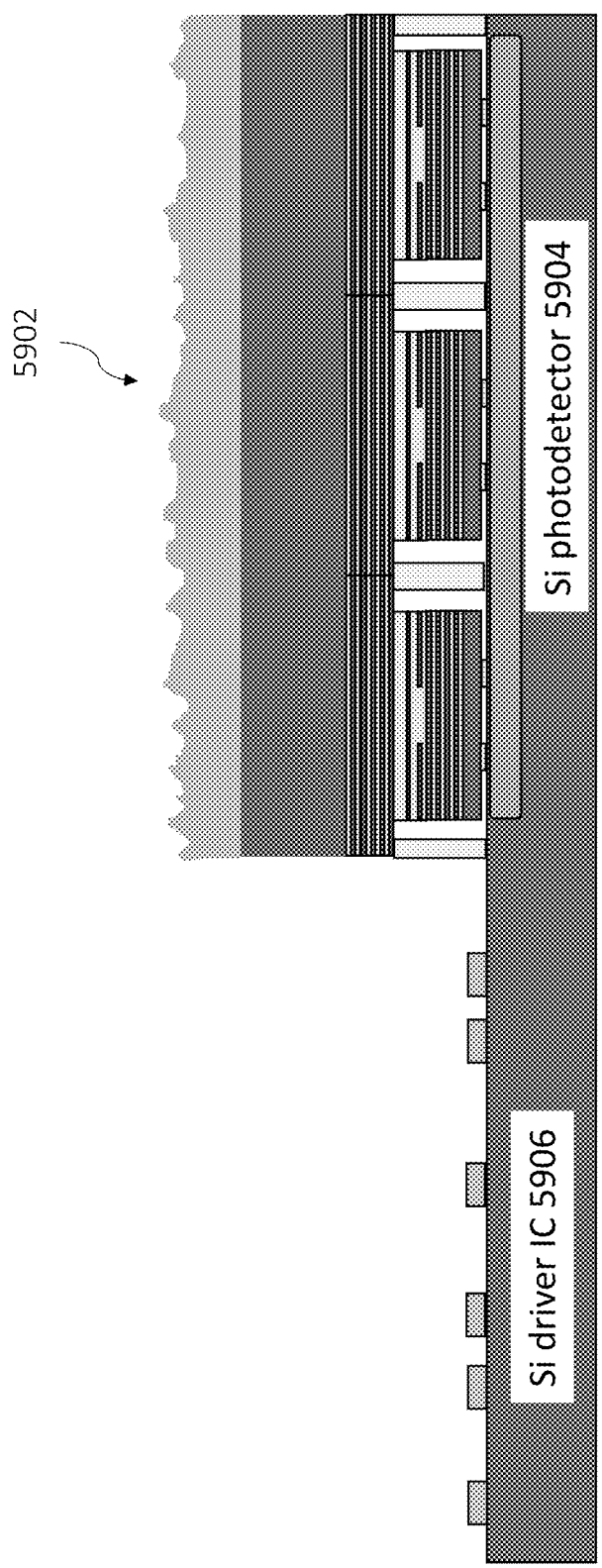
FIG. 59 illustrates a VCSEL die with integrated optics combined with a photodetector and driver circuit in accordance with various implementations.

FIG. 59 illustrates a VCSEL die 5902 with integrated optics combined with a photodetector 5904 and driver circuit 5906 in accordance with various implementations. VCSEL die 5902 is shown top side down, with the same chip design and the same deposition of a curable epoxy on the back surface as VCSEL die 4700 in FIG. 47. The substrate for mounting the VCSEL die 5902 in this case is the Si integrated circuit that is the driver circuit 5906 for the VCSEL array. A Si photodetector 5904 is also integrated onto this chip, and the VCSEL is bonded over this silicon photodiode. While the earlier figures show the anode contact covering the entire emission area of the VCSEL with the light emitting through the substrate, in this case an opening in the anode contact is made so that a small percentage of the light may reach the photodetector 5904. Making the metal aperture smaller than the oxide opening also helps ensure that only the stimulated emission reaches the photodetector 5904, filtering out any spontaneous emission.

Figure 60:
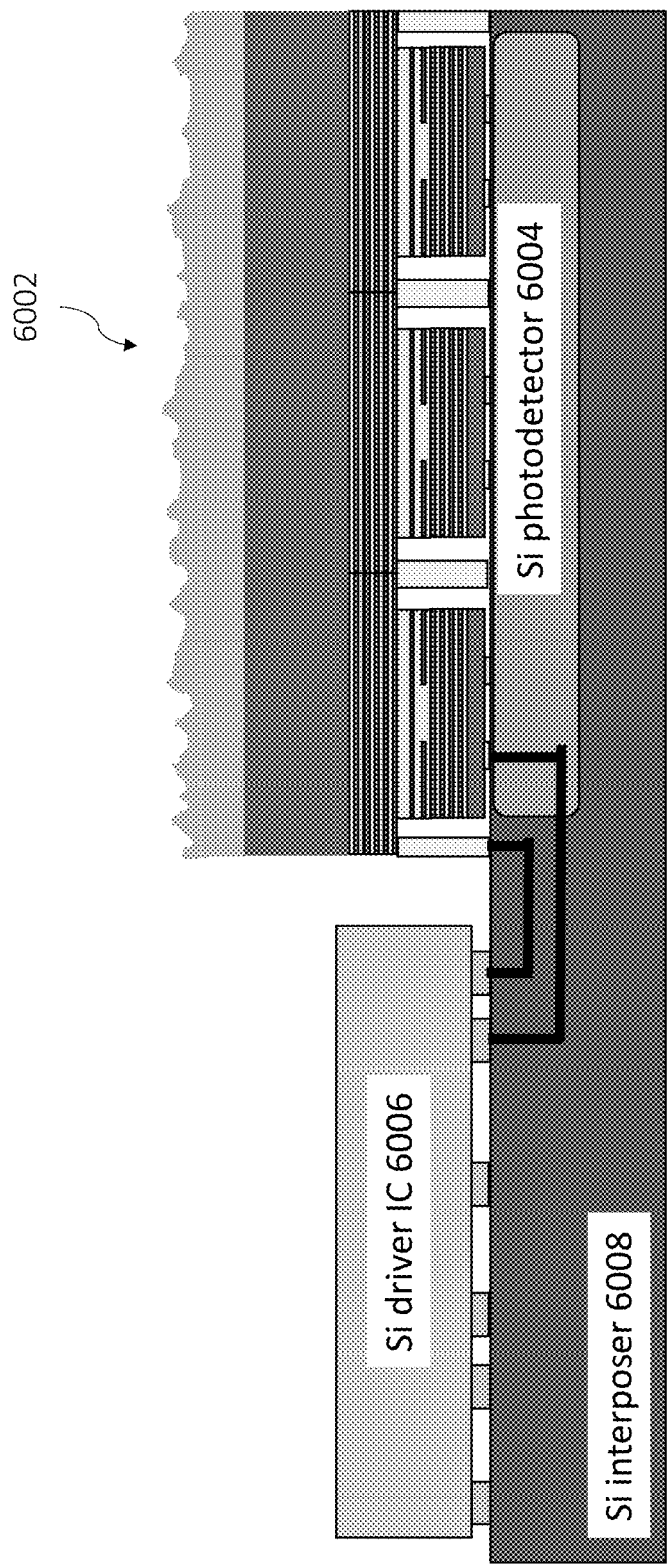
FIG. 60 illustrates another VCSEL die with integrated optics combined with a photodetector and driver circuit in accordance with various implementations.
Figure 61:
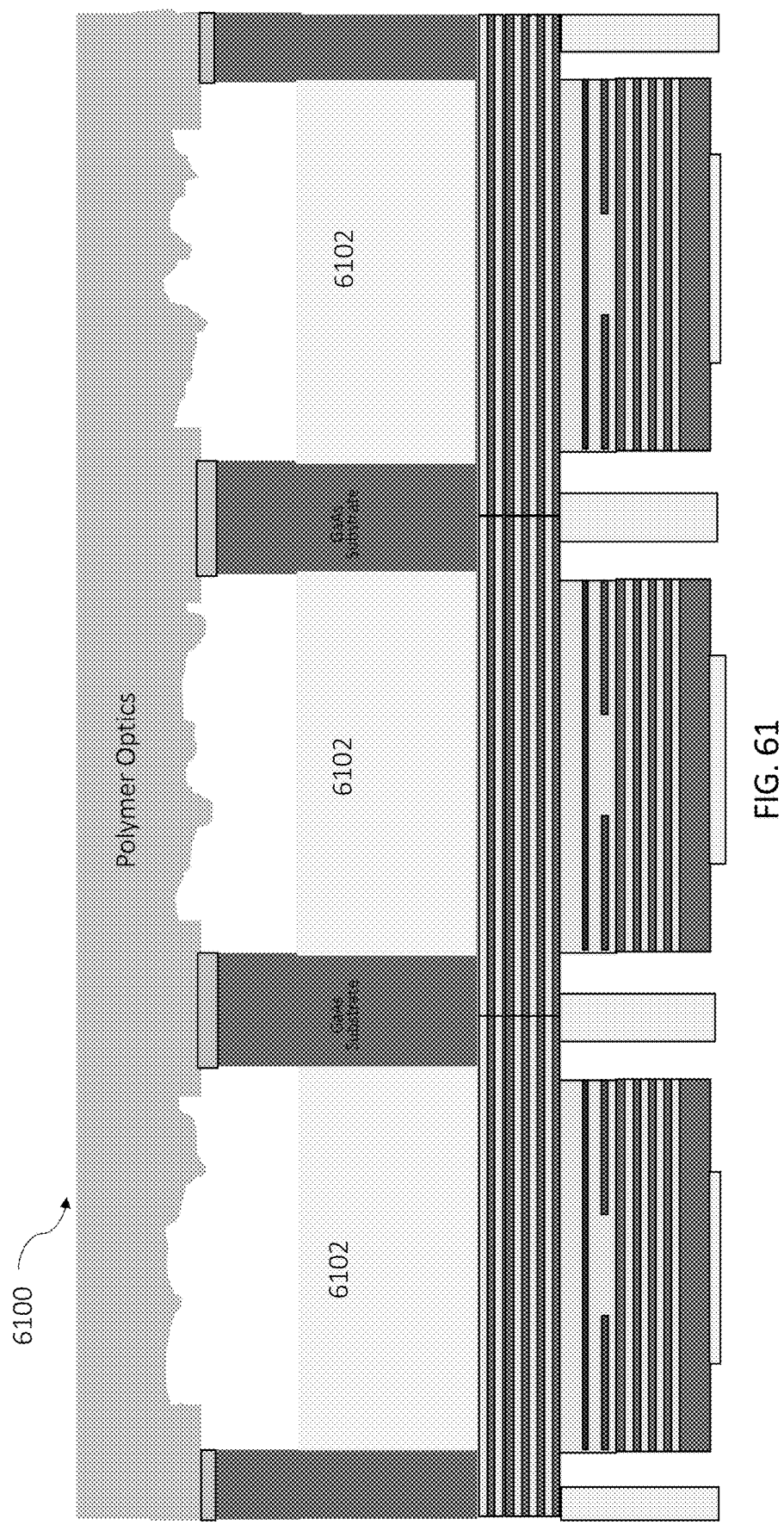
FIG. 61 illustrates another VCSEL die with integrated optics in accordance with various implementations.

FIG. 60 illustrates another VCSEL die 6002 with integrated optics combined with a photodetector 6004 and driver circuit 6006 in accordance with various implementations. VCSEL die 6002 is shown top side down, with the same chip design and the same deposition of a curable epoxy on the back surface as VCSEL die 4700 in FIG. 47. The subassembly uses a silicon interposer 6008 to integrate and connect the Si driver IC 6006, the silicon-based photodetector 6004, and the VCSEL die 6002. In this case the photodetector 6004 is fabricated in the silicon interposer, but interconnections are also fabricated within the silicon. Both the driver IC 6006 and the integrated VCSEL array die 6002 are bump bonded to the silicon interposer 6008, with the integrated VCSEL array die bump bonded over the top of the interposer. As in FIG. 59, the anode metal on the VCSEL array has openings over the emitting apertures of the VCSELs so that the small amount of light emitted in this direction will reach the photodiode FIG. 61 illustrates another VCSEL die 6100 with integrated optics in accordance with various implementations. VCSEL die 6100 is shown top side down, having a similar design to VCSEL die 5400 in FIG. 54. FIG. 61 illustrates a variation of the approach that allows many of the techniques described herein to be used for shorter wavelength VCSELs. In this case, the etching of the pockets 6102 of the GaAs substrate is done all the way down to the bottom side mirror, with a frame of GaAs substrate left around the emitting area of the VCSELs or VCSEL arrays. The subsequent attaching of a glass or polymer wafer containing the optics helps provide mechanical stability to the structure for subsequent sawing and handling.

FIG. 62 illustrates VCSEL dies with integrated optics combined with a photodetector and driver circuit in accordance with various implementations. Subassembly 6202 shows a direct bonding of the integrated VCSEL die onto the Si driver IC, while subassembly 6204 shows a direct bonding of the VCSEL onto the Si driver IC with embedded photodetector. In this case the photodetector is fabricated inside the silicon driver IC. As in FIG. 59, the anode metal on the VCSEL array has openings over the emitting apertures of the VCSELs so that the small amount of light emitted in this direction will reach the photodetector. Attachment/bonding of the VCSEL to the Si driver IC may be performed at a die level or a wafer level using a direct bonding technology either using Copper pillar or micro bump.

Figure 63:
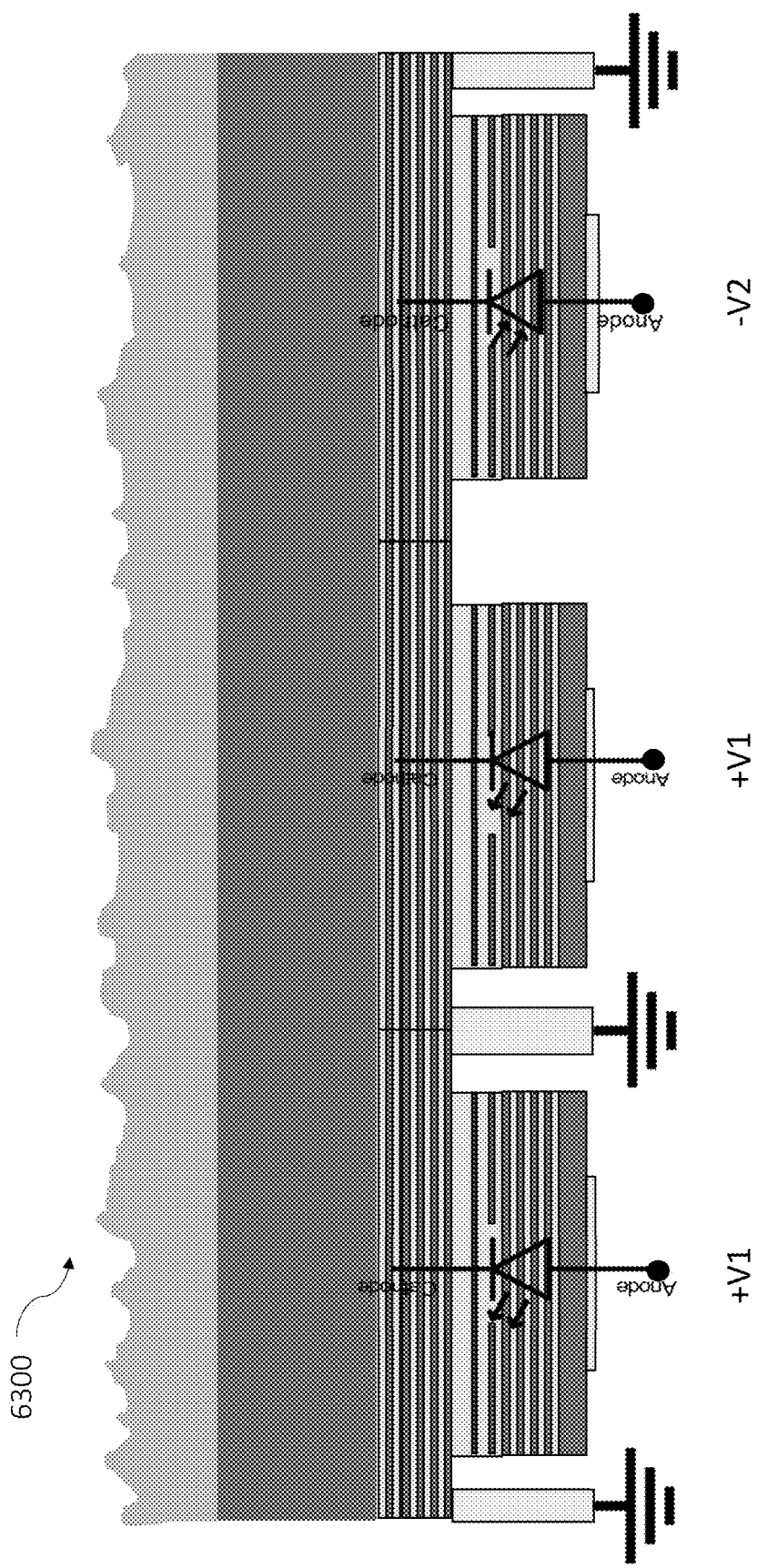
FIG. 63 illustrates another VCSEL die with integrated optics combined with a photodetector in accordance with various implementations.

FIG. 63 illustrates another VCSEL die 6300 with integrated optics combined with a photodetector in accordance with various implementations. VCSEL die 6300 is shown top side down, with the same chip design and the same deposition of a curable epoxy on the back surface as VCSEL die 4700 in FIG. 47. In this case, a subset of the VCSEL structures in the array (e.g., the right-most VCSEL in FIG. 63) are reverse biased in order to act as photodiodes that would be used to detect the threshold current of a laser. The light detected by the reverse biased devices will come from the neighboring VCSELs and will detect mostly spontaneous emission from the other VCSELs. When the VCSELs begin to lase, the spontaneous emission clamps at a fixed or more slowly increasing level, so a knee in the photodiode current versus current of the VCSEL array will appear, indicating where the threshold for lasing occurs. This data may be used to feed back to a driver chip which is used to control the laser driver circuit in order to improve the rise time of the VCSEL.

Figure 64:
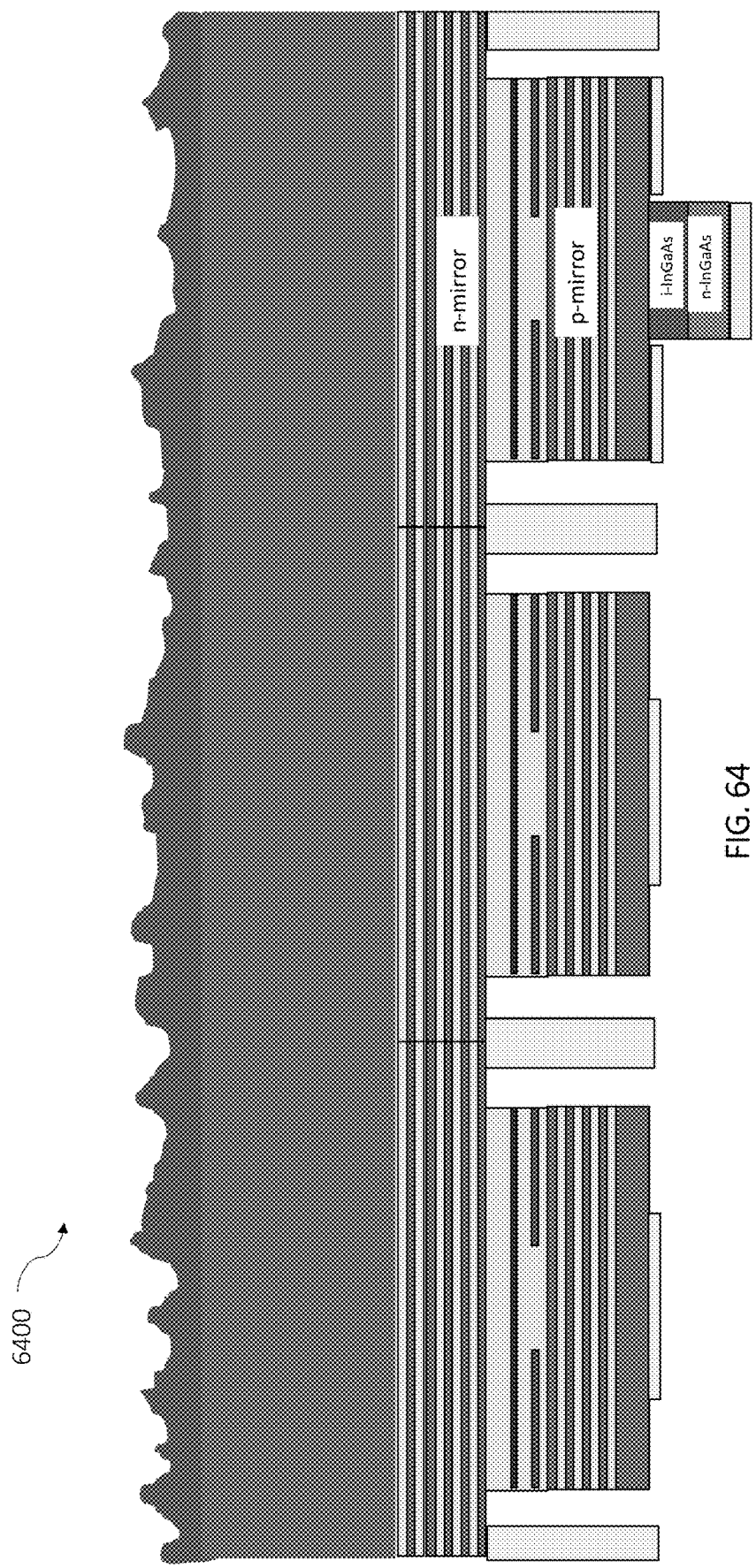
FIG. 64 illustrates another VCSEL die with integrated optics combined with a photodetector in accordance with various implementations.

FIG. 64 illustrates another VCSEL die 6400 with integrated optics combined with a photodetector in accordance with various implementations. VCSEL die 6400 is shown top side down, having a similar design to VCSEL die 5000 in FIG. 50. In this case some additional layers are grown on top of a VCSEL structure (e.g., the rightmost VCSEL in FIG.

64) to form a photodiode. For the case where the VCSEL emission is 940 nm, these layer compositions could be undoped InGaAs followed by n-doped InGaAs. For wavelengths shorter than 870 nm the layer compositions could also be GaAs or AlGaAs. These layers may be etched away from the top of the VCSEL array, with the exception of a small group of VCSELs. For the VCSELs where the photodiode layers remain, the VCSELs are driven with a forward bias as before, but the photodiode layers are reverse biased. The metal p-contact for the VCSEL may become a ring or a contact to the side of the emitting area, allowing a small percentage of the VCSEL light to reach the reverse biased integrated photodiode layers. The detected light generates a photodiode current proportional to the emitted VCSEL optical power.

Figure 65:
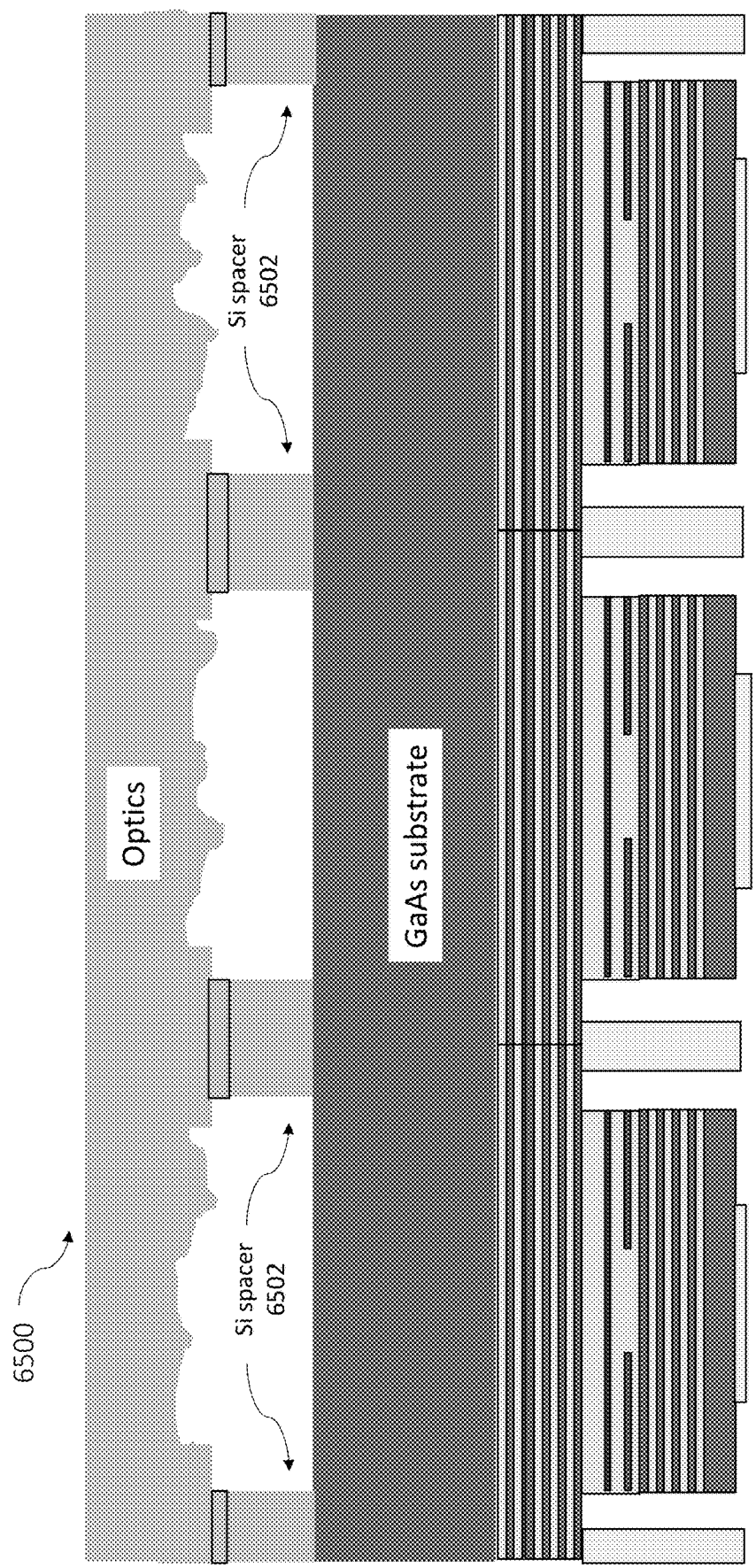
FIG. 65 illustrates another VCSEL die with integrated optics in accordance with various implementations.

FIG. 65 illustrates another VCSEL die 6500 with integrated optics in accordance with various implementations. VCSEL die 6500 is shown top side down, having a similar design to VCSEL die 5400 in FIG. 54. In this case, a silicon wafer is etched all the way through the wafer to form a grid of openings. This wafer is then attached to the substrate side of the GaAs wafer to form spacers 6502 with a silicon frame around each die. The silicon wafer may be attached with the van der Waals force, an adhesive, a metal solder, or any other means. It may be attached to the original GaAs substrate, or the GaAs substrate may be thinned or removed before attachment. After bonding the GaAs VCSEL wafer and the silicon spacer frame together, an optics wafer may be attached to the other side of the silicon frame. The optics may either face the frame or face outward, but facing toward the frame would provide greater protection for the optics.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

The foregoing description of the implementations of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

We claim:

1. An illumination module, comprising:
an array of vertical cavity surface emitting lasers (VCSELs) emitting light, wherein at least one VCSEL in the array of VCSELs comprises a multi junction VCSEL;
a driver configured to provide current to the array of VCSELs; and
an optical element configured to receive the light emitted by the array of VCSELs and output a light pattern from the illumination module;
wherein the array of VCSELs is segmented into a first segment of VCSELs configured to emit light and a second segment of VCSELs configured to detect light emitted by the first segment of VCSELs.

2. The illumination module of claim 1, wherein the VCSELs in the first segment of VCSELs are forward biased and the VCSELs in the second segment of VCSELs are reverse biased.

3. The illumination module of claim 1, wherein at least one VCSEL in the first segment of VCSELs is a multi junction VCSEL.

4. The illumination module of claim 1, wherein the optical element is integrated into the array of VCSELs.

5. The illumination module of claim 4, wherein the array of VCSELs is flip-chip bonded on a silicon interposer that is connected to the driver, wherein the silicon interposer includes a photodetector.

6. The illumination module of claim 1, wherein the multi-junction VCSEL comprises:
a substrate;
a bottom mirror;
a top mirror;
an active region between the top mirror and the bottom mirror, wherein the active region comprises more than one set of quantum wells; and
a tunnel junction between the sets of quantum wells.

7. The illumination module of claim 1, wherein the optical element converts an emitted circular beam into a rectangular field of view.

8. The illumination module of claim 1, wherein the VCSELs of at least one of the arrays are at least partially bottom-emitting.

9. An illumination module, comprising:
an array of vertical cavity surface emitting lasers (VCSELs) emitting light, wherein at least one VCSEL in the array of VCSELs comprises a multi junction VCSEL,
a driver configured to provide current to the array of VCSELs,
an optical element configured to receive the light emitted by the array of VCSELs and output a light pattern from the illumination module, the optical element being integrated into the array of VCSELs, and
a photodetector located on top of the optical element.

10. The illumination module of claim 9, wherein the optical element is deposited onto a substrate of the array of VCSELs.

11. An illumination module, comprising:
an array of vertical cavity surface emitting lasers (VCSELs) emitting light, wherein at least one VCSEL in the array of VCSELs comprises a multi junction VCSEL;
a driver configured to provide current to the array of VCSELs; and
an optical element configured to receive the light emitted by the array of VCSELs and output a light pattern from the illumination module, the optical element being integrated into the array of VCSELs;
wherein the array of VCSELs is flip-chip bonded on a substrate that includes the driver and a photodetector.

12. The illumination module of claim 11, wherein the photodetector is located adjacent to the array of VCSELs.

13. A multi junction VCSEL comprising:
a substrate;
a bottom mirror;
a top mirror;
an active region between the top mirror and the bottom mirror, wherein the active region comprises more than one set of quantum wells, wherein each set of quantum wells is separated by a confinement layer; and a reverse biased tunnel junction between the sets of quantum wells, wherein the reverse biased tunnel junction is placed in the middle of the confinement layer;

wherein the p- and n-doping on each side of the reversed bias tunnel junction has a value of $10\text{ e}^{19}/\text{cm}^3$ or higher.

14. The VCSEL of claim 13, wherein the active region comprises two sets of quantum wells and further comprises two forward biased p-n junctions centered on the two sets of quantum wells.

15. The VCSEL of claim 13, wherein the quantum wells are positioned at the peak of the electric field and a reversed bias tunnel junction is positioned at a minimum of an electric field.

16. The VCSEL of claim 13, wherein each the bottom mirror and the top mirror are a Distributed Bragg Reflector (DBR) mirror composed of alternating layers of different refractive index in which each layer thickness is $\lambda/4$ of the emission wavelength.

17. The VCSEL of claim 16, wherein the number of periods in the DBR mirrors will be chosen so that the top DBR mirror will be highly reflective, while the bottom mirror closest to the substrate will be slightly less reflective.

18. The VCSEL of claim 13, wherein the VCSEL is a bottom emitting VCSEL.

19. The VCSEL of claim 13, wherein each set of quantum wells is composed of InGaAs.

20. The VCSEL of claim 13, further comprising metal contacts deposited on top of the substrate and on top of the surface of the top mirror, wherein a top metal contact may completely cover the VCSEL mesa, while the bottom metal contact will be patterned to leave open windows for light to be emitted through the bottom.

\* \* \* \* \*